(12) United States Patent
Jeoung et al.

(10) Patent No.: US 9,423,832 B2
(45) Date of Patent: Aug. 23, 2016

(54) DISPLAY DEVICE USING SEMICONDUCTOR LIGHT EMITTING DEVICE

(71) Applicant: LG ELECTRONICS INC., Seoul (KR)

(72) Inventors: Byungwoo Jeoung, Seoul (KR); Chisun Kim, Seoul (KR); Yongdae Kang, Seoul (KR); Byungjoon Rhee, Seoul (KR); Kyuhyun Bang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/638,930

(22) Filed: Mar. 4, 2015

(65) Prior Publication Data
US 2015/0255505 A1 Sep. 10, 2015

(30) Foreign Application Priority Data

Mar. 5, 2014 (KR) .................. 10-2014-0026215
Mar. 18, 2014 (KR) .................. 10-2014-0031712

(51) Int. Cl.
| | |
|---|---|
| *H01L 33/00* | (2010.01) |
| *G06F 1/16* | (2006.01) |
| *H05K 1/18* | (2006.01) |
| *H01L 23/00* | (2006.01) |
| *H01L 33/50* | (2010.01) |
| *H01L 25/075* | (2006.01) |
| *H05K 3/32* | (2006.01) |

(52) U.S. Cl.
CPC ............. *G06F 1/1652* (2013.01); *H01L 24/95* (2013.01); *H05K 1/189* (2013.01); *H01L 25/0753* (2013.01); *H01L 33/504* (2013.01); *H05K 3/323* (2013.01); *H05K 2201/10106* (2013.01); *H05K 2201/10128* (2013.01)

(58) Field of Classification Search
CPC ... H01L 27/156; H01L 33/504; H01L 33/58; H01L 33/005
USPC ............................. 257/98, 99, 100
See application file for complete search history.

(56) References Cited

U.S. PATENT DOCUMENTS

| | | | |
|---|---|---|---|
| 7,723,733 B2 * | 5/2010 | Daniels ............ | B32B 17/10036 257/100 |
| 2006/0001362 A1 | 1/2006 | Han et al. | |
| 2008/0124634 A1 | 5/2008 | Lee | |
| 2012/0320270 A1 | 12/2012 | Takata | |
| 2014/0054619 A1 | 2/2014 | Tseng et al. | |

FOREIGN PATENT DOCUMENTS

WO   WO 2014/030830 A1   2/2014

* cited by examiner

*Primary Examiner* — Tan N Tran
(74) *Attorney, Agent, or Firm* — Birch, Stewart, Kolasch & Birch, LLP

(57) ABSTRACT

A display device including a wiring substrate having a first substrate layer and a second substrate layer, a conductive adhesive layer configured to cover the wiring substrate, a plurality of semiconductor light emitting devices coupled to the conductive adhesive layer and electrically connected to a first electrode and a second electrode. Further, the first electrode is disposed on the first substrate layer, and the second substrate layer has one surface facing the conductive adhesive layer and the other surface covering the first electrode, and an auxiliary electrode electrically connected to the first electrode and the second electrode are disposed on one surface of the second substrate layer.

13 Claims, 42 Drawing Sheets

DISPLAY DEVICE USING SEMICONDUCTOR LIGHT EMITTING DEVICE

CROSS-REFERENCE TO RELATED APPLICATIONS

Pursuant to 35 U.S.C. §119(a), this application claims the benefit of earlier filing date and right of priority to Korean Application Nos. 10-2014-0026215 and 10-2014-0031712, filed on Mar. 5, 2014 and Mar. 18, 2014, respectively, the contents of which is incorporated by reference herein in its entirety.

BACKGROUND OF THE INVENTION

1. Field of the Invention

The present disclosure relates to a display device, and more particularly, to a display device using a semiconductor light emitting device.

2. Description of the Related Art

In recent years, display devices having excellent characteristics such as low profile, flexibility and the like have been developed in the display technical field. Currently, commercialized main displays are represented by liquid crystal displays (LCDs) and active matrix organic light emitting diodes (AMOLEDs). However, there exist problems such as not-so-fast response time, difficult implementation of flexibility for LCDs, and there exist drawbacks such as short life span, not-so-good yield as well as low flexibility for AMOLEDs.

Further, light emitting diodes (LEDs) are light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display.

SUMMARY OF THE INVENTION

An aspect of the present disclosure is to provide a novel display device capable of providing flexibility.

Another aspect of the present disclosure is to provide the structure of a phosphor layer suitable to a high definition display device.

Still another aspect of the present disclosure is to provide a fabrication method for forming a phosphor layer suitable to a high definition display device.

To achieve these and other advantages and in accordance with the purpose of the present invention, as embodied and broadly described herein, the present invention provides in one aspect a display device including a wiring substrate disposed with an electrode having a plurality of electrode lines; a conductive adhesive layer connected to the wiring substrate; a plurality of semiconductor light emitting devices coupled to the conductive adhesive layer, and electrically connected to the electrode; and a phosphor portion configured to convert light emitted from at least some of the plurality of semiconductor light emitting devices into a sub-pixel color so as to form a plurality of columns along the plurality of electrode lines. Further, the phosphor portion includes first phosphor portions covering one surface of said at least some of the semiconductor light emitting devices, respectively, sequentially disposed along the plurality of columns among the plurality of semiconductor light emitting devices; and second phosphor portions disposed between the first phosphor portions, and having a different shape from a shape of the first phosphor portions. The present invention also provides a corresponding method of manufacturing the display device.

In another aspect, the present invention provides a display device including a wiring substrate disposed with an electrode having a plurality of electrode lines; a conductive adhesive layer connected to the wiring substrate; a plurality of semiconductor light emitting devices coupled to the conductive adhesive layer, and electrically connected to the electrode; and a phosphor portion configured to convert light emitted from at least some of the plurality of semiconductor light emitting devices into a sub-pixel color, and covering one surface of the at least some of the semiconductor light emitting devices along the plurality of electrode lines. Further, the phosphor portion comprises a cured phosphor material cured by light emitted from said some of the semiconductor light emitting devices, and vacant spaces on which the phosphor material is not disposed are sequentially formed along the length direction of the phosphor portion. The present invention also provides a corresponding method of manufacturing the display device.

In still another aspect, the present invention provides a display device including a wiring substrate having a plurality of electrode lines; a conductive adhesive layer connected to the wiring substrate; a plurality of semiconductor light emitting devices coupled to the conductive adhesive layer, and electrically connected to the plurality of electrode lines; a red phosphor portion disposed along any one of the plurality of electrode lines to convert light emitted from semiconductor light emitting devices arranged along the any one line into red; and a green phosphor portion disposed along another one of the plurality of electrode lines to convert light emitted from semiconductor light emitting devices arranged along the another one line into green. Further, phosphor regions contained in the red and green phosphor portions are separated from each other by interposing a separation portion therebetween. The present invention also provides a corresponding method of manufacturing the display device.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
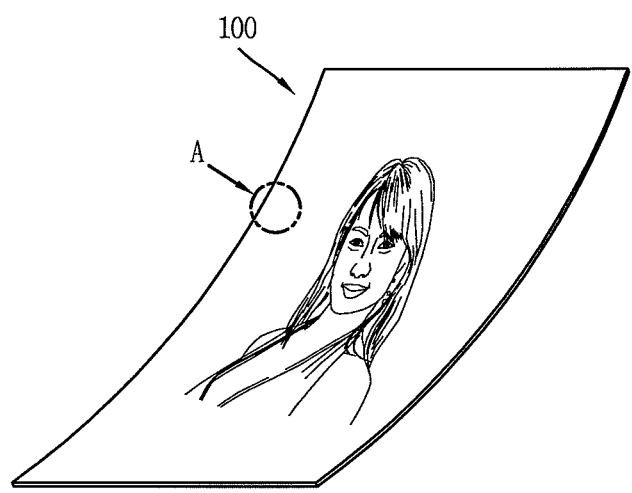
FIG. 1 is a conceptual view illustrating a display device using a semiconductor light emitting device according to an embodiment of the invention.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, the accompanying drawings are merely illustrated to easily explain the concept of the invention, and therefore, they should not be construed to limit the technological concept disclosed herein by the accompanying drawings. Furthermore, when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, a configuration disclosed herein may be applicable to any displayable device.

FIG. 1 is a conceptual view illustrating a display device 100 using a semiconductor light emitting device according to an embodiment of the invention. According to the drawing, information processed in the controller of the display device 100 may be displayed using a flexible display. The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the embodiment of the invention, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings. In particular, FIG. 2 is a partial enlarged view of portion "A" in FIG. 1, FIGS. 3A and 3B are respectively cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 2:
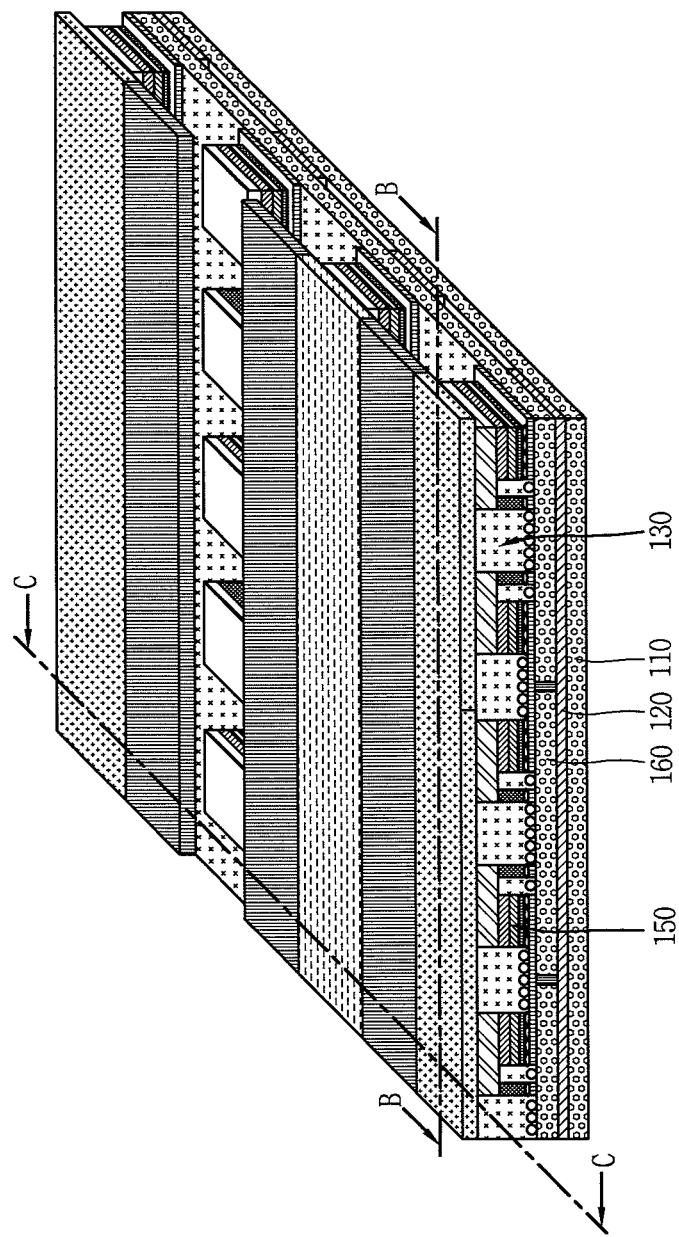
FIG. 2 is a partial enlarged view of portion "A" in FIG. 1.
Figure 3A:
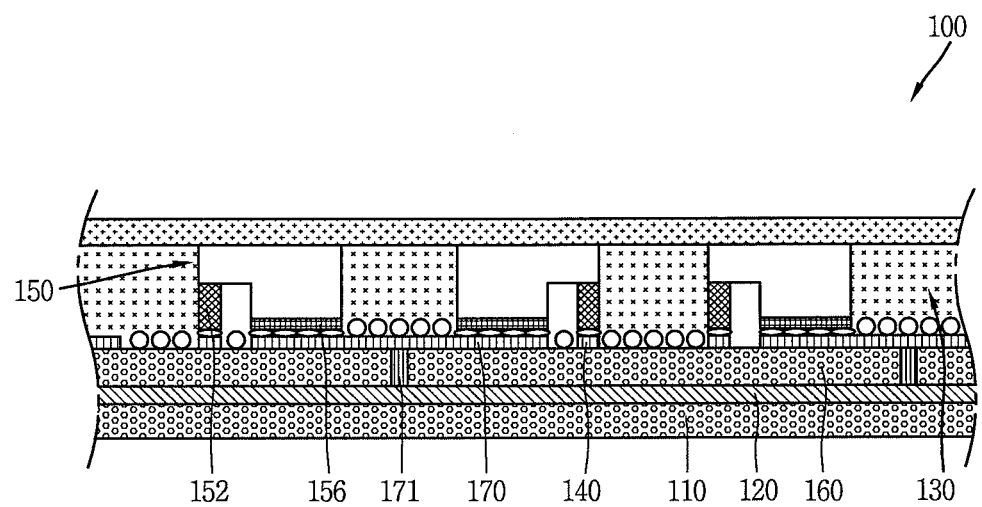
FIGS. 3A and 3B are cross-sectional views taken along lines B-B and C-C in FIG. 2.
Figure 3B:
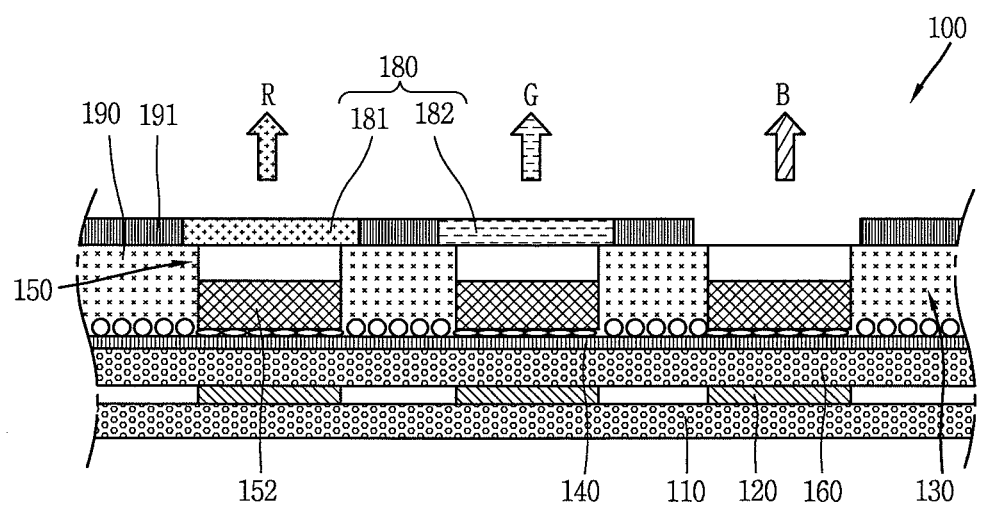
Figure 4:
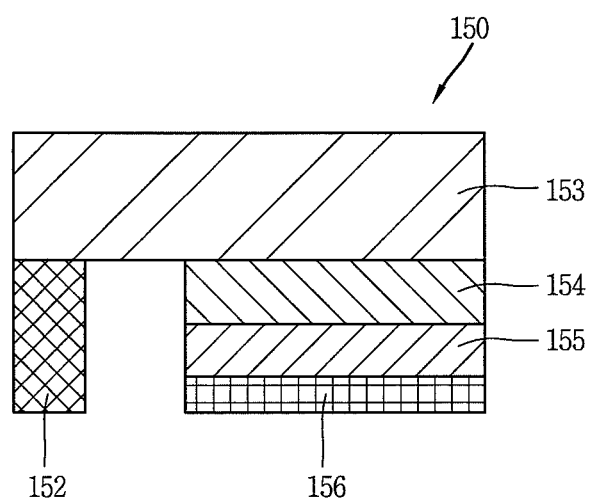
FIG. 4 is a conceptual view illustrating a flip-chip type semiconductor light emitting device in FIG. 3A.

FIGS. 2, 3A and 3B illustrate a display device 100 using a passive matrix (PM) type semiconductor light emitting device. However, the following illustration may be also applicable to an active matrix (AM) type semiconductor light emitting device. As shown, the display device 100 includes a substrate 110, a first electrode 120, a conductive adhesive layer 130, a second electrode 140, and a plurality of semiconductor light emitting devices 150. The substrate 110 may be a flexible substrate and include glass or polyimide (PI) to implement the flexible display device. In addition, a flexible material such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110. According to the drawings, an insulating layer 160 may be disposed on the substrate 110 placed with the first electrode 120, and an auxiliary electrode 170 may be placed on the insulating layer 160. In this instance, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the embodiment of the invention is not limited to this. For example, the conductive adhesive layer 130 can be disposed on the substrate 110 with no insulating layer 160. The conductive adhesive layer 130 may perform the role of an insulating layer in the structure in which the conductive adhesive layer 130 is disposed on the substrate 110.

Further, the conductive adhesive layer 130 may be a layer having adhesiveness and conductivity, and a conductive material and an adhesive material may be mixed on the conductive adhesive layer 130. Furthermore, the conductive adhesive layer 130 may have flexibility, thereby allowing a flexible function in the display device. For example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter is referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by the anisotropic conductive medium. Hereinafter, heat and pressure are applied to the anisotropic conductive film, but other methods may be also available for the anisotropic conductive film to partially have conductivity. The methods include applying only either one of heat and pressure thereto, UV curing, and the like.

Furthermore, the anisotropic conductive medium may be conductive balls or particles. According to the drawing, in the present embodiment, the anisotropic conductive film is a film with a form in which an anisotropic conductive medium is mixed with an insulating base member, and thus when heat and pressure are applied thereto, only a specific portion thereof has conductivity by the conductive balls. The anisotropic conductive film may be in a state in which a core with a conductive material contains a plurality of particles coated by an insulating layer with a polymer material, and in this instance, it may have conductivity by the core while breaking an insulating layer on a portion to which heat and pressure are applied. Here, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film. In another example, an anisotropic conductive film may be in a state containing a plurality of particles in which a conductive material is coated on insulating cores. In this instance, a portion to which heat and pressure are applied may be converted (pressed and adhered) to a conductive material to have conductivity in the thickness direction of the film. In still another example, the film may be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the embodiment of the invention is not limited to this, and the anisotropic conductive film can have a form in which conductive balls are randomly mixed with an insulating base member or a form configured with a plurality of layers in which conductive balls are disposed at any one layer (double-ACF), and the like. The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140. When the conductive adhesive layer 130 is formed in a state that the auxiliary electrode 170 and second electrode 140 are located, and then the semiconductor light emitting device 150 is connected thereto in a flip chip form with the application of heat and pressure, the semiconductor light emitting device 150 is electrically connected to the first electrode 120 and second electrode 140.

Referring to FIG. 4, the semiconductor light emitting device 150 may be a flip chip type semiconductor light emitting device. For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically connected to a welding portion by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device 150.

Furthermore, as shown in the example in FIG. 3B, a plurality of semiconductor light emitting devices 150 constitute a light-emitting array, and a phosphor layer 180 is formed on the light-emitting array. The light emitting device may include a plurality of semiconductor light emitting devices with different self-luminance values. Each of the semiconductor light emitting devices 150 constitutes a sub-pixel, and is electrically connected to the first electrode 120. For example, a plurality of first electrodes 120 may exist, and the semiconductor light emitting devices are arranged in several rows, for instance, and each row of the semiconductor light emitting devices 150 may be electrically connected to any one of the plurality of first electrodes 120.

Furthermore, the semiconductor light emitting devices 150 may be connected in a flip chip form, and thus the semiconductor light emitting devices are grown on a transparent dielectric substrate. In addition, the semiconductor light emitting devices 150 may be nitride semiconductor light emitting devices, for instance. The semiconductor light emitting device 150 has an excellent luminance characteristic, and thus it is possible to configure individual sub-pixels even with a small size thereof.

According to FIG. 3B, a partition wall 190 may be formed between the semiconductor light emitting devices 150. In this instance, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator. In another example, a reflective partition wall may be separately provided with the partition wall 190. In this instance, the partition wall 190 may include a black or white insulator according to the purpose of the display device. The partition wall 190 may also have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 can be a blue semiconductor light emitting device 151 that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, the blue semiconductor light emitting device 151 may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the embodiment of the invention is not limited to this, and the semiconductor light emitting device 150 may be combined with a quantum dot (QD) instead of a phosphor to implement sub-pixels such as red (R), green (G) and blue (B). Furthermore, a black matrix 191 may be disposed between each phosphor layer to enhance contrast. In other words, the black matrix 191 can enhance the contrast of luminance. However, the embodiment of the invention is not limited to this, and another structure for implementing blue, red and green is also applicable thereto.

Figure 5A:
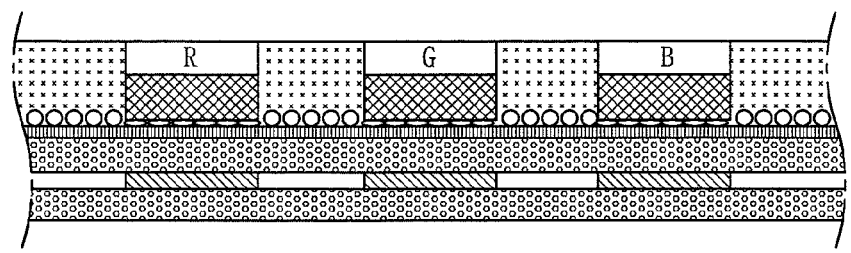
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto. In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by the red, green and blue semiconductor light emitting devices, thereby implementing a full color display.

Figure 5B:
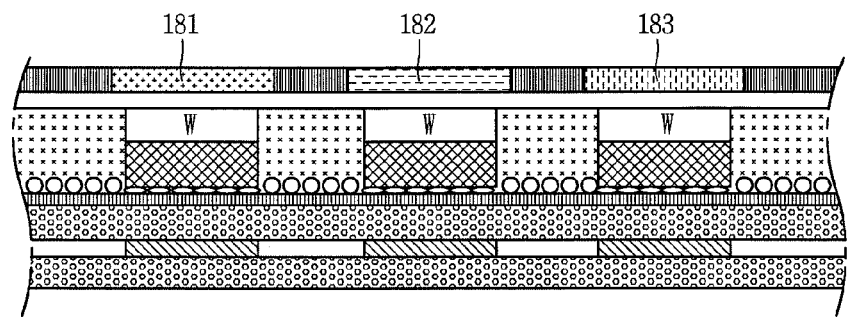

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
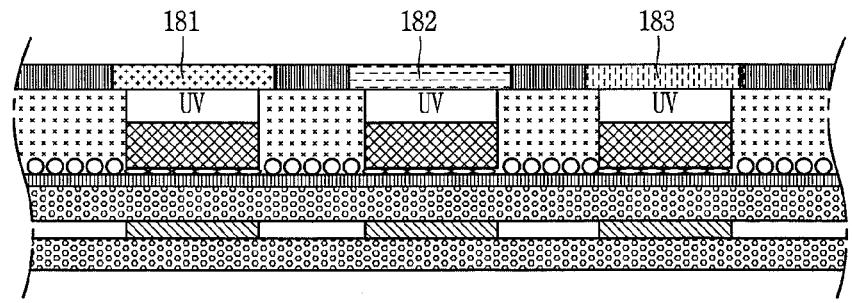

Referring to FIG. 5C, a red phosphor layer 181, a green phosphor layer 182 and blue phosphor layer 183 may be provided on an ultra violet light emitting device (UV). Thus, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 has excellent luminance characteristics, and thus it is possible to configure individual sub-pixels even with a small size thereof. The size of the individual semiconductor light emitting device 150 may be less than 80 µm in the length of one side thereof, and formed with a rectangular or square shaped element. For a rectangular shaped element, the size thereof may be less than 20×80 µm.

Furthermore, even when a square shaped semiconductor light emitting device 150 with a length of side of 10 µm is used for a sub-pixel, the device exhibits a sufficient brightness for implementing a display device. Accordingly, for example, for a rectangular pixel in which one side of a sub-pixel is 600 µm in size, and the remaining one side thereof is 300 µm, a relative distance between the semiconductor light emitting devices becomes sufficiently large. Accordingly, in this instance, it is possible to implement a flexible display device having a HD image quality.

A display device using the foregoing semiconductor light emitting device will be fabricated by a novel type of fabrication method. Hereinafter, the fabrication method will be described with reference to FIG. 6. In particular, FIG. 6 includes cross-sectional views illustrating a method of fabricating a display device using a semiconductor light emitting device according to the embodiment of the invention.

Figure 6:
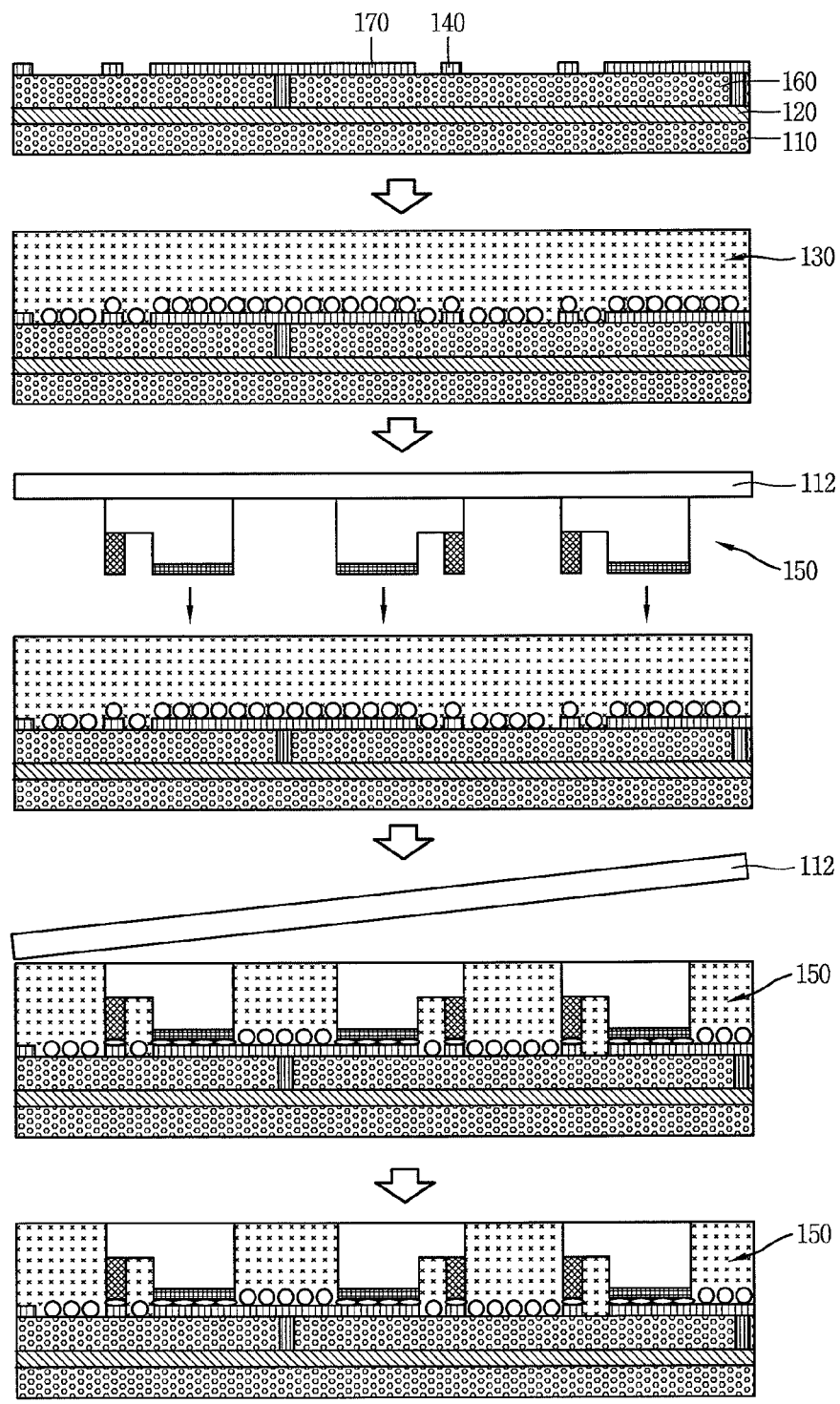
FIG. 6 is cross-sectional views illustrating a method of fabricating a display device using a semiconductor light emitting device according to the embodiment of the invention.

Referring to FIG. 6, first, the conductive adhesive layer 130 is formed on the insulating layer 160 located with the auxiliary electrode 170 and the second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and the anisotropic conductive film may be coated on a substrate located with the insulating layer 160. Next, a second substrate 112 located with a plurality of semiconductor light emitting devices 150 corresponding to the location of the auxiliary electrodes 170 and second electrodes 140 and constituting individual pixels is disposed such that the semiconductor light emitting devices 150 face the auxiliary electrode 170 and second electrode 140.

In this instance, the second substrate 112 as a growth substrate for growing the semiconductor light emitting device 150 may be a sapphire substrate or silicon substrate. Further, the semiconductor light emitting device may have a gap and size capable of implementing a display device when formed in the unit of wafer, and thus effectively used for a display device.

Next, the wiring substrate 110 is thermally compressed to the second substrate 112. For example, the wiring substrate 110 and second substrate 112 may be thermally compressed to each other by applying an ACF press head. The wiring substrate 110 and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method. Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Furthermore, the process of forming a phosphor layer on one surface of the semiconductor light emitting device 150 may also be included. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For example, the foregoing display device may be applicable to a vertical semiconductor light emitting device. Hereinafter, the vertical structure will be described with reference to FIGS. 5 and 6. Furthermore, according to the following modified example or embodiment, the same or similar reference numerals are designated to the same or similar configurations to the foregoing example, and the description thereof will be substituted by the earlier description.

Figure 7:
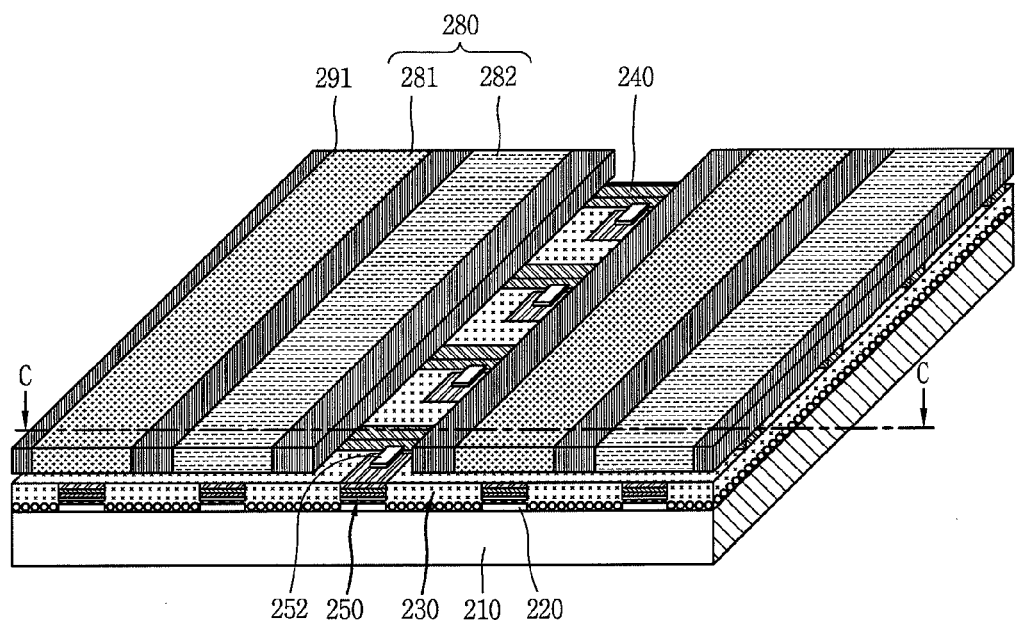
FIG. 7 is a perspective view illustrating a display device using a semiconductor light emitting device according to another embodiment of the invention.
Figure 8:
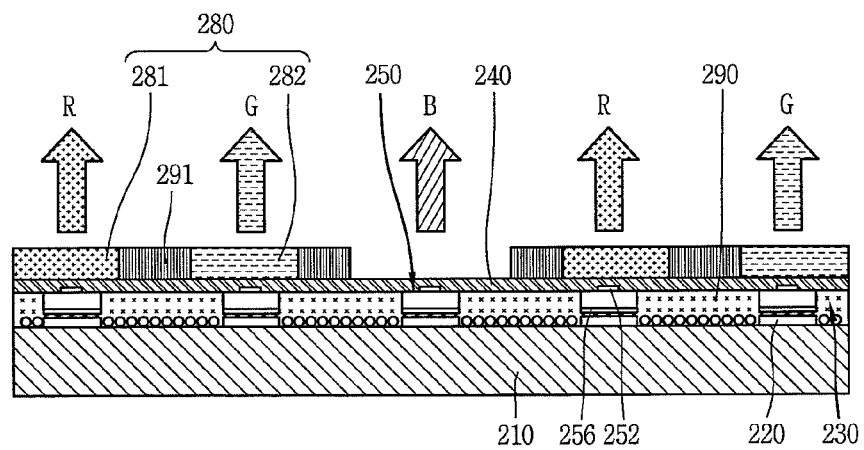
FIG. 8 is a cross-sectional view taken along line C-C in FIG. 7.
Figure 9:
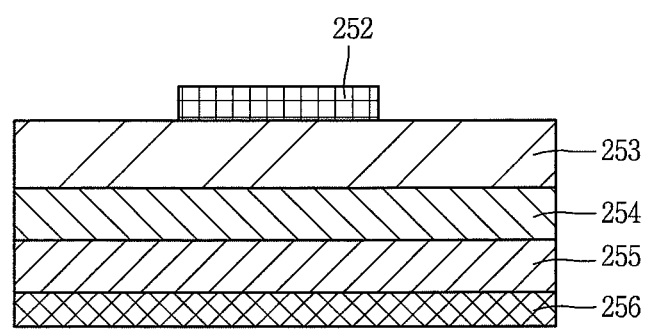
FIG. 9 is a conceptual view illustrating a vertical type semiconductor light emitting device in FIG. 8.

Next, FIG. 7 is a perspective view illustrating a display device using a semiconductor light emitting device according to another embodiment of the invention. In addition, FIG. 8 is a cross-sectional view taken along line C-C in FIG. 7, and FIG. 9 is a conceptual view illustrating a vertical type semiconductor light emitting device in FIG. 8. According to the drawings, the display device may use a passive matrix (PM) type of vertical semiconductor light emitting device.

As shown in FIG. 7, the display device includes a substrate 210, a first electrode 220, a conductive adhesive layer 230, a second electrode 240 and a plurality of semiconductor light emitting devices 250. The substrate 210 as a wiring substrate disposed with the first electrode 220 may include polyimide (PI) to implement a flexible display device. In addition, any material may be used if it is an insulating and flexible material. The first electrode 220 may be located on the substrate 210, and formed with an electrode having a bar elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof. Furthermore, the anisotropic conductive film contains an adhesive component, and thus the conductive adhesive layer 230 implements a mechanical coupling as well as an electrical coupling between the semiconductor light emitting device 250 and the first electrode 220.

Thus, the semiconductor light emitting device 250 is placed on the conductive adhesive layer 230, thereby configuring a separate sub-pixel in the display device. The semiconductor light emitting device 250 has excellent luminance characteristics, and thus it is possible to configure individual sub-pixels even with a small size thereof. The size of the individual semiconductor light emitting device 250 may be less than 80 μm in the length of one side thereof, and formed with a rectangular or square shaped element. For a rectangular shaped element, the size thereof may be less than 20×80 μm.

The semiconductor light emitting device 250 may be a vertical structure. A plurality of second electrodes 240 disposed in a direction crossed with the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240, which will be described later. The electrodes may be disposed in the upward/downward direction in the vertical semiconductor light emitting device 250, thereby providing a great advantage capable of reducing the chip size.

Referring to FIG. 8, a phosphor layer 280 may be formed on one surface of the semiconductor light emitting device 250. For example, the semiconductor light emitting device 250 is a blue semiconductor light emitting device that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 250 at a location implementing a red sub-pixel, and a green phosphor 282 capable of converting blue light into green (G) light may be deposited on the blue semiconductor light emitting device 250 at a location implementing a green sub-pixel. Furthermore, only the blue semiconductor light emitting device 250 may be solely used at a location implementing a blue sub-pixel. In this instance, the red (R), green (G) and blue (B) sub-pixels may implement one pixel.

However, the embodiment of the invention is not limited to this, and another structure for implementing blue, red and green may be also applicable thereto as described above in a display device to which a flip chip type light emitting device is applied. Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250. The second electrode 240 may be formed with an electrode having a bar elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to FIGS. 7 and 8, the second electrode 240 may be located on the conductive adhesive layer 230. In addition, a transparent insulating layer containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of poor adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to FIG. 8, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator. In another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to FIGS. 7 and 8, a black matrix 291 may be disposed between each phosphor layer to enhance contrast. In other words, the black matrix 191 can enhance the contrast of luminance. As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it is possible to implement a full color display in which the sub-pixels of red (R), green (G) and blue (B) implement one pixel by the semiconductor light emitting device.

As described above with reference to FIG. 8, when the semiconductor light emitting device 250 is a blue semiconductor light emitting device emitting blue (B) light, red and green may be implemented by the red phosphor 281 and green phosphor 282 constituting an individual pixel. Furthermore, as described above with reference to FIGS. 2, 3A and 3B, even when the semiconductor light emitting device is a flip chip type blue semiconductor light emitting device, red and green may be implemented by the red phosphor 181 and green phosphor 182.

In addition, a phosphor layer may be cured by an exposure process of irradiating external light, and formed in a bar shape extended in an elongated manner along an electrode line to cover semiconductor light emitting devices at once along one direction. According to the present disclosure, there is disclosed a new structure of a phosphor layer capable of forming the phosphor layer using light emitted from semiconductor light emitting devices instead of external light.

Figure 10:
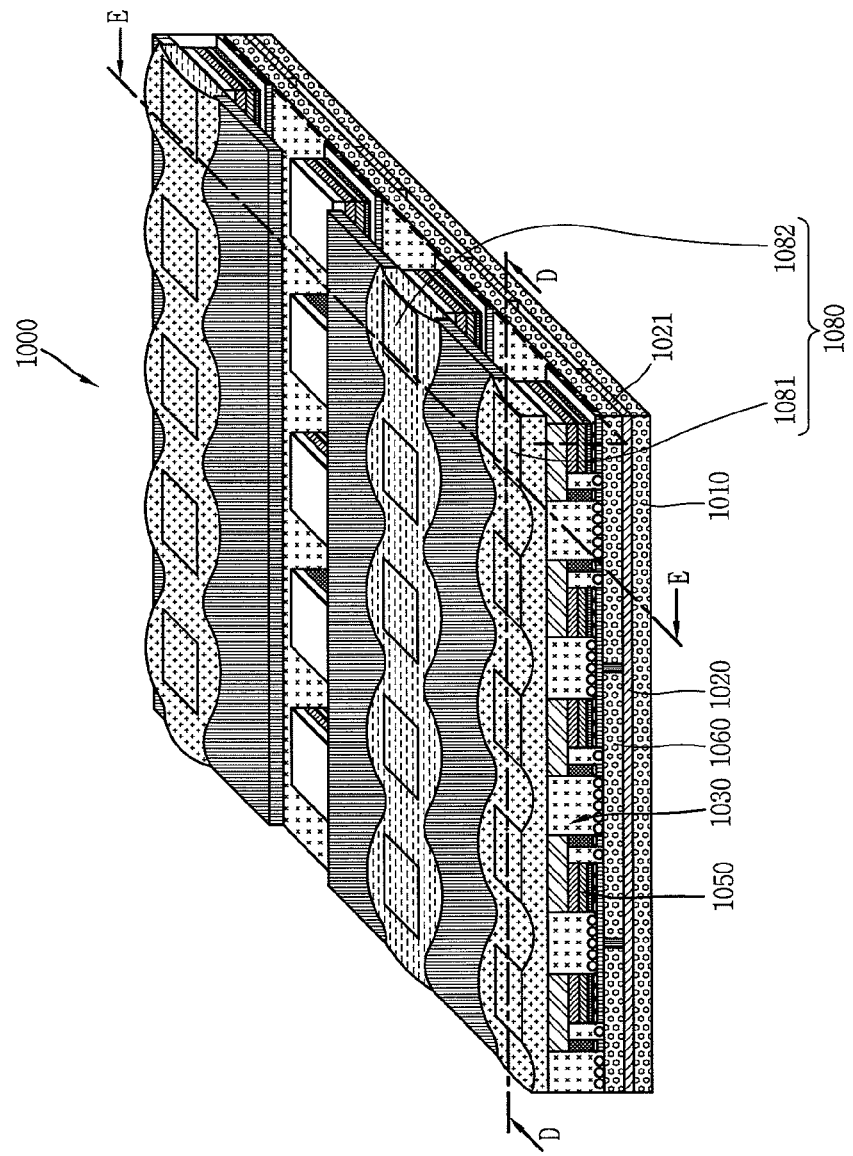
FIG. 10 is an enlarged view of portion "A" in FIG. 1 illustrating still another embodiment of the present disclosure.
Figure 11:
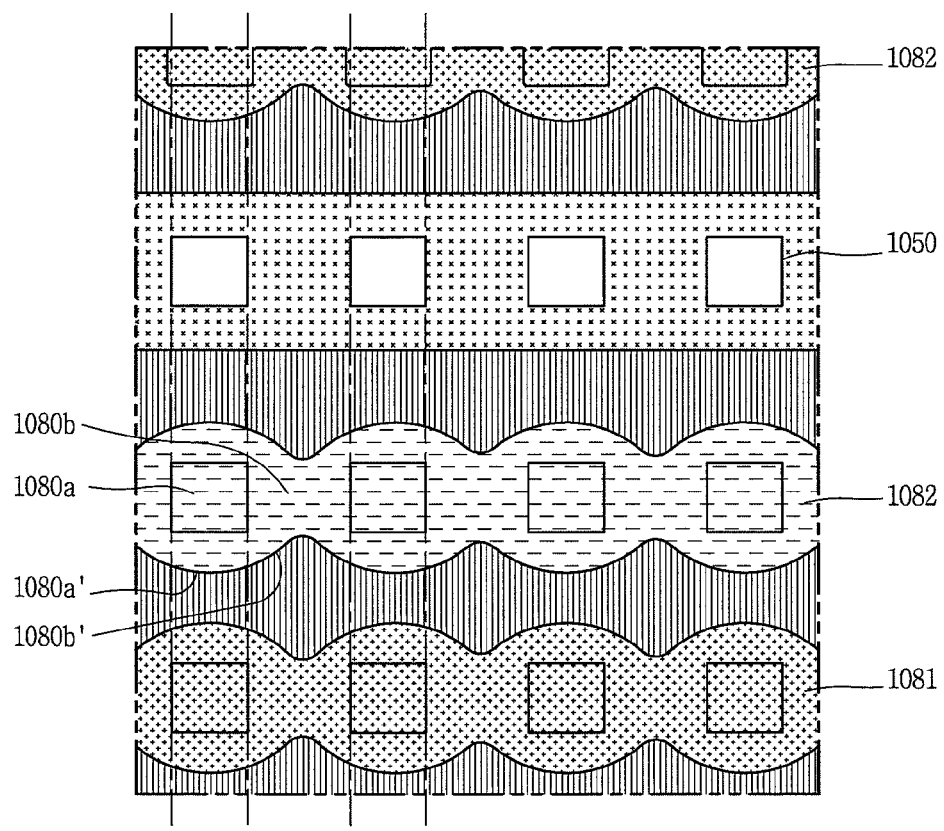
FIG. 11 is a plan view of FIG. 10.
Figure 12A:
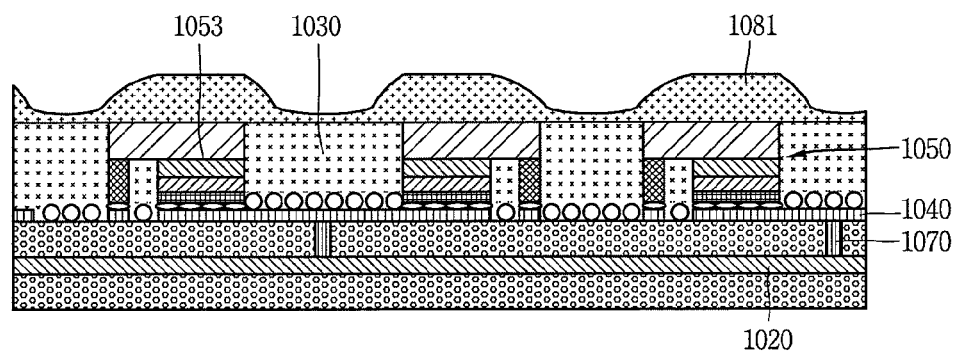
FIG. 12A is a cross-sectional view taken along line D-D in FIG. 10.
Figure 12B:
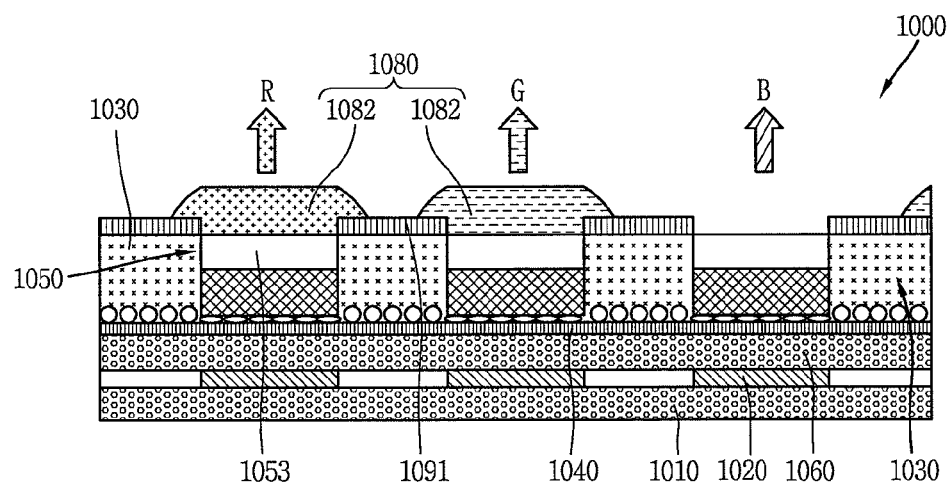
FIG. 12B is a cross-sectional view taken along line E-E in FIG. 10.

Hereinafter, a novel structure of a display device including a phosphor layer formed using light emitted from semiconductor light emitting devices will be described in more detail with reference to the accompanying drawings. In particular, FIG. 10 is an enlarged view of portion "A" in FIG. 1 illustrating still another embodiment of the present disclosure, FIG. 11 is a plan view of FIG. 10, FIG. 12A is a cross-sectional view taken along line D-D in FIG. 10, and FIG. 12B is a cross-sectional view taken along line E-E in FIG. 10.

FIGS. 10, 11, 12A and 12B illustrate a display device 1000 using a passive matrix (PM) type semiconductor light emitting device. However, the following illustration is also applicable to an active matrix (AM) type semiconductor light emitting device. As shown, the display device 1000 includes a substrate 1010, a first electrode 1020, a conductive adhesive layer 1030, a second electrode 1040 and a plurality of semiconductor light emitting devices 1050. Here, the first electrode 1020 may include a plurality of electrode lines as illustrated in the drawing. In an embodiment or modified example for each configuration which will be described below, the same of similar reference numerals are applied to the same or similar parts and elements throughout the drawings, and the description thereof will be substituted by the earlier description.

The substrate 1010 may be a wiring substrate disposed with a plurality of electrode lines included in the first electrode 1020, and thus the first electrode 1020 may be located on the substrate 1010. Furthermore, the second electrode 1040 is disposed on the substrate 1010. For example, the substrate 1010 may be a wiring substrate having a plurality of layers, and the first electrode 1020 and second electrode 1040 may be formed on a plurality of layers, respectively. In this instance, the wiring substrate may be a substrate in which the substrate 1010 and insulating layer 1060 are integrated with an insulating and flexible material such as polyimide (PI), PET, PEN, or the like in a display device described with reference to FIGS. 3A and 3B.

According to the drawing, the first electrode 1020 and second electrode 1040 are electrically connected to a plurality of semiconductor light emitting devices 1050. In this instance, the first electrode 1020 may be connected to the plurality of semiconductor light emitting devices 1050 through the auxiliary electrode 1070 disposed on the same plane as that of the second electrode. Electrical connection between the first electrode 1020 and second electrode 1040 and the plurality of semiconductor light emitting devices 1050 is performed by the conductive adhesive layer 1030 disposed on one surface of the substrate 1010.

The conductive adhesive layer 1030 may be a layer having adhesiveness and conductivity, and a material having conductivity and a material having adhesiveness may be mixed on the conductive adhesive layer 1030. Furthermore, the conductive adhesive layer 1030 may have flexibility, and thus it is possible to allow a flexible function in a display device.

For example, the conductive adhesive layer 1030 may be a solution containing an anisotropy conductive film (ACF), an anisotropic conductive paste and conductive particles. If the conductive adhesive layer 1030 is formed on the substrate 1010 when the auxiliary electrode 1070 and second electrode 1040 are located thereon, and then the semiconductor light emitting device 1050 is connected thereto in a flip chip type by applying heat and pressure, then the semiconductor light emitting device 1050 is electrically connected to the first electrode 1020 and the second electrode 1040.

The emission of the semiconductor light emitting device 1050 is controlled as the first electrode 1020 and second electrode 1040 to perform the role of a data electrode and a scan electrode, respectively. In this instance, the plurality of semiconductor light emitting devices 1050 constitutes a light emitting device array along a plurality of electrode lines, respectively, and a phosphor layer (or phosphor portion; hereinafter, referred to as a "phosphor portion" 1080) is formed on the light emitting device array.

The phosphor portions 1080 form a plurality of columns, and the plurality of columns are formed in a bar shape extended along a plurality of electrode lines of the first electrode 1020, respectively. More specifically, the phosphor portions 1080 are disposed in parallel to each other, and include a first and a second phosphor portion containing different phosphor materials. The phosphor portion 1080 may be located on an outer surface of the semiconductor light emitting device 1050. For example, the semiconductor light emitting device 1050 may be a blue semiconductor light emitting device that emits blue (B) light, and the phosphor portion 1080 may perform a function of converting the blue (B) light into a sub-pixel color. The first phosphor portion may be a red phosphor portion 1081 containing a red phosphor constituting an individual pixel, and the second phosphor portion may be a green phosphor portion 1082 containing a green phosphor.

In other words, the red phosphor 1081 capable of converting blue light into red (R) light may be deposited on the blue semiconductor light emitting device 1050 at a position constituting a red sub-pixel, and the green phosphor 1082 capable of converting blue light into green (G) light may be deposited on the blue semiconductor light emitting device 1050 at a position constituting a green sub-pixel. Furthermore, only the blue semiconductor light emitting device 1050 may be independently used at a portion constituting a blue sub-pixel. In this instance, the red (R), green (G) and blue (B) sub-pixels may constitute one pixel. More specifically, a specific color phosphor is deposited along each line of the first electrode 1020, and red or green phosphor may be deposited for each line. Accordingly, one line on the first electrode 1020 may be an electrode for controlling one color. On the contrary, red (R), green (G) and blue (B) may be sequentially disposed along the second electrode 1040, thereby implementing a sub-pixel.

Furthermore, as shown in FIG. 12B, a black matrix 1091 may be disposed between each line of the phosphor portion 1080 to enhance contrast. In other words, the black matrix 1091 can enhance the contrast of luminance. Also, the phosphor portion 1080 may be formed to cover at least part of the black matrix 1091. More specifically, both ends of the black matrix 1091 disposed between the red phosphor portion 1081 and green phosphor portion 1082 are covered by the red phosphor portion 1081 and green phosphor portion 1082, respectively. Thus, the height of the phosphor portion 1080 is formed to be higher than that of the black matrix 1091.

As shown in FIG. 11, the phosphor portion 1080 may include first phosphor portions 1080a and second phosphor portions 1080b. In this instance, each column of the red phosphor portion 1081 and each column of the green phosphor portion 1082 may include the phosphor portions 1080a, 1080b, respectively. Hereinafter, for the sake of convenience of explanation, the red phosphor portion 1081 and green phosphor portion 1082 will be commonly described as the phosphor portion 1080 without distinguishing them from each other.

The first phosphor portions 1080a are formed to cover one surface of semiconductor light emitting devices, respectively, sequentially disposed along each column. The second phosphor portions 1080b are disposed between the first phosphor portions 1080a, and formed to have a different shape from that of the first phosphor portions 1080a. As illustrated in the drawing, the second phosphor portions 1080b may be formed on one surface (outer surface) of the conductive adhesive layer 1030 performing the role of a partition wall between a plurality of semiconductor light emitting devices disposed along the same electrode line.

According to the drawing, at least some of the first phosphor portions 1080a covering semiconductor light emitting devices, respectively, may be formed to be higher than that of the second phosphor portions 1080b. Accordingly, the first phosphor portions 1080a may have a dome shape. More specifically, the first phosphor portions 1080a may be formed in a convex shape, and may have a protruded portion relatively protruded compared to the other portions. The protruded portion is formed on an opposite surface (the other surface) to one surface facing the semiconductor light emitting device in the first phosphor portions 1080a.

Here, the height of the first phosphor portions 1080a may increase as they draw closer to a light emitting portion (or light emitting surface 1053) from an edge of semiconductor light emitting devices. The light emitting portion as a region corresponding to a portion from which light is substantially emitted from semiconductor light emitting devices, may be a region in which a p-type electrode 156 (refer to FIG. 4) or p-type semiconductor layer 155 of the semiconductor light emitting device is located.

Thus, at least part of the other surface of the first phosphor portions 1080a is configured with a curved surface. A curvature radius of the curved surface may be formed to vary across the curved surface, and the curvature radius of a specific position on the curved surface may be determined based on a specific position on one surface of the semiconductor light emitting device facing the specific position. This is because an amount of approaching light varies according to a distance between a specific position on one surface of the semiconductor light emitting device and a light emitting portion or surface 1053 of the semiconductor light emitting device. According to the drawing, the amount of approaching light decreases as increasing a distance from one surface of the semiconductor light emitting device to the light emitting portion 1053, thereby decreasing the curvature radius of a curved surface facing the light emitting portion 1053. Furthermore, a portion facing the light emitting portion 1053 may be a curved surface having an infinite curvature radius, namely, a plane, since the amount of approaching light is similar.

Thus, the first phosphor portions 1080a may be formed with different heights on one surface of the semiconductor light emitting device. In other words, a phosphor with different thicknesses may be deposited on one surface of the semiconductor light emitting device and thus the first phosphor portions 1080a in a dome shape may be formed thereon. Furthermore, the second phosphor portions 1080b may have at least one side 1080b' inclined with respect to at least one side 1080a' of an outer surface (curved surface) of the first phosphor portions 1080a. According to the drawing, at least one side 1080a' of the first phosphor portions 1080a is formed along a horizontal direction to the black matrix or electrode line, and at least one side 1080b' of the second phosphor portions 1080b is formed in a direction crossed therewith.

The at least one side 1080b' may be formed to be concave toward the center of the second phosphor portions 1080b. More specifically, the second phosphor portions 1080b are formed at a central region 1081b and both sides of the central region 1081b, and may include an edge region 1082b in which an area of phosphor (or phosphor material) covering the conductive adhesive layer 1030 is larger than that of the central region 1081*b*. The 1082*b* may be a region adjacent to or brought into contact with the first phosphor portions 1080*a*.

Furthermore, the second phosphor portions 1080*b* may be formed such that the height in a thickness direction decreases as they draw closer to a central region of the second phosphor portions 1080*b*. More specifically, the second phosphor portions 1080*b* may have a lower thickness in the z-axis direction as being away farther from the first phosphor portions 1080*a*. Accordingly, the second phosphor portions 1080*b* may be formed with different thicknesses between the first phosphor portions 1080*a*. A phosphor (or phosphor material) with different thicknesses may be deposited on the conductive adhesive layer 1030 formed with the second phosphor portions 1080*b*, thereby forming the second phosphor portions 1080*b* in a concave shape. Here, the thickness of the central region may be relatively lower than that of the edge region.

Thus, the first phosphor portions 1080*a* in a relatively convex shape and the second phosphor portions 1080*b* in a relatively concave shape are repetitively formed on the phosphor portion 1080 according to the present embodiment. Further, the phosphor portion 1080 including the foregoing first and the second phosphor portion 1080*a*, 1080*b* having different shapes may be formed by curing a phosphor (or phosphor material) using light emitted from semiconductor light emitting devices.

The phosphor (or phosphor material) constituting the phosphor layer 1080 is a photosensitive material having a characteristic of being cured by light emitted from the semiconductor light emitting device. In other words, according to the present disclosure, a phosphor material may be exposed with light emitted from the semiconductor light emitting device using a photosensitive material causing a chemical change upon receiving light as a phosphor material, thereby forming the phosphor portion 1080. Further, the phosphor material may include a polyvinyl alcohol (PVA) based material, phosphor powder and resin. More specifically, the phosphor material may be a PVA-based water soluble photoresist. The PVA-based water soluble photoresist may be formed by dissolving ammonium dichromate (ADC) or diazo material in water. Meanwhile, ammonium dichromate (ADC) or diazo may have a characteristic of a photo-sensitizer. The ammonium dichromate (ADC) or diazo is a material that maximally absorbs light at a wavelength corresponding to blue light. In this instance, the phosphor material may be a material with an absorption rate of 50-90% (absorption coefficient is 0.5-0.9) at a wavelength corresponding to blue light.

Thus, the phosphor portion 1080 may be cured by light emitted from semiconductor light emitting devices, and at least one of the thickness, area and shape of the phosphor portion 1080 may be affected by the property of light emitted from the semiconductor light emitting device. Here, the property of light may be at least one of a light emission time, a light emission intensity, a light emission area and a light emission range of the emitted light.

More specifically, the extent of curing a phosphor material may increase as the light emission time of the emitted light increases. For example, a phosphor layer which is thicker in the thickness direction may be formed as increasing the light emission time. Similarly, the extent of curing a phosphor material may increase as the light emission intensity increases. For example, a phosphor layer which is thicker in the thickness direction may be formed as increasing the light emission intensity. Furthermore, the area of the cured material in the horizontal direction may increase as the light emission area of the emitted light increases. Here, the light emission area may be an area of p-type electrode 156 (refer to FIG. 4) or p-type semiconductor layer 155. Similarly, the area of the cured material in the horizontal direction may increase as the light emission range of the emitted light increases. The light emission range may be a range in which light being dispersed from the light emitting portion of the semiconductor light emitting device transmits the phosphor material.

A phosphor material constituting the phosphor portion 1080 is cured by light emitted from the semiconductor light emitting device, and thus the extent of curing increases as the phosphor material is located closer to the light emitting portion 1053 of the semiconductor light emitting device. Accordingly, the first phosphor portions 1080*a* having a dome shape may relatively have the highest height in a thickness direction at the light emitting portion 1053 of the semiconductor light emitting device. In other words, a phosphor material may be formed to be thicker in the light emitting portion 1053 of the semiconductor light emitting device. Accordingly, the first phosphor portions 1080*a* may be deposited with different heights on one surface of the semiconductor light emitting device according to the extent of curing the phosphor material. Accordingly, the first phosphor portions 1080*a* may be formed to be inclined in a thickness direction as being away farther from the light emitting portion 1053.

Furthermore, the curvature radius of a curved surface formed with the foregoing first phosphor portions 1080*a* may be the largest at the light emitting portion 1053 of the semiconductor light emitting device on which the phosphor material is cured in a relatively excellent manner. More specifically, the first phosphor portions 1080*a* may have a curved surface on which the closest position to the light emitting portion 1053 of the semiconductor light emitting device is a plane and the farthest position therefrom has a smaller curvature radius.

Further, light emitted from the semiconductor light emitting devices may be dispersed into a phosphor material coated on the conductive adhesive layer 1030 located between the semiconductor light emitting devices, and thus the second phosphor portions 1080*b* may be formed by a phosphor material cured due to the dispersed light. In other words, light emitted from semiconductor light emitting devices may be transmitted on a phosphor material when the phosphor material is coated thereon to form the second phosphor portions 1080*b* cured by the transmitted light. Accordingly, the amount of light transmitted to the central region of the second phosphor portions 1080*b* may be relatively small, and thus the second phosphor portions 1080*b* may have a lower thickness in the z-axis direction as they draw closer to the central region from the edge region adjacent to the first phosphor portions 1080*a*. Accordingly, the second phosphor portions 1080*b* may be formed to have different heights between the first phosphor portions 1080*a*. In other words, the thickness of the central region may be relatively lower than that of the edge region.

Furthermore, one side 1080*b*' of the second phosphor portions 1080*b* may be formed to be inclined based on the amount of light emitted from semiconductor light emitting devices being transmitted through a phosphor material coated during the formation of the second phosphor portions 1080*b*. In other words, even when the phosphor material is coated to form a line in parallel to one side 1080*a*' of the second phosphor portions 1080*b*, the one side 1080*b*' of the second phosphor portions 1080*b* may be formed to be inclined due to non-curing.

Thus, since the amount of transmitted light decreases as they draw closer to the central region, an area covering the conductive adhesive layer 1030 may vary according to the extent of being close to the semiconductor light emitting device even within the second phosphor portions 1080*b*. More specifically, the second phosphor portions 1080*b* may have at least one side configured to be concave toward the center in a horizontal direction. Accordingly, the area covering the conductive adhesive layer 1030 may be relatively broader in the edge region of the second phosphor portions 1080*b* compared to that of the central region [1081*b*]. Thus, the area covering the conductive adhesive layer 1030 and the height in a thickness direction may increase as the second phosphor portions 1080*b* draw closer to the edge region [1082] from the central region.

As described above, a display device according to the present disclosure may include a phosphor layer cured by light emitted from the semiconductor light emitting device. Due to the phosphor layer, an expensive exposure device for curing the phosphor layer may not be required, and thus it is economical. However, the present disclosure is not limited to this, and the semiconductor light emitting device 1050 may be combined with a quantum dot (QD) instead of a phosphor to implement sub-pixels that emit red (R), green (G) and blue (B).

Hereinafter, a method of forming a phosphor layer using light emitted from the semiconductor light emitting device will be described in more detail with reference to the accompanying drawings. FIGS. 13A, 13B, 14A, 14B and 14C are cross-sectional views illustrating a method of fabricating a display device using a semiconductor light emitting device according to the present embodiment. A display device using the foregoing semiconductor light emitting device may be fabricated using a novel type fabrication method. Here, the fabrication method will be described below.

Figure 13A:
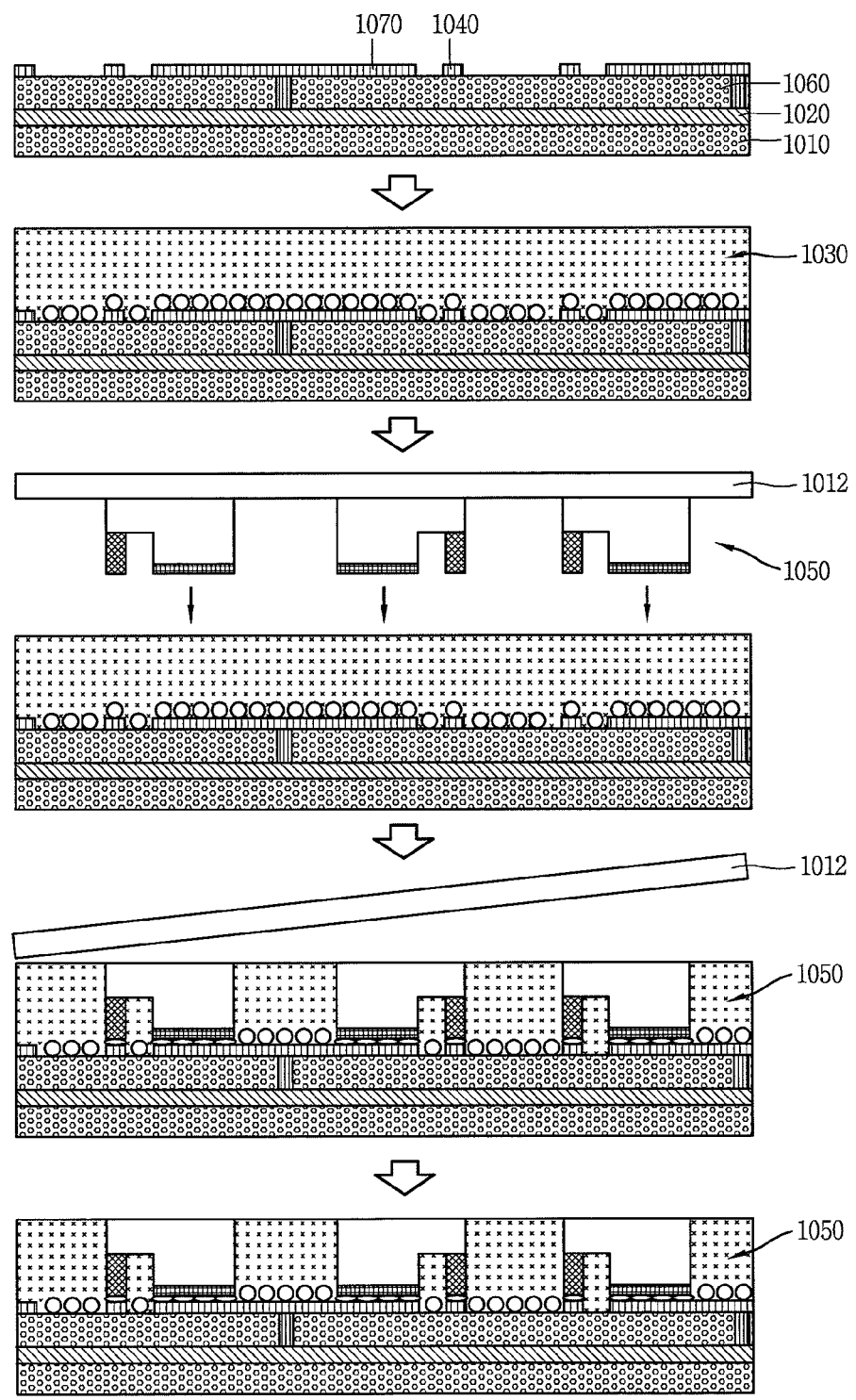
FIGS. 13A through 14C are cross-sectional views illustrating a method of fabricating a display device using a semiconductor light emitting device according to the present disclosure.
Figure 13B:
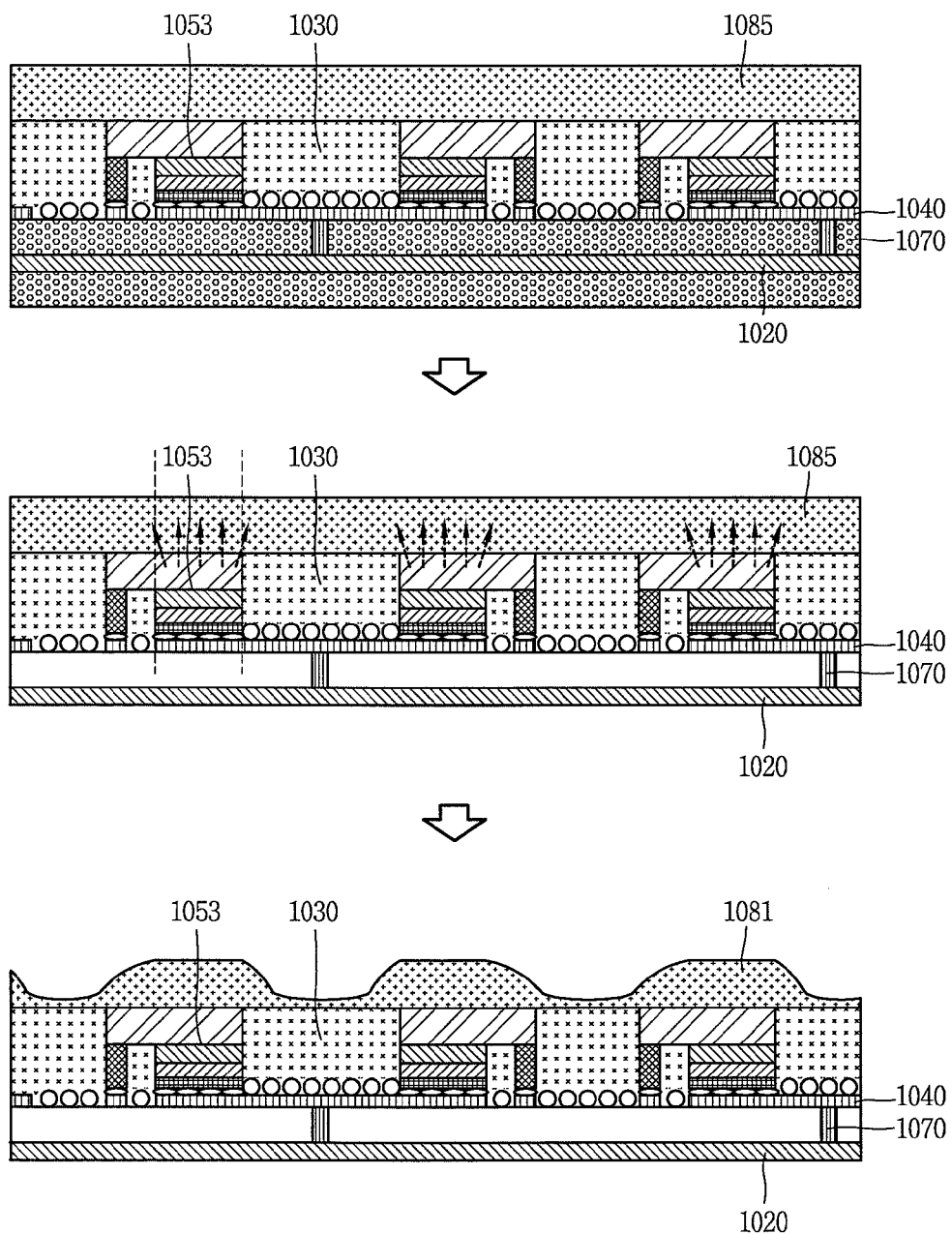

FIGS. 13A and 13B are views illustrating a method of fabricating a display device using a semiconductor light emitting device according to an embodiment of the present disclosure with reference to cross-sectional views seen in the D-D direction of FIG. 10, and FIGS. 14A, 14B and 14C are views illustrating a method of fabricating a display device using a semiconductor light emitting device according to an embodiment of the present disclosure with reference to cross-sectional views seen in the C-C direction of FIG. 10.

First, referring to FIGS. 13A and 13B, the conductive adhesive layer 1030 is formed on the insulating layer 1060 located with the auxiliary electrode 1070 and second electrode 1040. The insulating layer 1060 is deposited on the first substrate 1010 to form one substrate (or wiring substrate), and the first electrode 1020, auxiliary electrode 1070 and second electrode 1040 are disposed on the wiring substrate. In this instance, the first electrode 1020 and second electrode 1040 may be disposed in directions perpendicular to each other. Furthermore, the first substrate 1010 and insulating layer 1060 may contain glass or polyimide (PI), respectively, to implement a flexible display device.

The conductive adhesive layer 1030 may be implemented by an anisotropic conductive film, for example, and an anisotropic conductive film may be coated on a substrate located with the insulating layer 1060. Next, a second substrate 1012 located with a plurality of semiconductor light emitting devices 1050 corresponding to the location of the auxiliary electrodes 1070 and second electrodes 1040 and constituting individual pixels is disposed such that the semiconductor light emitting device 1050 faces the auxiliary electrode 1070 and second electrode 1040.

In this instance, the second substrate 1012 as a growth substrate for growing the semiconductor light emitting device 1050 may be a sapphire substrate or silicon substrate. The semiconductor light emitting device may have a gap and size capable of implementing a display device when formed in the unit of wafer, and thus effectively used for a display device.

Next, the wiring substrate 1010 is thermally compressed to the second substrate 1012. For example, the wiring substrate 1010 and second substrate 1012 may be thermally compressed to each other by applying an ACF press head. The wiring substrate 1010 and second substrate 1012 are bonded to each other using the thermal compression. Only a portion between the semiconductor light emitting device 1050 and the auxiliary electrode 1070 and second electrode 1040 may have conductivity due to the characteristics of an anisotropic conductive film having conductivity by thermal compression, thereby allowing the electrodes and semiconductor light emitting device 1050 to be electrically connected to each other. At this time, the semiconductor light emitting device 1050 may be inserted into the anisotropic conductive film, thereby forming a partition wall between the semiconductor light emitting devices 1050.

Next, the second substrate 1012 is removed. For example, the second substrate 1012 may be removed using a laser lift-off (LLO) or chemical lift-off (CLO) method. Finally, the second substrate 1012 is removed to expose the semiconductor light emitting devices 1050 to the outside. Silicon oxide (SiOx) or the like may be coated on the wiring substrate coupled to the semiconductor light emitting device 1050 to form a transparent insulating layer. Next, a black matrix 1091 (shown in FIG. 12B) may be disposed between semiconductor arrays constituting semiconductor light emitting devices disposed in a plurality of columns along the electrode line of the first electrode 1020 to enhance contrast. In other words, the black matrix 1091 can enhance the contrast of luminance.

Next, the process of forming a phosphor layer on one surface of the semiconductor light emitting device 1050 is performed. Referring to FIG. 13B, a photosensitive phosphor (or phosphor material 1085) is coated on the semiconductor light emitting device 1050 coupled to a conductive adhesive layer 1030. A method such as spin coating, die coater or spray may be used for the method of coating the photosensitive phosphor. Further, the phosphor material 1085 may include a polyvinyl alcohol (PVA) based material, phosphor powder and resin. More specifically, the phosphor material 1085 may be a PVA-based water soluble photoresist. The PVA-based water soluble photoresist may be formed by dissolving ammonium dichromate (ADC) or diazo material in water. Meanwhile, ammonium dichromate (ADC) or diazo may have a characteristic of a photosensitizer. The ammonium dichromate (ADC) or diazo is a material that maximally absorbs light at a wavelength corresponding to blue light.

In addition, the semiconductor light emitting device 1050 may be a blue semiconductor light emitting device that emits blue (B) light, and a red or green phosphor for converting blue (B) light into a sub-pixel color by the coating may form a layer on one surface of the blue semiconductor light emitting device. In order to form a sub-pixel, any one of the red and green phosphors is coated, and then a phosphor layer for the any one is formed, and then a phosphor layer for another one is formed.

According to the drawing, when a red phosphor is first coated will be described as an example. As illustrated in the drawing, the red phosphor 1085 is coated on one surface of semiconductor light emitting devices. In this instance, the red phosphor 1085 may be coated to have a bar shape extended along one direction, or coated on an entire surface of the wiring substrate. Next, the coated red phosphor 1085 is exposed using semiconductor light emitting devices disposed at a position constituting a red sub-pixel among semiconductor light emitting devices disposed in a plurality of columns along the electrode line of the first electrode 1020. Through this exposure, the red phosphor 1085 coated on semiconductor light emitting devices disposed at a position constituting the red sub-pixel is cured.

Thus, the red phosphor 1085 is cured and then the non-cured red phosphor 1085 is dissolved while allowing only the cured red phosphor 1085 portion to remain to remove the non-cured red phosphor 1085 from the substrate. Here, water may be used as a developing solution. Further, as illustrated in FIG. 13B, if the non-cured red phosphor 1085 is removed, then a red phosphor portion 1081 for converting blue light emitted from the semiconductor light emitting device into red light is formed. Since the phosphor material is cured by the blue light of the semiconductor light emitting device, according to the present embodiment, a phosphor portion with a novel structure will be created. In other words, the red phosphor portion 1081 cured by light emitted from the semiconductor light emitting device may be formed to have a specific structure as illustrated in FIGS. 10, 11, 12A and 12B.

Figure 14A:
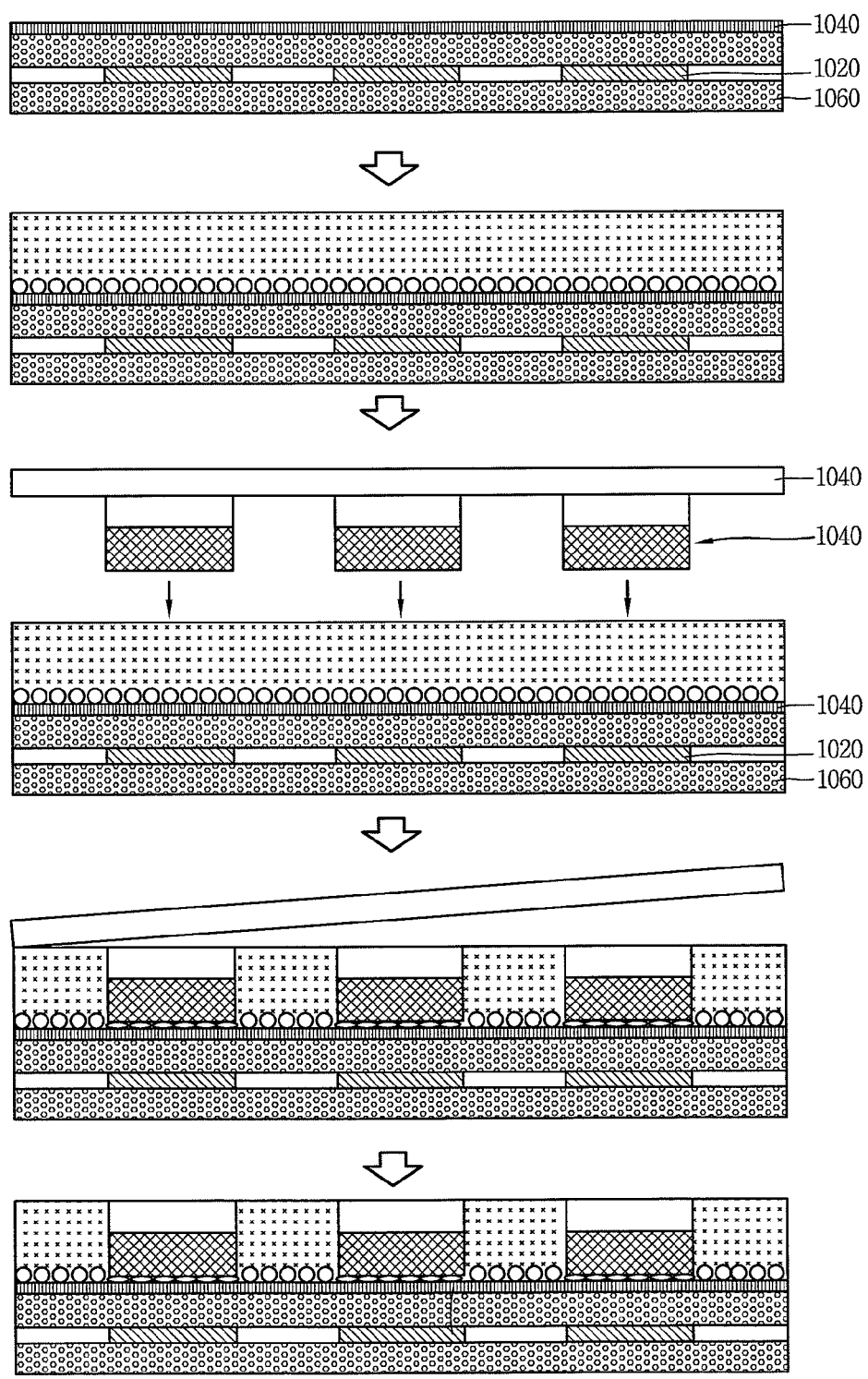
Figure 14B:
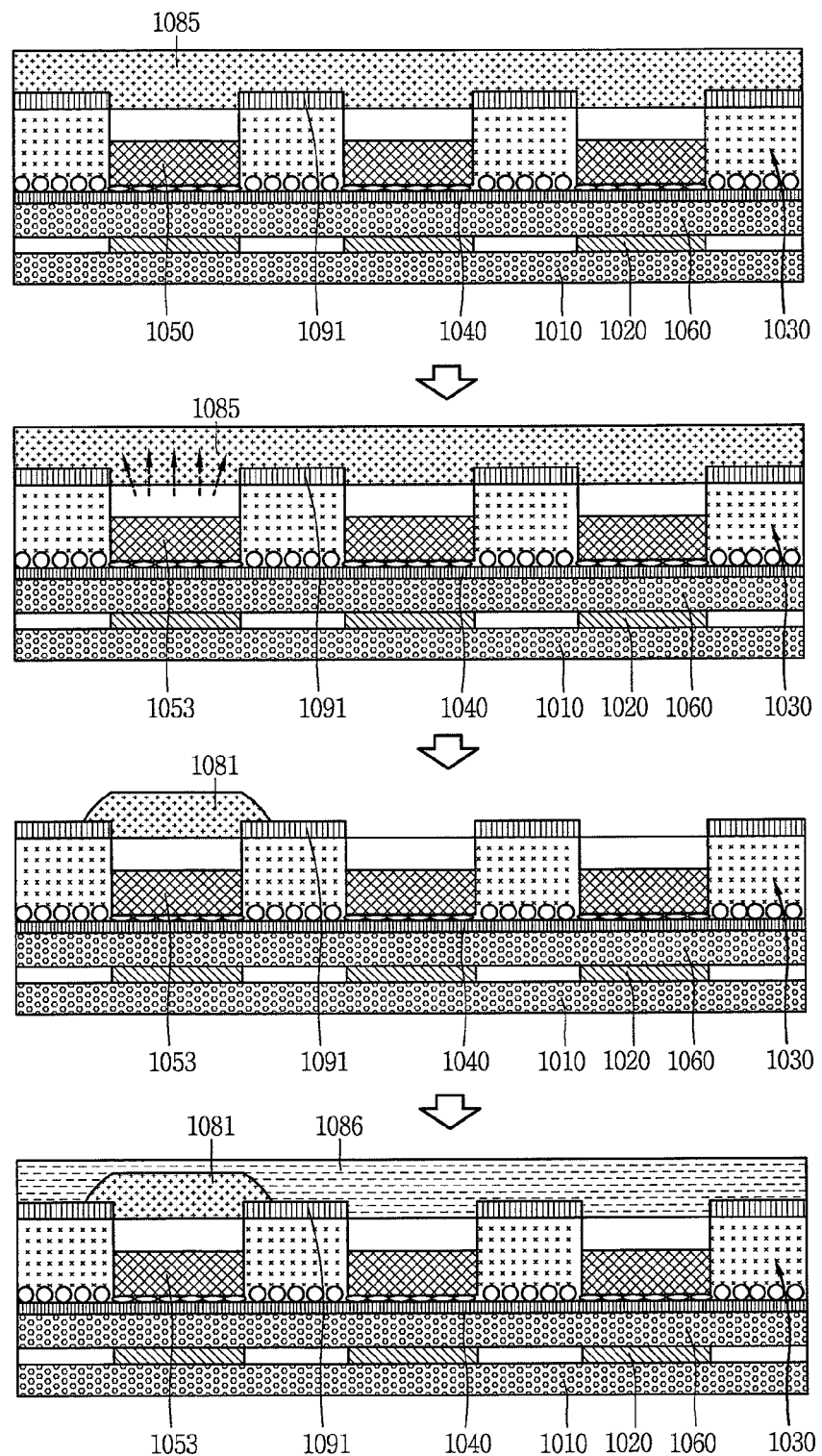

Next, as illustrated in FIGS. 14A and 14B, if the formation of the red phosphor portion 1081 is completed, then a blue phosphor 1086 is coated on an entire surface of the semiconductor light emitting device 1050. Furthermore, the blue phosphor 1086 may be coated to have a bar shape extended along one direction, or coated on an entire surface of the wiring substrate. In this example, a blue phosphor material 1085 is used to form the blue phosphor 1086 similar to the process in FIGS. 13A and 13B.

A method such as spin coating, die coater or spray may be used for the method of coating the photosensitive phosphor. Further, the phosphor material may include a polyvinyl alcohol (PVA) based material, phosphor powder and resin. More specifically, the phosphor material may be a PVA-based water soluble photoresist. The PVA-based water soluble photoresist may be formed by dissolving ammonium dichromate (ADC) or diazo material in water. Meanwhile, ammonium dichromate (ADC) or diazo may have a characteristic of a photo-sensitizer. The ammonium dichromate (ADC) or diazo is a material that maximally absorbs light at a wavelength corresponding to blue light.

Figure 14C:
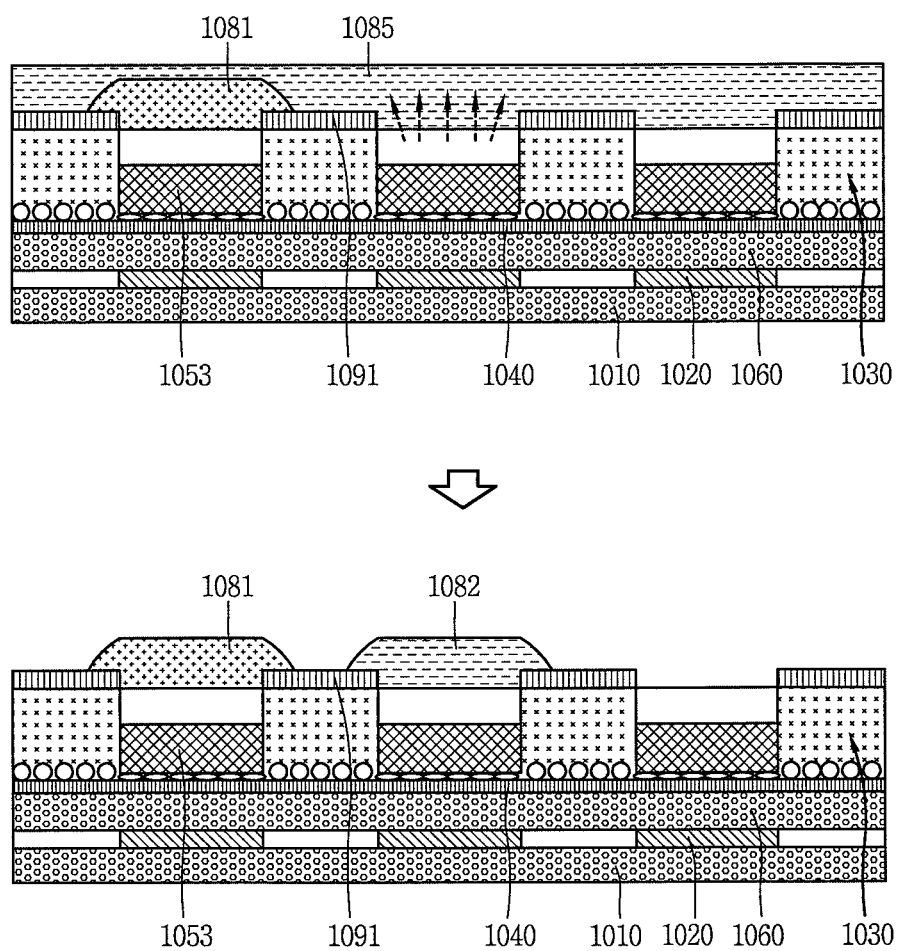

If the coating of the blue phosphor 1086 is completed, then the coated blue phosphor 1086 is exposed using semiconductor light emitting devices disposed at a position constituting a green sub-pixel among semiconductor light emitting devices disposed in a plurality of columns along the electrode line of the first electrode 1020 as illustrated in FIG. 14C. Through the exposure using the semiconductor light emitting devices, the blue phosphor 1086 coated on semiconductor light emitting devices disposed at a position constituting the green sub-pixel is cured.

Thus, the blue phosphor 1086 is cured and then the non-cured blue phosphor 1086 is dissolved while allowing only the cured blue phosphor 1086 portion to remain to remove the non-cured blue phosphor 1086 from the substrate. Here, water may be used as a developing solution. As illustrated in FIG. 14C, if the non-cured blue phosphor 1086 is removed, then a green phosphor portion 1082 for converting blue light emitted from the semiconductor light emitting device into green light is formed. The green phosphor portion 1082 cured by light emitted from the semiconductor light emitting device may be formed to have a specific structure as illustrated above in FIGS. 10, 11, 12A and 12B according to the property of light. In this example, a green phosphor material 1085 is used to form the green phosphor 1082 similar to the process in FIGS. 13A and 13B, 14A and 14B.

According to a fabrication method of a display device as described above, it is possible to fabricate a display device including a phosphor portion having the foregoing structure as illustrated in FIGS. 10, 11, 12A and 12B. The fabrication method or structure of a display device using the foregoing semiconductor light emitting device may be modified into various forms. For example, a phosphor portion formed through the fabrication method of FIGS. 13A, 13B, 14A, 14B and 14C may have various shapes according to the property of light emitted from the semiconductor light emitting device during the exposure of a phosphor (or phosphor material) to form the phosphor portion. Hereinafter, representative examples of various shapes of the phosphor portion will be described in more detail with reference to the accompanying drawings with reference to the accompanying drawings.

Figure 15A:
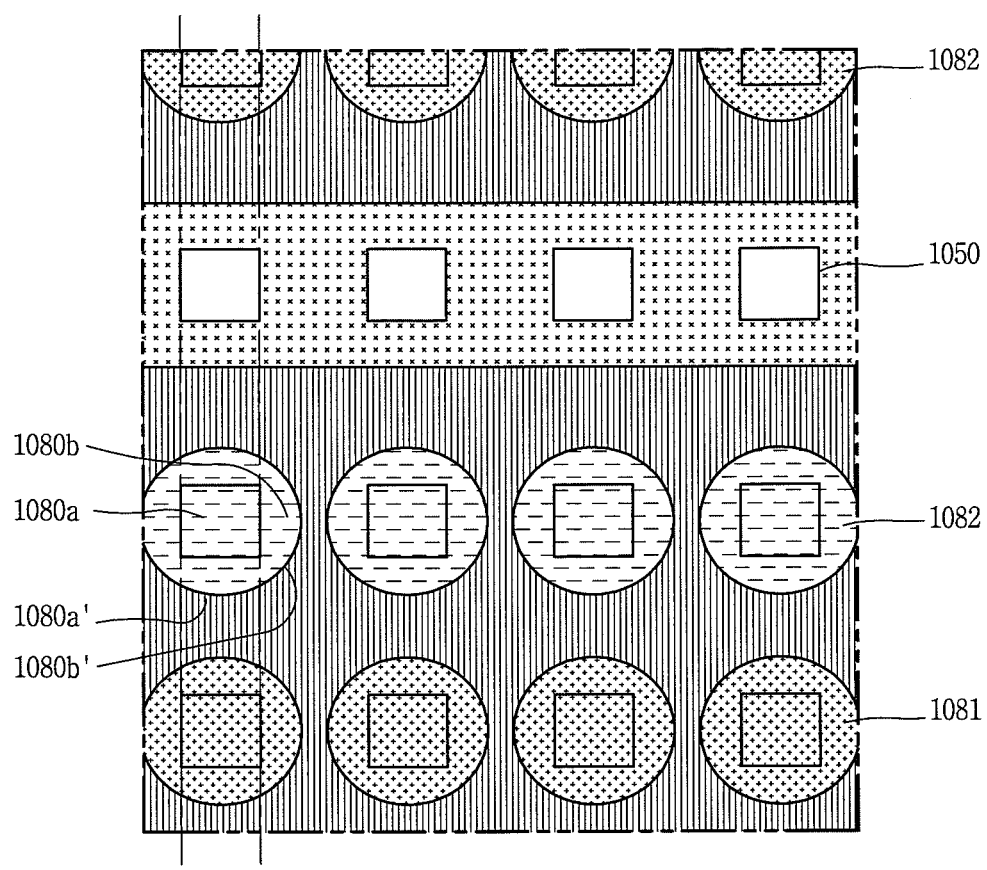
FIG. 15A is a plan view illustrating another embodiment of the display device illustrated in FIG. 10.
Figure 15B:
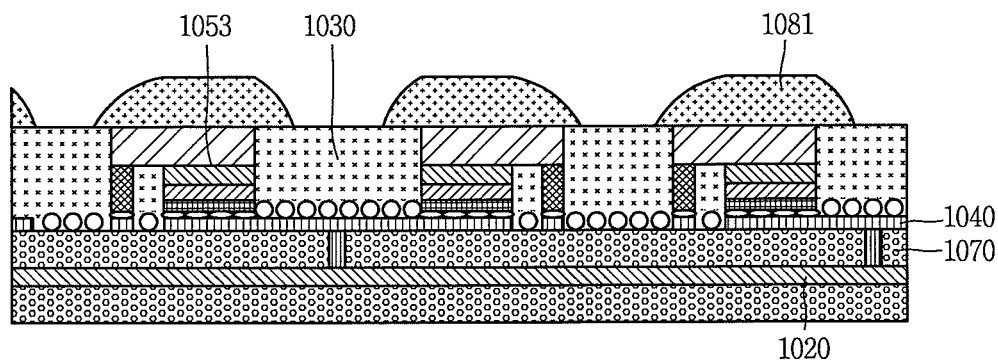
FIGS. 15B and 15C are cross-sectional views of FIG. 15A.
Figure 15C:
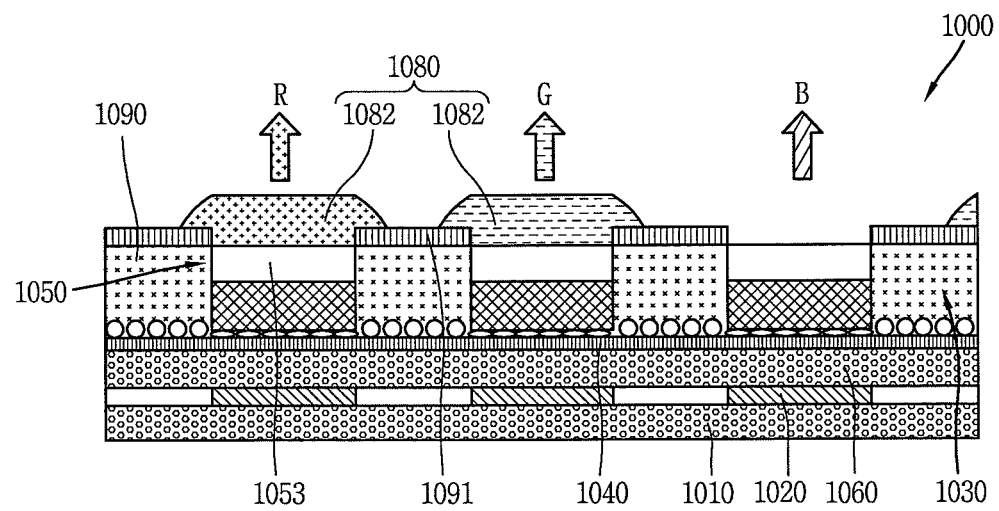

Next, FIG. 15A is a plan view illustrating another embodiment of the display device illustrated in FIG. 10, and FIGS. 15B and 15C are cross-sectional views of FIG. 15A. Referring to FIGS. 15A, 15B and 15C, the phosphor portion 1080 may include first phosphor portions 1080a formed to cover one surface of semiconductor light emitting devices, respectively, sequentially disposed along the plurality of electrode lines included in the first electrode 1020 and second phosphor portions 1080b disposed between the first phosphor portions 1080a, and configured to have a different shape from that of the first phosphor portions 1080a. Here, the second phosphor portions 1080b may include a central region, and edge regions formed at both sides of the central region. The insulating layer 1060 may be covered by the second phosphor portions 1080b.

The phosphor material may be discontinuously formed in at least part of the central region of the second phosphor portions 1080b. In other words, a separation space is formed in the central region 1081b of the second phosphor portions by the discontinuity. As illustrated in the drawing, the separation space may be formed on the phosphor portion 1080 covering semiconductor light emitting devices connected to the same electrode line of the first electrode 1020.

According to an embodiment of the present disclosure, the phosphor portion 1080 is formed by curing a phosphor material using light emitted from the semiconductor light emitting device, and thus the structure of the phosphor portion 1080 may be modified according to the characteristic of the emitted light (or property of light). More specifically, as illustrated in the present embodiment, when the emitted light does not reach on at least part of the central region of the phosphor portion 1080, the phosphor material is not cured in the central region 1081b. Accordingly, it is possible to form the separation space corresponding to the at least part thereof.

Furthermore, the second phosphor portions 1080b may have at least one side 1080b' inclined with respect to one side 1080a' of the first phosphor portions 1080a based on the amount of light emitted from semiconductor light emitting device being transmitted to the phosphor material coated for the formation of the second phosphor portions 1080b. The at least one side 1080b' is discontinuously formed by the separation space 1083b. The second phosphor portions 1080b may have a shape of two trapezoids facing each other.

Thus, for the second phosphor portions 1080b, the first phosphor portions 1080a in a convex shape and the second phosphor portions 1080b in a concave shape which is discontinuous on at least part of the central region 1081b may be repetitively formed.

Furthermore, in this instance, vacant spaces on which the phosphor material is not disposed may be sequentially formed along the length direction of the phosphor portion. The phosphor material may be cured in a shape corresponding to an external appearance of the semiconductor light emitting devices, and through this, the phosphor portion 1080 may be a shape having only the first phosphor portions 1080a without having the second phosphor portions. In this instance, at least part of the phosphor portion 1080 may be a dome shape in which the height increases as being away farther from the vacant space.

According to an embodiment illustrated in FIGS. 10 through 14C, a display device for implementing a sub-pixel a blue semiconductor light emitting device emitting blue (B) light has been described. However, the present disclosure is not limited to this, and another structure for implementing red, green and blue corresponding to the sub-pixel may be also applicable thereto.

Hereinafter, a display device to which another structure is applicable in order to implement a sub-pixel will be described in more detail with reference to the accompanying drawings. FIGS. 16A, 16B, 17A and 17B are conceptual views illustrating various forms of implementing colors in association with a flip chip type semiconductor light emitting device to which the present disclosure is applied. Semiconductor light emitting devices may be implemented as a high power light emitting device that emits various light including blue in which gallium nitride (GaN) is mostly used, and indium (In) and/or aluminum (Al) are additionally used.

Figure 16A:
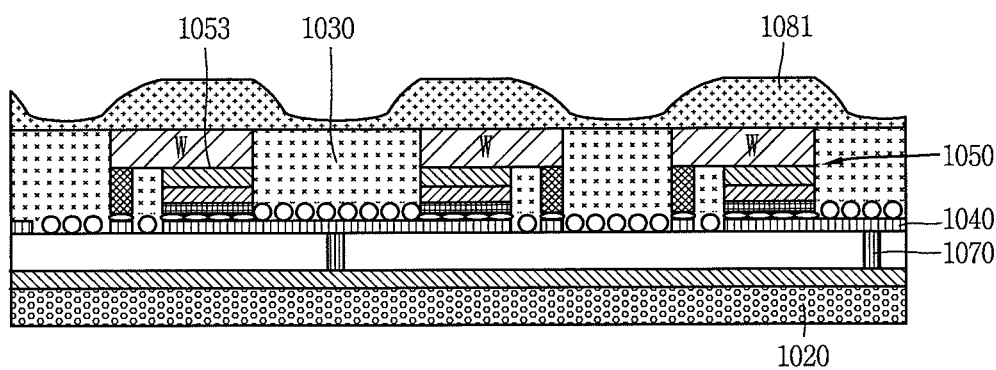
FIGS. 16A through 17B are conceptual views illustrating various forms of implementing colors in association with a flip chip type semiconductor light emitting device to which the present disclosure is applied.
Figure 16B:
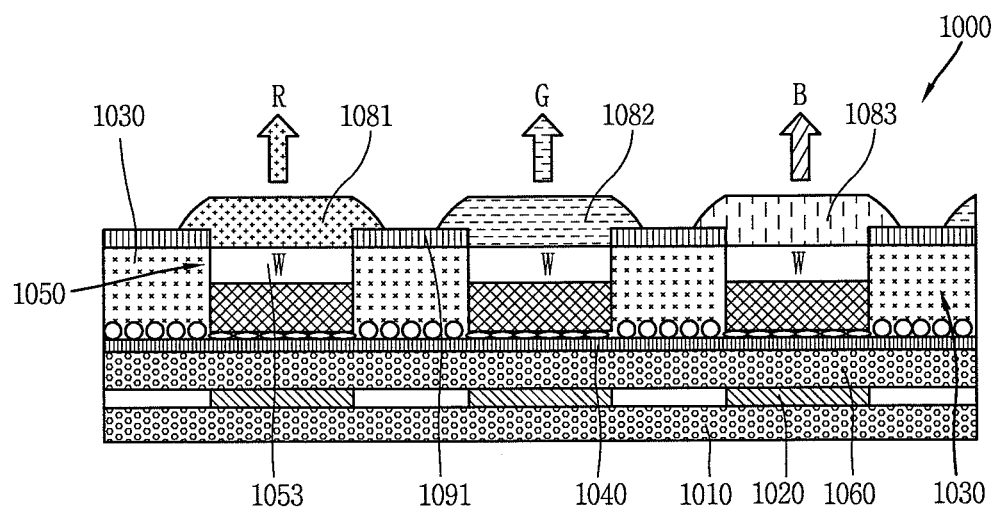

Referring to FIGS. 16A and 16B, a display device according to the present embodiment includes a white light emitting device (W). In this instance, in order to implement a sub-pixel, a phosphor portion containing different phosphor materials may be formed on the white light emitting device (W). For example, the red phosphor portion 1081 containing a red phosphor capable of converting white light into red (R) light may be deposited on the white light emitting device (W) at a position constituting a red sub-pixel. Furthermore, the green phosphor portion 1082 containing a green phosphor capable of converting white light into green (G) light may be deposited on the white light emitting device (W) at a position constituting a green sub-pixel.

Furthermore, the blue phosphor portion 1083 containing a blue phosphor capable of converting white light into blue (B) light may be deposited on the white light emitting device (W) at a position constituting a blue sub-pixel. Accordingly, one pixel may be implemented through a combination of red (R), green (G) and blue (B) light. More specifically, a specific color phosphor is deposited along each line of the first electrode 1020, and red or green phosphor may be deposited for each line. Accordingly, one line on the first electrode 1020 may be an electrode for controlling one color. On the contrary, red (R), green (G) and blue (B) may be sequentially disposed along the second electrode 1040, thereby implementing a sub-pixel.

Furthermore, a black matrix 1091 may be disposed between each line of the phosphor portion 1080 to enhance contrast. Furthermore, the phosphor portion 1080 may be formed to cover at least part of the black matrix 1091. More specifically, both ends of the black matrix 1091 disposed between the red phosphor portion 1081 and green phosphor portion 1082 are covered by the red phosphor portion 1081 and green phosphor portion 1082, respectively. Thus, the height of the phosphor portion 1080 is formed to be higher than that of the black matrix 1091.

Hereinafter, for the sake of convenience of explanation, the red phosphor portion 1081, green phosphor portion 1082 and blue phosphor portion 1083 will be commonly described as the phosphor portion 1080 without distinguishing them from each other. The first phosphor portions 1080a are formed to cover one surface of semiconductor light emitting devices, respectively, sequentially disposed along the each column. The second phosphor portions 1080b are disposed between the first phosphor portions 1080a, and formed to have a different shape from that of the first phosphor portions 1080a. As illustrated in the drawing, the second phosphor portions 1080b may be formed on one surface (outer surface) of the conductive adhesive layer 1030 performing the role of a partition wall between a plurality of semiconductor light emitting devices disposed along the same electrode line.

The phosphor (or phosphor material) constituting the phosphor layer 1080 is a photosensitive material having a characteristic of being cured by light emitted from the semiconductor light emitting device. In other words, according to the present disclosure, a photosensitive material causing a chemical change upon receiving light is used as a phosphor material. Accordingly, the phosphor material may be exposed with light emitted from the semiconductor light emitting device to form the phosphor layer 1080. The phosphor material may include a photosensitive material, phosphor powder and resin. A photosensitive material coated on the white light emitting device (W) is a material that maximally absorbs light at a wavelength corresponding to white light.

Further, as illustrated in FIGS. 16A and 16B, the structure of the phosphor portion 1080 formed on the white light emitting device (W) is the same as or similar to that of the phosphor portion 1080 illustrated in FIGS. 10 through 15B, and thus the detailed description thereof will be omitted.

Figure 17A:
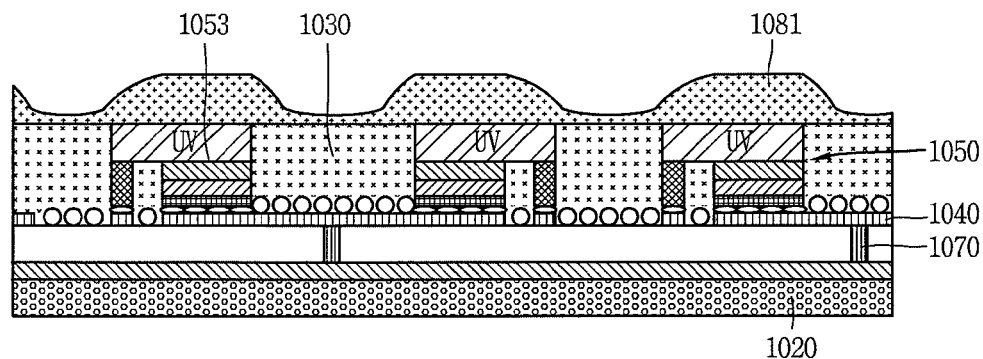
Figure 17B:
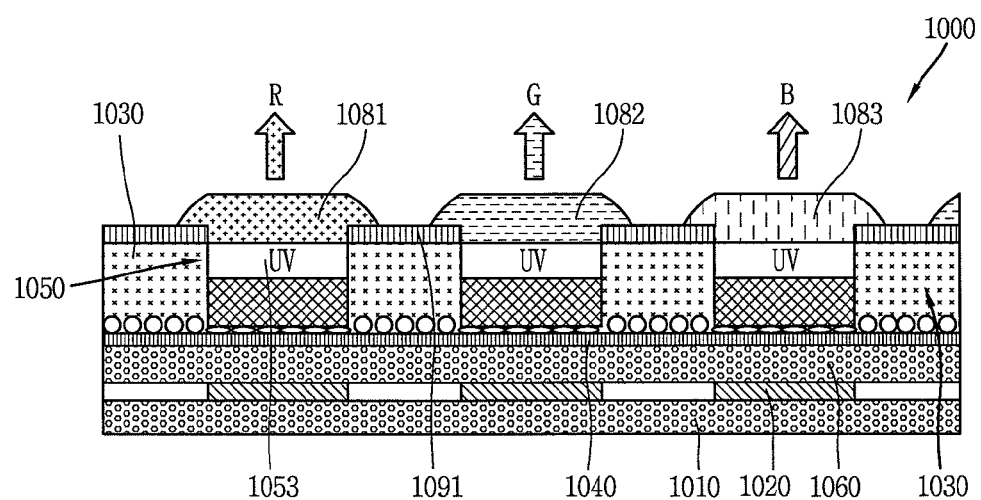

In another example, referring to FIGS. 17A and 17B, a display device according to the present embodiment includes an ultraviolet light emitting device (UV). In this instance, in order to implement a sub-pixel, a phosphor portion containing different phosphor materials may be formed on the ultraviolet light emitting device (UV).

For example, the red phosphor portion 1081 containing a red phosphor capable of converting white light into red (R) light may be deposited on the ultraviolet light emitting device (UV) at a position constituting a red sub-pixel. Furthermore, the green phosphor portion 1082 containing a green phosphor capable of converting white light into green (G) light may be deposited on the ultraviolet light emitting device (UV) at a position constituting a green sub-pixel. Furthermore, the blue phosphor portion 1083 containing a blue phosphor capable of converting white light into blue (B) light may be deposited on the ultraviolet light emitting device (UV) at a position constituting a blue sub-pixel. Accordingly, one pixel may be implemented through a combination of red (R), green (G) and blue (B) light. More specifically, a specific color phosphor is deposited along each line of the first electrode 1020, and red or green phosphor may be deposited for each line. Accordingly, one line on the first electrode 1020 may be an electrode for controlling one color. On the contrary, red (R), green (G) and blue (B) may be sequentially disposed along the second electrode 1040, thereby implementing a sub-pixel.

Furthermore, a black matrix 1091 may be disposed between each line of the phosphor portion 1080 to enhance contrast. Furthermore, the phosphor portion 1080 may be formed to cover at least part of the black matrix 1091. More specifically, both ends of the black matrix 1091 disposed between the red phosphor portion 1081 and green phosphor portion 1082 are covered by the red phosphor portion 1081 and green phosphor portion 1082, respectively. Thus, the height of the phosphor portion 1080 is formed to be higher than that of the black matrix 1091.

Hereinafter, for the sake of convenience of explanation, the red phosphor portion 1081, green phosphor portion 1082 and blue phosphor portion 1083 will be commonly described as the phosphor portion 1080 without distinguishing them from each other. The first phosphor portions 1080a are formed to cover one surface of semiconductor light emitting devices, respectively, sequentially disposed along the each column. The second phosphor portions 1080b are disposed between the first phosphor portions 1080a, and formed to have a different shape from that of the first phosphor portions 1080a. As illustrated in the drawing, the second phosphor portions 1080b may be formed on one surface (outer surface) of the conductive adhesive layer 1030a performing the role of a partition wall between a plurality of semiconductor light emitting devices disposed along the same electrode line.

The phosphor (or phosphor material) constituting the phosphor layer 1080 is a photosensitive material having a characteristic of being cured by light emitted from the semiconductor light emitting device. In other words, according to the present disclosure, a photosensitive material causing a chemical change upon receiving light is used as a phosphor material. Accordingly, the phosphor material may be exposed with light emitted from the semiconductor light emitting device to form the phosphor layer 1080. The phosphor material may include a photosensitive material, phosphor powder and resin. A photosensitive material coated on the ultraviolet light emitting device (UV) is a material that maximally absorbs light at a wavelength corresponding to white light.

Further, as illustrated in FIGS. 17A and 17B, the structure of the phosphor portion 1080 formed on the ultraviolet light emitting device (UV) is the same as or similar to that of the phosphor portion 1080 illustrated in FIGS. 10 through 14C, and thus the detailed description thereof will be omitted.

Figure 18:
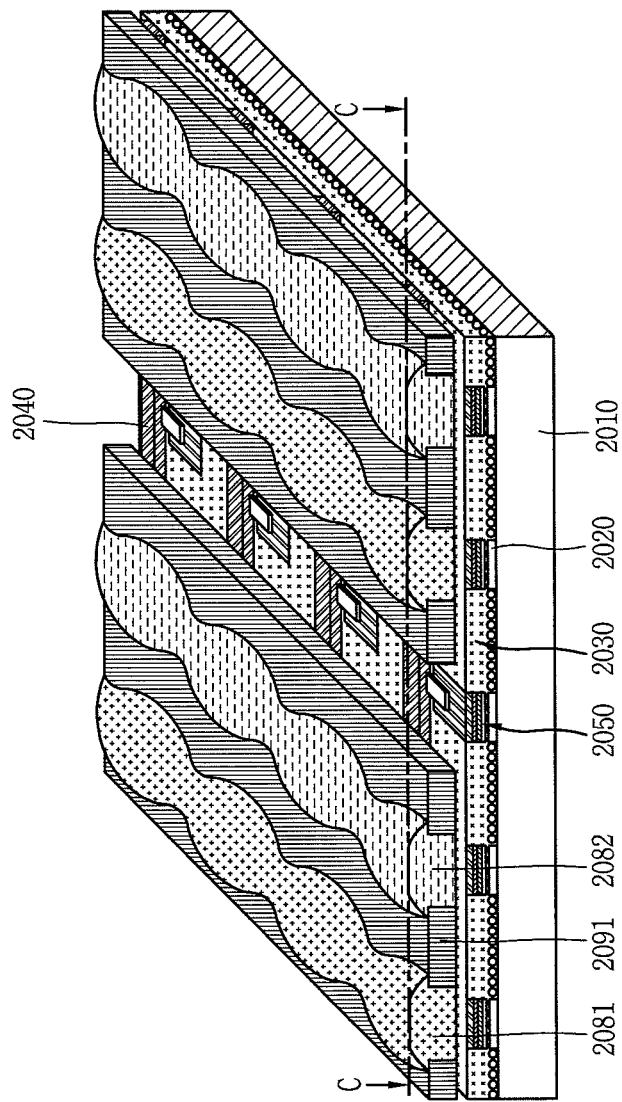
FIG. 18 is an enlarged view of portion "A" in FIG. 1 illustrating yet still another embodiment of the present disclosure.
Figure 19:
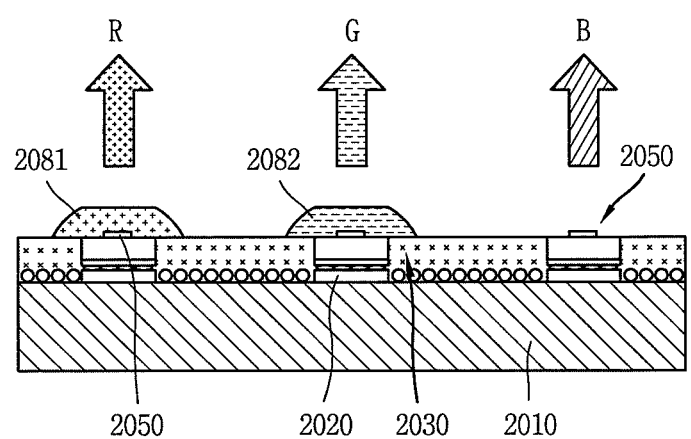
FIG. 19 is a cross-sectional view taken along line F-F in FIG. 18.

Next, FIG. 18 is an enlarged view of portion "A" in FIG. 1 illustrating yet still another embodiment of the present disclosure, and FIG. 19 is a cross-sectional view taken along line F-F in FIG. 18. Furthermore, the structure of the foregoing display device may be applicable to a vertical semiconductor light emitting device. Hereinafter, the vertical structure will be described with reference to FIGS. 18 and 19.

According to the drawings, the display device is a passive matrix (PM) type of vertical semiconductor light emitting device. The display device 2000 includes a substrate 2010, a conductive adhesive layer 2030, and a plurality of semiconductor light emitting devices 2050. Hereinafter, the description of the present illustration for the same or similar configuration to that of the illustration disclosed in FIGS. 7 through 9 will be substituted by the earlier description. Moreover, a display device including a vertical type semiconductor light emitting device according to FIGS. 18 and 19 may be provided with a phosphor portion described with reference to FIGS. 10 through 17B. Accordingly, in the description of a display device including a vertical type semiconductor light emitting device according to FIGS. 18 and 19, the detailed description of the structure of a phosphor portion will be omitted.

Further, at least part of a light emitting portion of the vertical type semiconductor light emitting device is hidden by an n-type electrode 252 (refer to FIG. 9), and thus the shape of the first phosphor portion 1080a (refer to FIG. 10) may be relatively thinner in height at the hidden portion. As described above, a display device according to the present disclosure may include a phosphor layer cured by light emitted from the semiconductor light emitting device. Due to the phosphor layer, an expensive exposure device for curing the phosphor layer may not be required, and thus it is economical.

Figure 20:
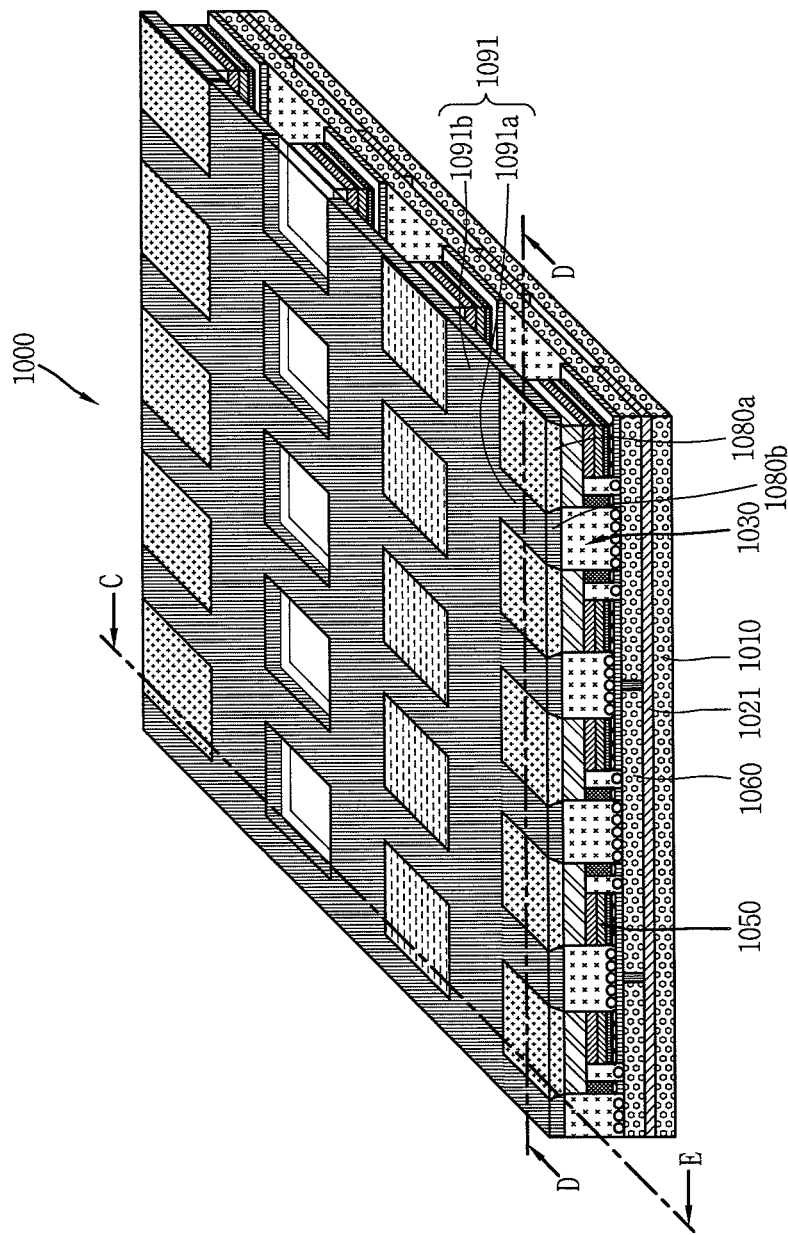
FIG. 20 is an enlarged view of portion "A" in FIG. 1 illustrating still yet another embodiment of the present disclosure.
Figure 21:
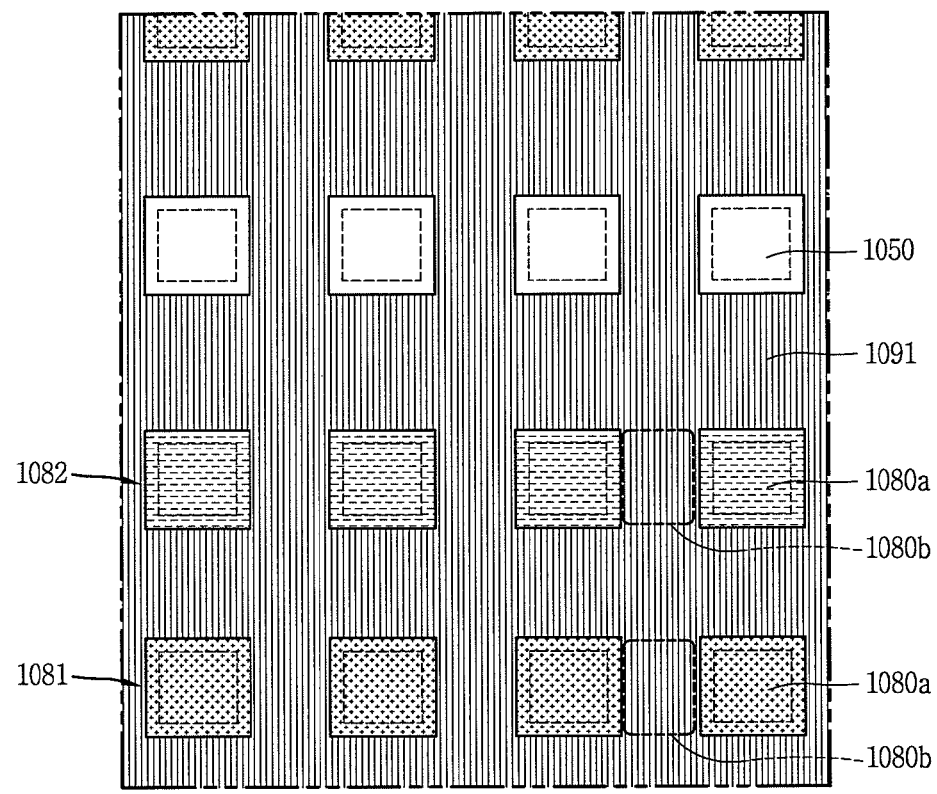
FIG. 21 is a plan view of FIG. 20.
Figure 22A:
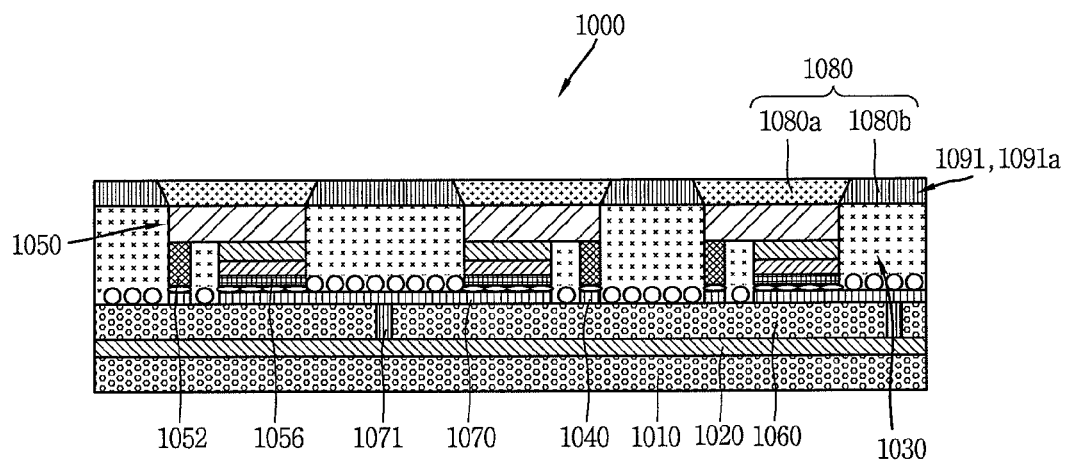
FIG. 22A is a cross-sectional view taken along line D-D in FIG. 20.
Figure 22B:
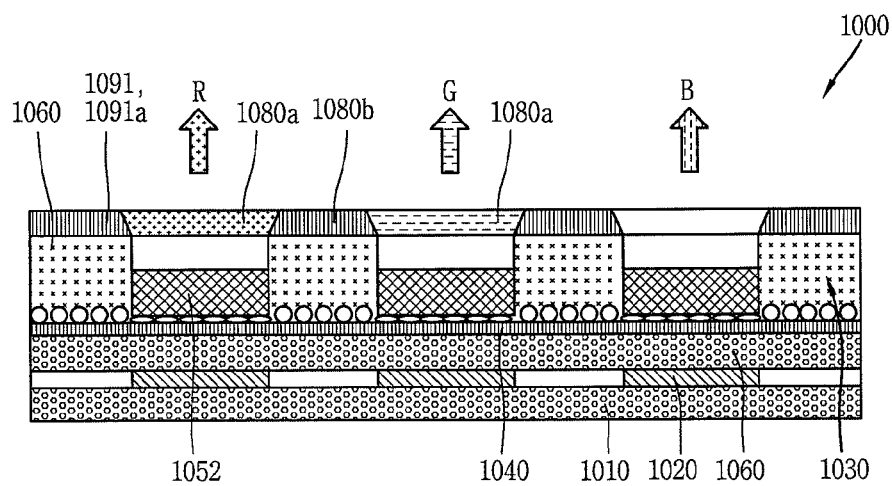
FIG. 22B is a cross-sectional view taken along line E-E in FIG. 20.

Hereinafter, a novel structure of a display device including a phosphor layer formed using light emitted from semiconductor light emitting devices will be described in more detail with reference to the accompanying drawings. In particular, FIG. 20 is an enlarged view of portion "A" in FIG. 1 illustrating still another embodiment of the present disclosure, FIG. 21 is a plan view of FIG. 20, FIG. 22A is a cross-sectional view taken along line D-D in FIG. 20, and FIG. 22B is a cross-sectional view taken along line E-E in FIG. 20.

FIGS. 20, 21, 22A and 22B illustrate a display device 1000 using a passive matrix (PM) type semiconductor light emitting device as the display device 1000 using a semiconductor light emitting device. However, the following illustration may be also applicable to an active matrix (AM) type semiconductor light emitting device. As illustrated in FIG. 2 in the above, the display device 1000 may include a substrate 1010, a first electrode 1020, a conductive adhesive layer 1030, a second electrode 1040 and a plurality of semiconductor light emitting devices 1050. Here, the first electrode 1020 may include a plurality of electrode lines as illustrated in the drawing.

In an embodiment or modified example for each configuration which will be described below, the same of similar reference numerals are applied to the same or similar parts and elements throughout the drawings, and the description thereof will be substituted by the earlier description. The substrate 1010 may be a wiring substrate disposed with a plurality of electrode lines included in the first electrode 1020, and thus the first electrode 1020 may be located on the substrate 1010. Furthermore, the second electrode 1040 is disposed on the substrate 1010. For example, the substrate 1010 may be a wiring substrate having a plurality of layers, and the first electrode 1020 and second electrode 1040 may be formed on a plurality of layers, respectively. In this instance, the wiring substrate may be a substrate in which the substrate 1010 and insulating layer 1060 are integrated with an insulating and flexible material such as polyimide (PI), PET, PEN, or the like in a display device described with reference to FIGS. 3A and 3B.

According to the drawing, the first electrode 1020 and second electrode 1040 are electrically connected to a plurality of semiconductor light emitting devices 1050. In this instance, the first electrode 1020 may be connected to the plurality of semiconductor light emitting devices 1050 through the auxiliary electrode 1070 disposed on the same plane as that of the second electrode. Electrical connection between the first electrode 1020 and second electrode 1040 and the plurality of semiconductor light emitting devices 1050 is performed by the conductive adhesive layer 1030 disposed on one surface of the substrate 1010.

The conductive adhesive layer 1030 may be a layer having adhesiveness and conductivity, and to this end a material having conductivity and a material having adhesiveness may be mixed on the conductive adhesive layer 1030. Furthermore, the conductive adhesive layer 1030 may have flexibility, and through this, it is possible to allow a flexible function in a display device. For example, the conductive adhesive layer 1030 may be a solution containing an anisotropy conductive film (ACF), an anisotropic conductive paste and conductive particles. If the conductive adhesive layer 1030 is formed on the substrate 1010 when the auxiliary electrode 1070 and second electrode 1040 are located thereon, and then the semiconductor light emitting device 1050 is connected thereto in a flip chip type by applying heat and pressure, then the semiconductor light emitting device 1050 is electrically connected to the first electrode 1020 and second electrode 1040.

The emission of the semiconductor light emitting device 1050 is controlled as the first electrode 1020 and second electrode 1040 perform the role of a data electrode and a scan electrode, respectively. In this instance, the plurality of semiconductor light emitting devices 1050 constitutes a light emitting device array along a plurality of electrode lines, respectively, and a phosphor layer (or phosphor portion; hereinafter, referred to as a "phosphor portion", 1080) is formed on the light emitting device array.

The phosphor portions 1080 form a plurality of columns, and the plurality of columns are formed in a bar shape extended along a plurality of electrode lines of the first electrode 1020, respectively. More specifically, the phosphor portions 1080 are disposed in parallel to each other, and include a first and a second phosphor portion containing different phosphor materials.

The phosphor portion 1080 may be located on an outer surface of the semiconductor light emitting device 1050. For example, the semiconductor light emitting device 1050 may be a blue semiconductor light emitting device that emits blue (B) light, and the phosphor portion 1080 may perform a function of converting the blue (B) light into a sub-pixel color. The first phosphor portion may be a red phosphor portion 1081 containing a red phosphor constituting an individual pixel, and the second phosphor portion may be a green phosphor portion 1082 containing a green phosphor.

In other words, the red phosphor portion 1081 containing the red phosphor (or red phosphor material) capable of converting blue light into red (R) light may be deposited on the blue semiconductor light emitting device 1051 at a position constituting a red sub-pixel. Moreover, the green phosphor portion 1082 containing the green phosphor (or red phosphor material) capable of converting blue light into green (G) light may be deposited on the blue semiconductor light emitting device 1051 at a position constituting a green sub-pixel. Furthermore, only the blue semiconductor light emitting device 1051 may be independently used at a portion constituting a blue sub-pixel. In this instance, a transparent region containing a transparent material overlapped with the blue semiconductor light emitting device 1051, respectively, may be formed on one surface of the blue semiconductor light emitting device 1051 constituting the blue sub-pixel. The transparent regions form a plurality of columns, and the plurality of columns are formed in a bar shape extended along a plurality of electrode lines of the first electrode 1020.

Thus, as the phosphor portion 1080 is formed on at least some of the semiconductor light emitting devices 1050, the red (R), green (G) and blue (B) sub-pixels may constitute one pixel. More specifically, a specific color phosphor is deposited along each line of the first electrode 1020, and red or green phosphor may be deposited for each line. Accordingly, one line on the first electrode 1020 may be an electrode for controlling one color. On the contrary, red (R), green (G) and blue (B) may be sequentially disposed along the second electrode 1040, thereby implementing a sub-pixel.

According to the drawing, the phosphor portion 1080 may include phosphor regions 1080a formed on one surface of the blue semiconductor light emitting device 1051 and a separation portion 1080b disposed between the phosphor regions 1080a. The phosphor portion 1080 is formed of a phosphor material in a discontinuous manner, and thus the phosphor regions 1080a are disposed to be separated from each other by interposing the separation portion 1080b therebetween. For example, the red phosphor portion 1081 has a structure in which the phosphor regions 1080a and separation portions 1080b are disposed in an alternately repeated manner along any one of a plurality of electrode lines included in the first electrode. Similarly, the green phosphor portion 1082 may also include the phosphor regions 1080a and separation portions 1080b which are alternately disposed along another one of the plurality of electrode lines included in the first electrode.

Furthermore, the transparent regions are disposed to be separated from each other by interposing the separation portion 1080b therebetween similarly to the phosphor regions 1080a. In other words, a transparent portion including transparent regions alternately disposed along another one of the plurality of electrode lines included in the first electrode and separation portions 1080b substitutes the blue phosphor portion.

Thus, each column of the red phosphor portion 1081 and each column of the green phosphor portion 1082 may include the phosphor regions 1080a and separation portions 1080b, respectively. Hereinafter, for the sake of convenience of explanation, the red phosphor portion 1081 and green phosphor portion 1082 will be commonly described as the phosphor portion 1080 without distinguishing them from each other.

For example, the phosphor regions 1080a are formed to cover one surface of semiconductor light emitting devices, respectively, sequentially disposed along the each column. The separation portion 1080b may be formed on one surface (outer surface) of the conductive adhesive layer 1030a performing the role of a partition wall between a plurality of semiconductor light emitting devices disposed along the same line. Furthermore, the separation portion 1080b may be formed to be brought into contact with the phosphor regions 1080a located at both sides thereof. In this instance, the phosphor regions 1080a may be extended from one surface of semiconductor light emitting devices to cover at least part of the conductive adhesive layer 1030a at the same time.

According to the drawing, the separation portion 1080b disposed between the phosphor regions 1080a may be formed to have a different shape from the phosphor regions 1080a. Thus, the phosphor regions 1080a and separation portion 1080b having different shapes will be described in more detail with reference to the accompanying drawings. First, the phosphor regions 1080a covering semiconductor light emitting devices, respectively, have a shape corresponding to an external appearance of the semiconductor light emitting device 1050 as illustrated in the drawing. As illustrated in the drawing, the phosphor region 1080a covering the semiconductor light emitting device 1050 having a rectangular shape may have a rectangular shape corresponding to the shape of the semiconductor light emitting device 1050. Meanwhile, even when the phosphor region 1080a has a shape corresponding to the semiconductor light emitting device 1050, the cross-sectional areas of the semiconductor light emitting device 1050 and phosphor region 1080a may be different from each other. For example, the cross-sectional area of the phosphor region 1080a may be larger than that of the semiconductor light emitting device 1050 such that an outer surface of the semiconductor light emitting device 1050 is located within the phosphor region.

For example, the phosphor region 1080a may be formed to have a cross-sectional area which is greater than that of the semiconductor light emitting device 1050 to completely cover one surface and an edge of the semiconductor light emitting device 1050. Moreover, the cross-sectional area of the phosphor regions 1080a may vary from one another along a thickness direction of the display device. For example, the cross-sectional area of the phosphor regions 1080a may increase as being away farther from the semiconductor light emitting device 1050.

Thus, when the cross-sectional area of the phosphor regions 1080a varies along a thickness direction of the display device, a boundary surface between the phosphor region 1080a and separation portion 1080b may be configured with an inclined surface having an inclination. Thus, the cross-sectional area of the phosphor regions 1080a varies along a thickness direction of the display device, and as a result, the phosphor regions 1080a are formed such that the amount of being protruded toward the separation portion from the boundary surface varies. For example, as the cross-sectional area of the phosphor regions 1080a increases as being away farther from the semiconductor light emitting device 1050, the phosphor regions 1080a are formed such that the amount of being protruded toward the separation portion as being away farther from the semiconductor light emitting device 1050.

Further, the phosphor regions 1080a may include a phosphor material for converting light emitted from the relevant semiconductor light emitting device 1050a into a specific color, and the formation of the phosphor region may be performed with an ink-jet printing method or conformal coating method. On the contrary, the separation portion 1080b disposed between the phosphor regions 1080a may be a vacant space containing a material having a different characteristic from the phosphor material or containing no material. When the separation portion 1080b is formed with a vacant space, vacant spaces on which the phosphor material is not disposed may be sequentially formed along the length direction of the phosphor portion 1080. In this instance, the phosphor regions 1080a included in the phosphor portion 1080 are discontinuously formed by interposing the separation portion 1080b therebetween. Furthermore, when the separation portion 1080b is formed as a vacant space, the separation portion disposed between the transparent regions may be also formed as a space.

Further, the black matrix 1091 may be disposed on the separation portion 1080b to enhance contrast. Moreover, the black matrix 1091 may be additionally disposed between each line of the phosphor portion 1080 to enhance contrast. In other words, the black matrix 1091 may enhance the contrast of luminance. For example, the black matrix 1091 may include a first black matrix 1091a and a second black matrix 1091b.

The first black matrix 1091a may be a portion disposed between each phosphor region 1090a within the phosphor portion 1080. On the contrary, the second black matrix 1091b may be a portion extended from the first black matrix 1091a and disposed between the red phosphor portion 1081 and green phosphor portion. More specifically, the second black matrix 1091b is extended from the separation portion 1080b to fill out between the red phosphor portion 1081 and green phosphor portion 1082.

Further, the first black matrix 1091a may be also disposed between blue semiconductor light emitting devices constituting blue sub-pixels. For example, when a transparent region containing a transparent material overlapped with the blue semiconductor light emitting device 1051, respectively, is disposed on one surface of the blue semiconductor light emitting device 1051 constituting the blue sub-pixel, the first black matrix 1091a may be located between the transparent regions. In other words, when the black matrix is filled into the separation portion 1080b, the first black matrix 1091a may be also disposed on the separation portion between the transparent regions.

Furthermore, even when a transparent region is not disposed on the blue semiconductor light emitting device, the first black matrix 1091a may be disposed on one surface of the conductive adhesive layer 1030 disposed between the blue semiconductor light emitting device. Moreover, the second black matrix 1091b may be disposed between semiconductor light emitting device arrays formed along a plurality of electrode lines included in the first electrode as well as being located only between the red phosphor portion 1081 and green phosphor portion 1082. Accordingly, a black matrix in a display device according to the present disclosure may be filled into a region excluding the phosphor region and transparent region on one surface formed with the phosphor region and transparent region.

The region excluding the phosphor region and transparent region may have a shape corresponding to a region excluding the region disposed with the semiconductor light emitting devices. Thus, the black matrix may be a region in which light emitted from the semiconductor light emitting device is not transmitted. Therefore, the black matrix is disposed in parallel to the phosphor portions 1080 between the phosphor portions 1080, and at least part thereof is protruded in a direction crossed with the phosphor portions to fill out the separation portion 1080b included in the phosphor portions 1080. Accordingly, the black matrix may include a protruded portion protruded toward the adjoining separation portion 1080b.

Further, the black matrix disposed on the separation portion 1080b may be configured such that the cross-sectional area thereof increases or decreases in one direction. For example, the cross-sectional area of the black matrix disposed on the separation portion 1080b may decrease as being away farther from the conductive adhesive layer 1030. Accordingly, a boundary surface between the phosphor region 1080a and the black matrix may be formed in an inclined manner. Thus, the cross-sectional area of the black matrix included in the separation portion 1080b varies along a thickness direction, and as a result, the black matrix is formed such that the amount of being protruded toward the phosphor region from the boundary surface to the phosphor region varies. For example, as illustrated in the drawing, as the cross-sectional area of the black matrix 1091 decreases as being away farther from the conductive adhesive layer 1030 based on a thickness direction, the black matrix 1091 is formed such that the amount of being protruded toward the phosphor region increases as drawing closer to the conductive adhesive layer 1030.

Further, in the above example, it has been described a formation in which the black matrix (or first black matrix 1091a) has an inclined surface with respect to the adjoining phosphor region, but the present disclosure is not limited to this. For example, according to the present disclosure, a boundary surface between the phosphor region 1080a and black matrix 1091 may be formed to have an inclination along the circumference of the phosphor region 1080a at a portion where the phosphor region 1080a and black matrix 1091 are adjacent to each other. In other words, in this instance, the phosphor region 1080a may have an inclined surface having an inclination at a boundary to the second black matrix 1091b located between each phosphor portion 1080 as well as the first black matrix 1091a located on the separation portion 1080b.

Furthermore, the phosphor portion 1080 may be formed to cover at least part of the black matrix 1091. More specifically, both ends of the black matrix 1091 disposed between the red phosphor portion 1081 and green phosphor portion 1082 are covered by the red phosphor portion 1081 and green phosphor portion 1082, respectively. Moreover, at least part of the black matrix disposed on the separation portion 1080b may be also covered by a phosphor material contained in the phosphor region 1080a. Thus, the height of the phosphor portion 1080 may be configured to be higher than that of the black matrix 1091.

Further, the phosphor portion 1080 including the phosphor region 1080a disposed by interposing the separation portion 1080b therebetween may be formed using light emitted from semiconductor light emitting devices. Hereinafter, a method of forming a phosphor portion including phosphor regions disposed to be separated from each other by interposing the foregoing separation portion therebetween will be described in more detail with reference to the accompanying drawings. FIGS. 23A, 23B, 23C, 24A, 24B, 24C, 24D and 24E are cross-sectional views illustrating a method of fabricating a display device using a semiconductor light emitting device according to the present disclosure.

Figure 23A:
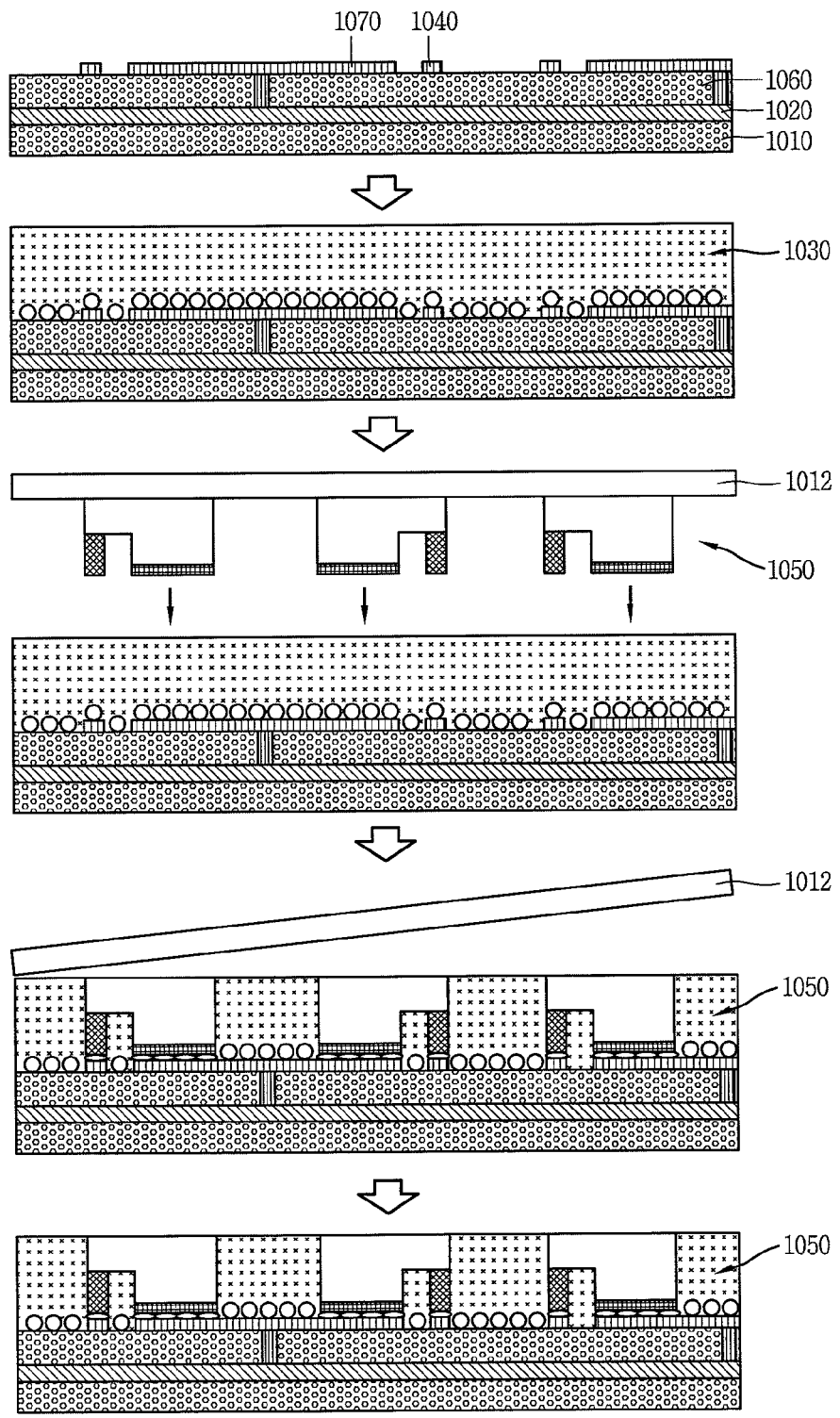
FIGS. 23A through 24E are cross-sectional views illustrating a method of fabricating a display device using a semiconductor light emitting device according to the present disclosure.
Figure 23B:
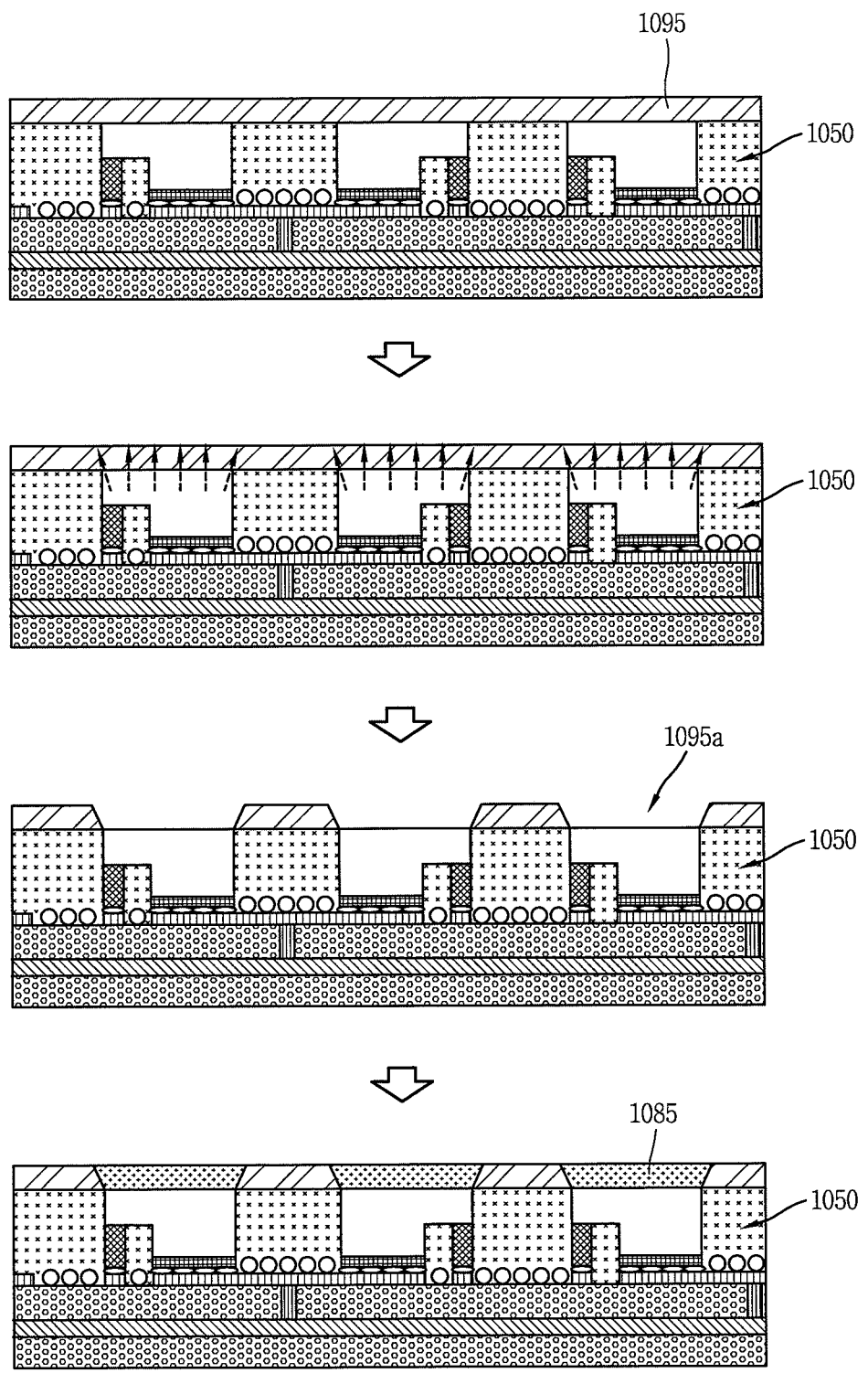
Figure 23C:
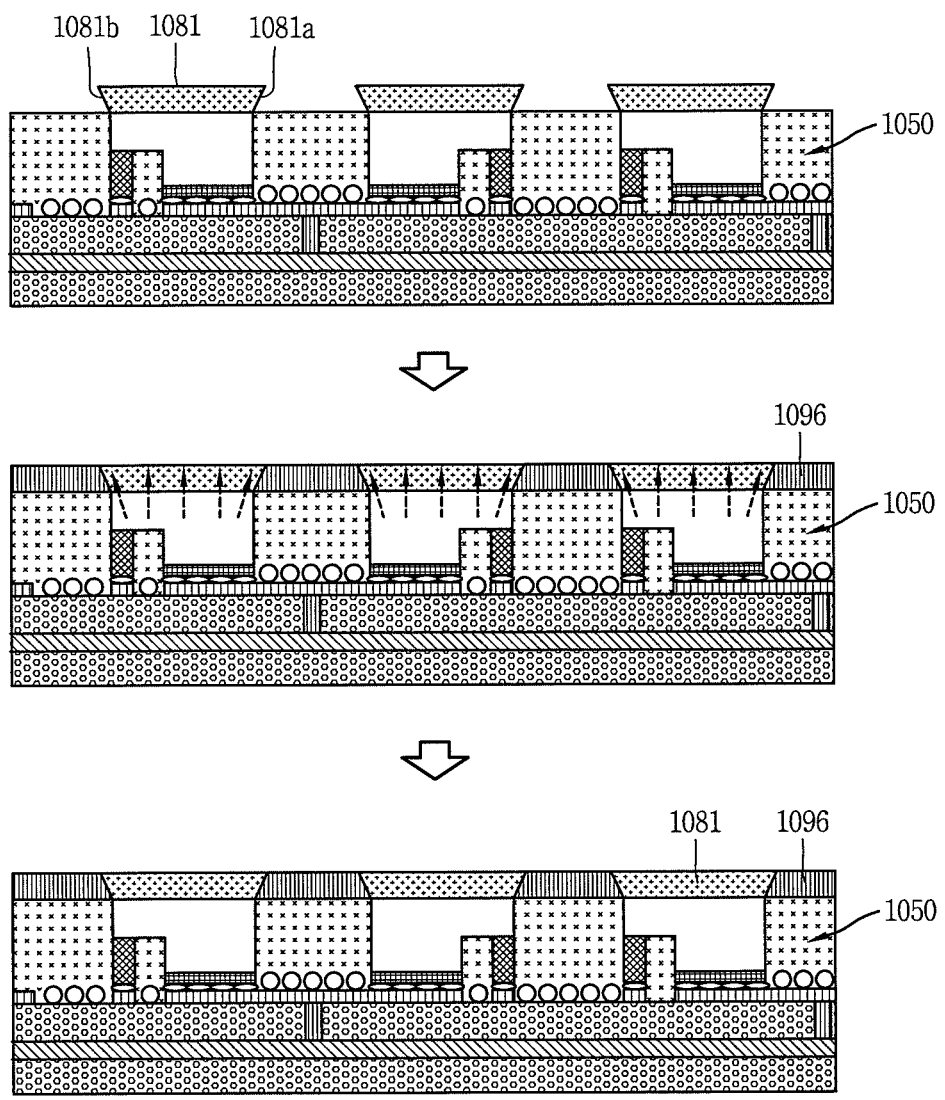

Next, FIGS. 23A, 23B and 23C are views illustrating a method of fabricating a display device using a semiconductor light emitting device according to the present disclosure with reference to cross-sectional views seen from direction D-D in FIG. 20, and FIGS. 24A, 24B, 24C, 24D and 24E are views illustrating a method of fabricating a display device using a semiconductor light emitting device according to the present disclosure with reference to cross-sectional views seen from direction E-E in FIG. 20.

First, referring to FIGS. 23A, 23B and 23C, the conductive adhesive layer 1030 is formed on the insulating layer 1060 located with the auxiliary electrode 1070 and second electrode 1040. The insulating layer 1060 is deposited on the first substrate 1010 to form one substrate (or wiring substrate), and the first electrode 1020, auxiliary electrode 1070 and second electrode 1040 are disposed on the wiring substrate. In this instance, the first electrode 1020 and second electrode 1040 may be disposed in directions perpendicular to each other. Furthermore, the first substrate 1010 and insulating layer 1060 may contain glass or polyimide (PI), respectively, to implement a flexible display device.

The conductive adhesive layer 1030 may be implemented by an anisotropic conductive film, for example, and thus, an anisotropic conductive film may be coated on a substrate located with the insulating layer 1060. Next, a second substrate 1012 located with a plurality of semiconductor light emitting devices 1050 corresponding to the location of the auxiliary electrodes 1070 and second electrodes 1040 and constituting individual pixels is disposed such that the semiconductor light emitting device 1050 faces the auxiliary electrode 1070 and second electrode 1040.

In this instance, the second substrate 1012 as a growth substrate for growing the semiconductor light emitting device 1050 may be a sapphire substrate or silicon substrate. The semiconductor light emitting device may have a gap and size capable of implementing a display device when formed in the unit of wafer, and thus effectively used for a display device.

Next, the wiring substrate is thermally compressed to the second substrate 1012. For example, the wiring substrate and second substrate 1012 may be thermally compressed to each other by applying an ACF press head. The wiring substrate and second substrate 1012 are bonded to each other using the thermal compression. Only a portion between the semiconductor light emitting device 1050 and the auxiliary electrode 1070 and second electrode 1040 may have conductivity due to the characteristics of an anisotropic conductive film having conductivity by thermal compression, thereby allowing the electrodes and semiconductor light emitting device 1050 to be electrically connected to each other. At this time, the semiconductor light emitting device 1050 may be inserted into the anisotropic conductive film, thereby forming a partition wall between the semiconductor light emitting devices 1050.

Next, the second substrate 1012 is removed. For example, the second substrate 1012 may be removed using a laser lift-off (LLO) or chemical lift-off (CLO) method. Finally, the second substrate 1012 is removed to expose the semiconductor light emitting devices 1050 to the outside. Silicon oxide (SiOx) or the like may be coated on the wiring substrate coupled to the semiconductor light emitting device 1050 to form a transparent insulating layer.

Next, referring to FIG. 23B, the process of coating a photoresist 1095 on the conductive adhesive layer 1030 coupled to the semiconductor light emitting device 1050 is performed. A positive photoresist responsive to a specific color light emitting wavelength may be used for the photoresist. For example, when the light emitting wavelength of the semiconductor light emitting device 1050 is a blue light emitting wavelength, the photoresist may be configured with a positive photoresist responsive to a blue light emitting wavelength. Here, the photoresist as a kind of photosensitive resistance material causes a chemical or physical change due to light. A positive photoresist has a characteristic of being developed during the exposure. In other words, a positive photoresist responsive to a blue light emitting wavelength is formed of a material that performs development most effectively at a blue light emitting wavelength.

Thus, subsequent to coating the photoresist 1095 on the conductive adhesive layer 1030 coupled to the semiconductor light emitting device 1050, the process of forming the phosphor portion 1080 to implement a red or green sub-pixel color using the blue semiconductor light emitting device 1050 is performed. During the process of forming the phosphor portion 1080, the red phosphor portion 1081 and green phosphor portion 1082 are sequentially formed. Meanwhile, the sequence of forming the red phosphor portion 1081 and green phosphor portion 1082 may be changed. In other words, it is performed in a sequence of first forming either one of the red phosphor portion 1081 and green phosphor portion 1082, and then forming the other one. According to the drawing, a case where a red phosphor is first formed will be described as an example.

As described above, semiconductor light emitting devices disposed at a position constituting a red sub-pixel among semiconductor light emitting devices disposed in a plurality of columns along an electrode line of the first electrode 1020 when the photoresist 1095 is coated thereon are illuminated. Thus, when semiconductor light emitting devices 1050 disposed at a position constituting a red sub-pixel are illuminated, a portion coated on one surface of the semiconductor light emitting devices 1050 disposed at a position constituting the red sub-pixel is developed. Since the photoresist 1095 is partially developed by light emitted from the semiconductor light emitting devices 1050, grooves 1095a may be formed on the photoresist 1095 due to the partial development. In this instance, the shape of the grooves may be determined according to a light emission range of the emitted light. Here, light emitted from the semiconductor light emitting device 1050 has a light emission range with a specific area, and the light emission range may be expanded along a thickness direction of the photoresist. It is because light emitted from the semiconductor light emitting device 1050 transmits through the photoresist 1095 while being dispersed. In this instance, the light emission range of the emitted light may correspond to an external appearance of the semiconductor light emitting device 1050.

As described above, subsequent to the photoresist 1095 being developed by the illumination of the semiconductor light emitting devices 1050 disposed at a position constituting a red sub-pixel, the red phosphor 1085 is coated. The coating of the phosphor may be performed with an ink-jet printing method or conformal coating method. More specifically, the red phosphor 1085 may fill out the grooves 1095a created on the photoresist 1095 to form the red phosphor portion 1081. Thus, the red phosphor portion 1081 is created by filling out the grooves, and may include the phosphor region 1080a that covers one surface of semiconductor light emitting devices constituting a red sub-pixel. The shape of phosphor region 1080a may correspond to the shape of the groove by filling out the grooves 1095a. Meanwhile, the shape of the grooves 1095a may be determined based on the property of light emitted from the semiconductor light emitting device as well as the light emission range of the foregoing light. Here, the property of light may be at least one of a light emission time, a light emission intensity, a light emission area and a light emission range of the emitted light.

For example, an area of the phosphor region 1080a may be enlarged as increasing the light emission range (or light emission area) of the semiconductor light emitting device. Further, according to the drawing, it is illustrated that the shape of the grooves 1095a and the shape of the phosphor region 1080a are horizontally symmetric, but the present disclosure is not limited to this. According to the present disclosure, the shape of the grooves 1095a and the shape of the phosphor region 1080a may be determined in dependence on the property of light emitted from semiconductor light emitting devices, the shape of the grooves 1095a and the shape of the phosphor region 1080a may be implemented in various shapes according to the light emitting control or shape design of the semiconductor light emitting device.

Thus, the shape of the grooves 1095a and the shape of the phosphor region 1080a may be implemented in various shaped based on light emitted from the semiconductor light emitting device. As an example, an angle made by an inclined surface formed along an edge of the grooves 1095a and phosphor region 1080a and the insulating layer 1060 may be determined based on a distance (the extent of closeness) between the light emitting portion (or light emitting surface 1053) of the semiconductor light emitting device and the inclined surface. The light emitting portion is a region corresponding to a portion of substantially emitting light from semiconductor light emitting device, including a region in which the p-type electrode 156 (hereinafter, refer to FIG. 4) or p-type semiconductor layer 155 of the semiconductor light emitting device is located. Accordingly, a portion of substantially emitting light is smaller than the entire area of the semiconductor light emitting device, and has a center point eccentrically located from the center point of the semiconductor light emitting device.

In this instance, the extent of inclination of one inclined surface 1081a located closer to the light emitting portion 1053 among a plurality of inclined surfaces 1081a, 1081b of the red phosphor portion 1081 (based on an inclination made by the conductive adhesive layer 1030) may be smoother than that of the other inclined surface 1081b. It is because the photoresist can be well developed as drawing closer to light emitting portion 1053. Thus, the shape of the grooves 1095a and the shape of the phosphor region 1080a may be asymmetric due to a degree of photoresist being developed.

Figure 24A:
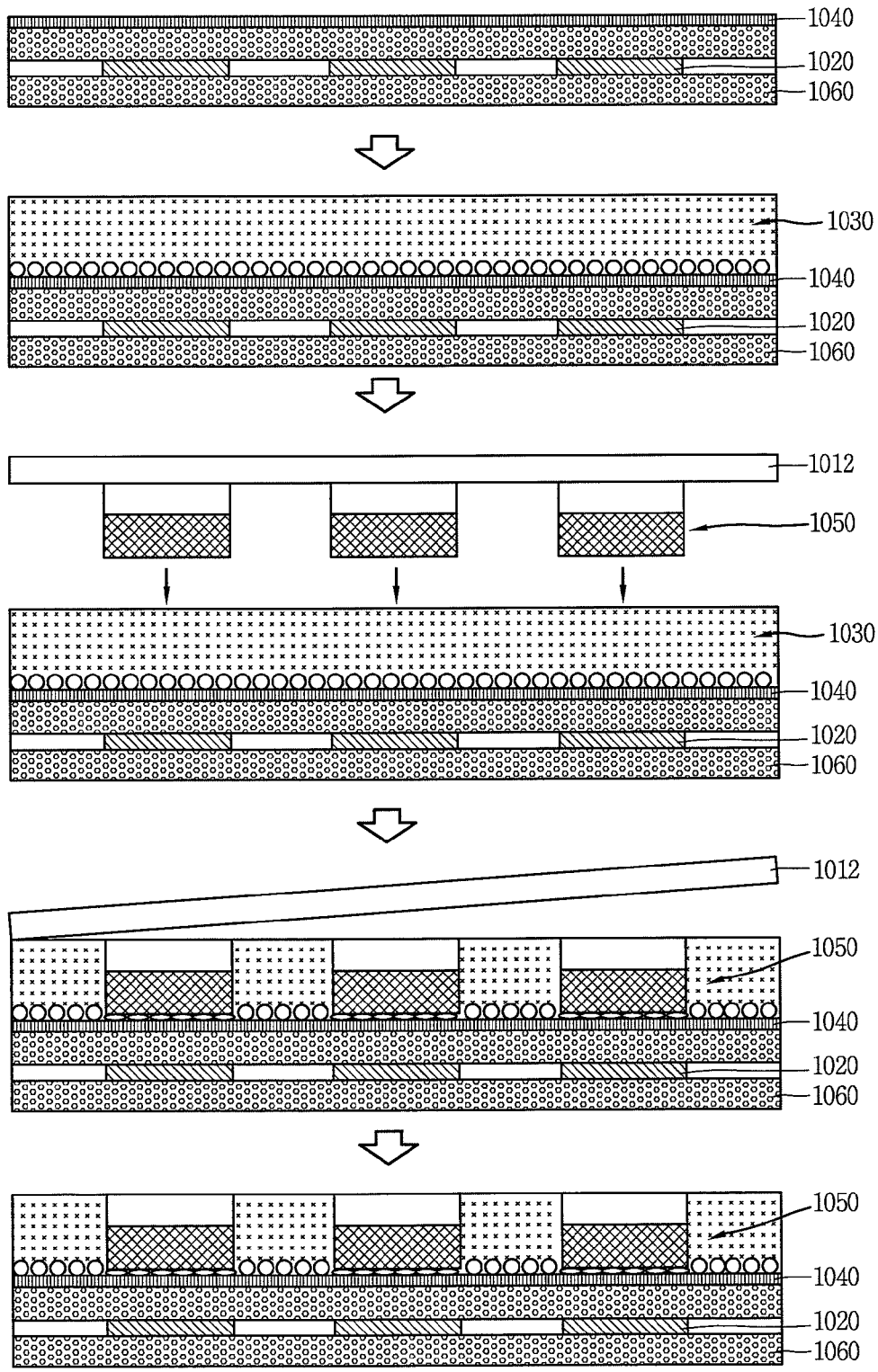
Figure 24B:
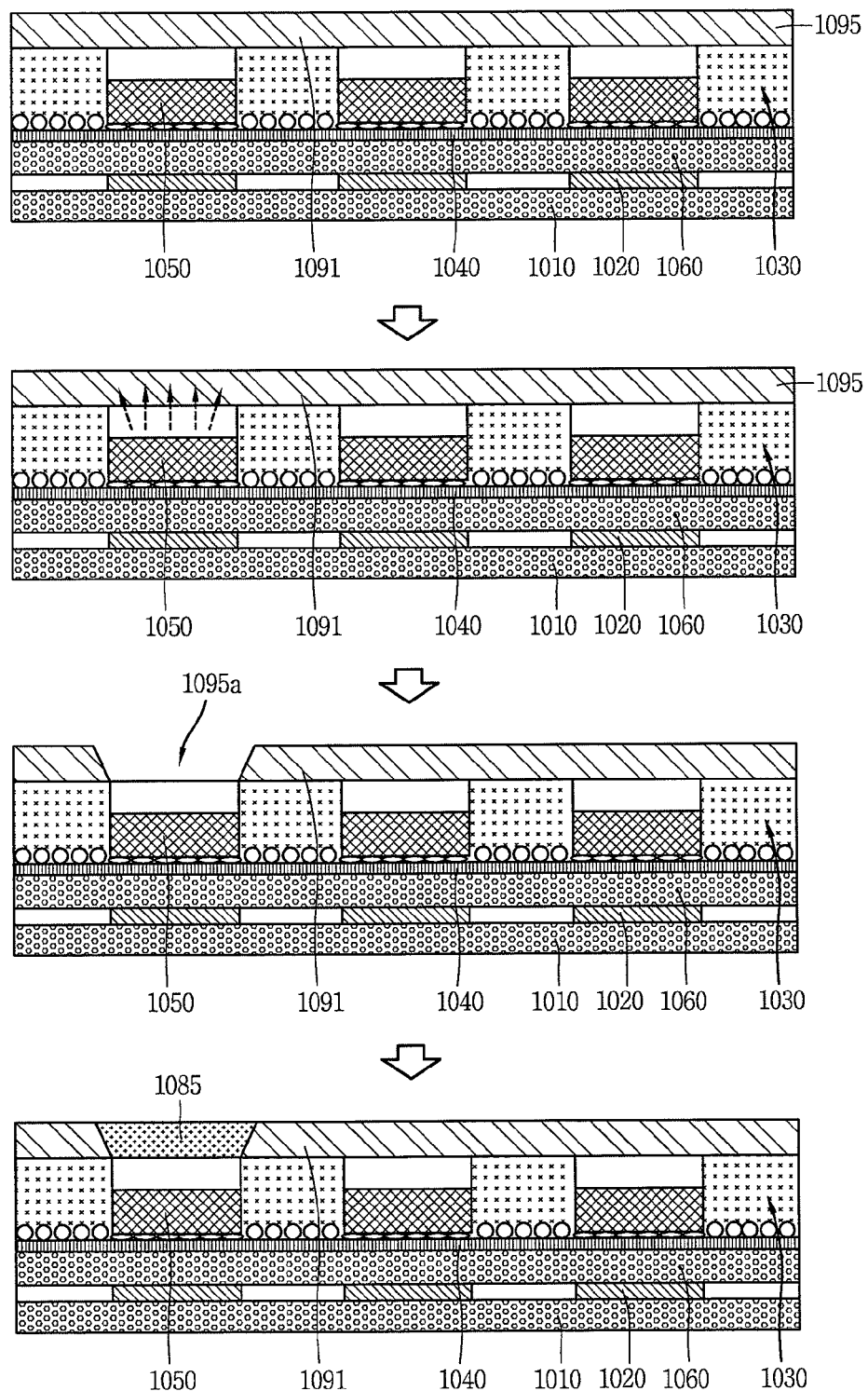
Figure 24C:
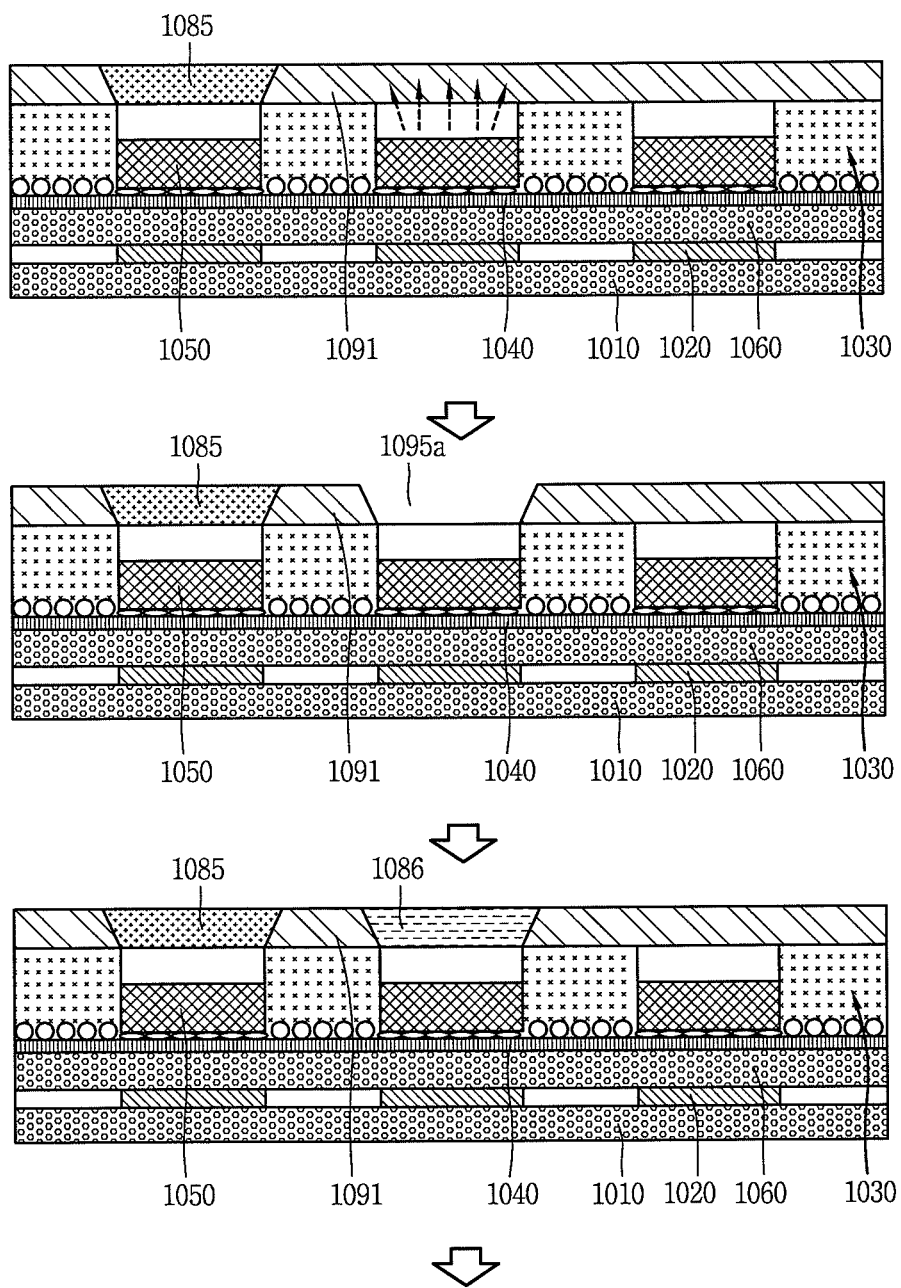

Next, when the coating of the red phosphor is completed (refer to FIGS. 24A and 24B), the semiconductor light emitting device constituting the red sub-pixel is turned off, and an electrode line arranged with semiconductor light emitting devices constituting green sub-pixels is controlled as illustrated in FIG. 24C. In other words, the semiconductor light emitting device constituting the green sub-pixel is illuminated to develop the photoresist 1095 covering one surface of the semiconductor light emitting device constituting the green sub-pixel. Then, a green phosphor is coated on a groove formed by the development of the photoresist 1095.

Figure 24D:
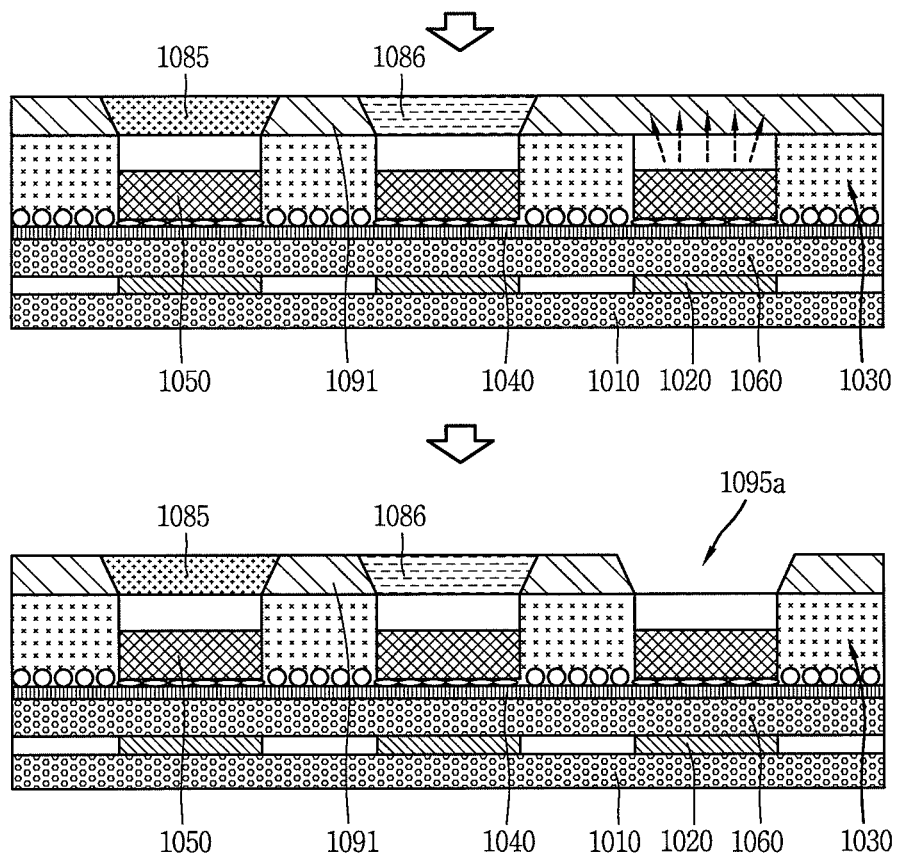

Next, when the coating of the green phosphor is completed (refer to FIGS. 24A, 24B and 24C), the semiconductor light emitting device constituting the green sub-pixel is turned off, and the semiconductor light emitting device constituting a blue sub-pixel is illuminated as illustrated in FIG. 24D. Through this, a portion covering one surface of the semiconductor light emitting device constituting the blue sub-pixel is developed. Then, a transparent material is coated on a groove formed by the development of the photoresist 1095 to form a transparent region. Meanwhile, the process of forming a transparent region on a semiconductor light emitting device constituting the foregoing blue sub-pixel will be omitted in a fabrication method of the present disclosure.

Figure 24E:
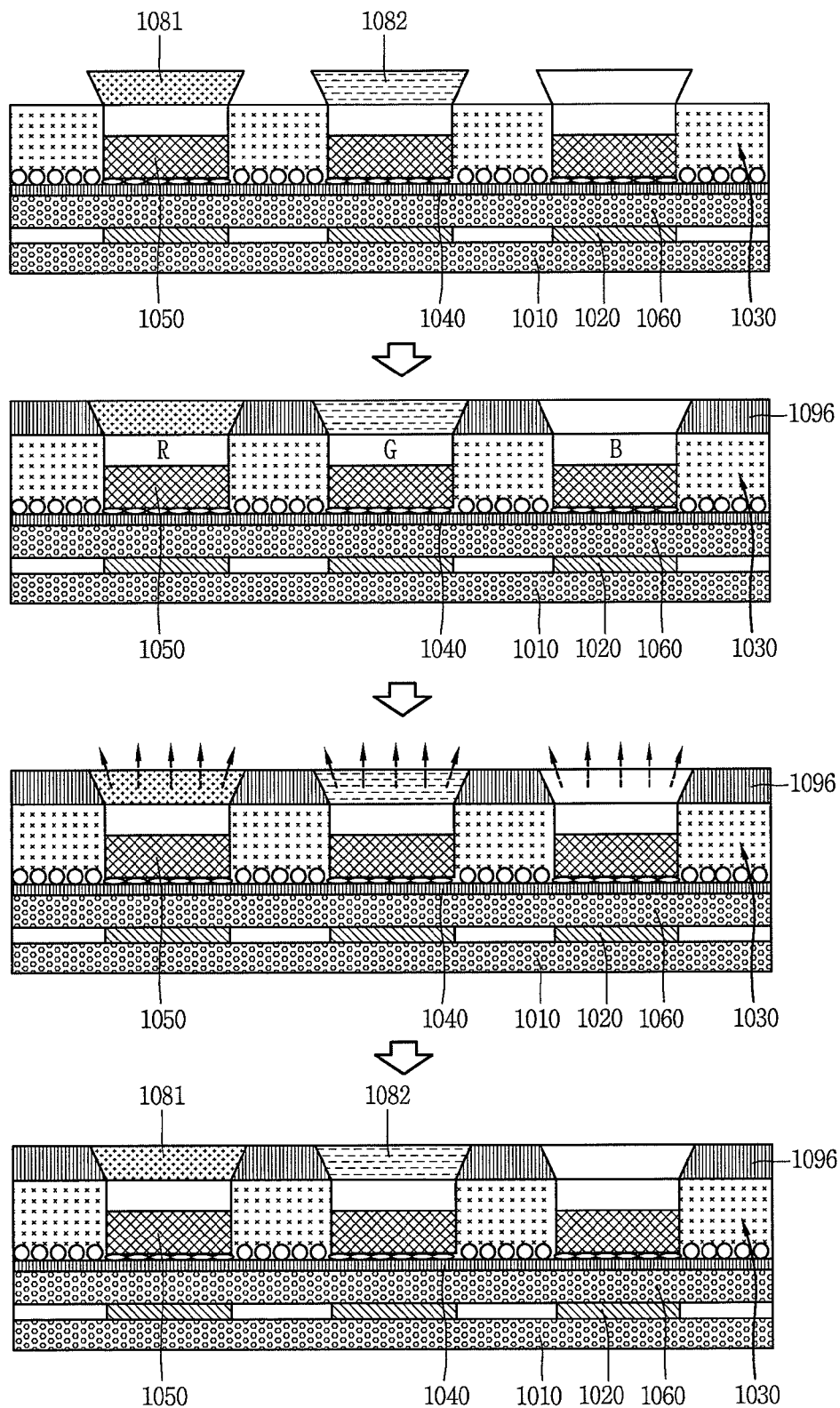

Next, when the coating of a phosphor and the coating of a time-sequential method are completed, the process of removing the photoresist is performed as illustrated in FIG. 24E. Subsequent to removing the photoresist, a black photoresist 1096 is coated on the conductive adhesive layer 1030 coupled to the semiconductor light emitting device. In this instance, the black photoresist 1096 may be coated on both (a first portion) between each line of the phosphor portion and (a second portion) between each phosphor region separated from each other.

Then, all the semiconductor light emitting devices constituting red, green and blue sub-pixels, respectively, are illuminated when the black photoresist 1096 is coated thereon to develop the black photoresist 1096 covering one surface of semiconductor light emitting devices constituting red, green and blue sub-pixels, respectively. Subsequent to developing the black photoresist 1096, the black photoresist 1096 is thermally treated. Through this, a black matrix 1091 formed of the black photoresist 1096 is formed. As the black photoresist 1096 fills out both the first portion and the second portion, the black matrix 1091 may include a first black matrix 1091a and a second black matrix 1091b (refer to FIG. 20).

Further, in the above embodiment, a photoresist is coated once, and then semiconductor light emitting devices constituting red, green and blue sub-pixels are sequentially illuminated and turned off to form a phosphor portion. According to the above embodiment, the process of removing a photoresist coated thereon using external light is not required. In other words, the semiconductor light emitting device corresponding to each sub-pixel color is illuminated to develop the relevant photoresist.

Furthermore, various color phosphors may be coated thereon only through the process of illuminating a semiconductor light emitting device and coating a different phosphor. Accordingly, according to the present disclosure, the process of removing and re-coating a photoresist is not performed prior to coating any one color phosphor and then coating another color phosphor.

Further, differently from the foregoing example, the process of coating any one color phosphor and then removing a photoresist coated thereon, and re-coating the photoresist, and then coating another color phosphor can be repeated. For example, as illustrated in FIGS. 23B and 24B, when the coating of a red phosphor is completed, the photoresist 1095 coated on the conductive adhesive layer 1030 coupled to the semiconductor light emitting devices may be removed, thereby finally completing the formation of the red phosphor portion 1081. In this instance, though not shown in the drawing, the process of re-coating the photoresist 1095 to form the green phosphor portion 1082 or the like may be performed. Meanwhile, the process of disposing a transparent region on semiconductor light emitting devices arranged at a location constituting a blur sub-pixel may be also performed similarly to the foregoing process. In other words, the formation of the green phosphor portion 1082 and transparent region may be performed similarly to the above process only when the red phosphor is substituted by another phosphor or transparent material. Accordingly, a method of forming the green phosphor portion 1082 or the like may be performed by repeating the foregoing processes with reference to FIG. 23B, and thus the description thereof will be omitted.

According to a method of fabricating a display device according to the present disclosure as described above, a phosphor and black matrix pattern may be formed through self-exposure using the light emitting wavelength of the semiconductor light emitting devices. Accordingly, the fabrication and alignment of an external pattern mask in pattern formation for color implementation are not required, thereby allowing accurate pattern implementation. Accordingly, it is possible to increase the phosphor pattern formation yield as well as reducing the process cost and process time.

According to the foregoing fabrication method, a method of forming a phosphor portion using exposure through semiconductor light emitting devices and forming a black matrix has been described. However, according to the present disclosure, in addition to the foregoing method, it is possible to form a black matrix using exposure through semiconductor light emitting devices, and then form a phosphor. Hereinafter, a method of forming a black matrix and phosphor portion will be described in more detail with reference to the accompanying drawings. FIGS. 25A, 25B, 25C and 25D are cross-sectional views illustrating a method of fabricating a display device using a semiconductor light emitting device according to another embodiment of the present disclosure.

Figure 25A:
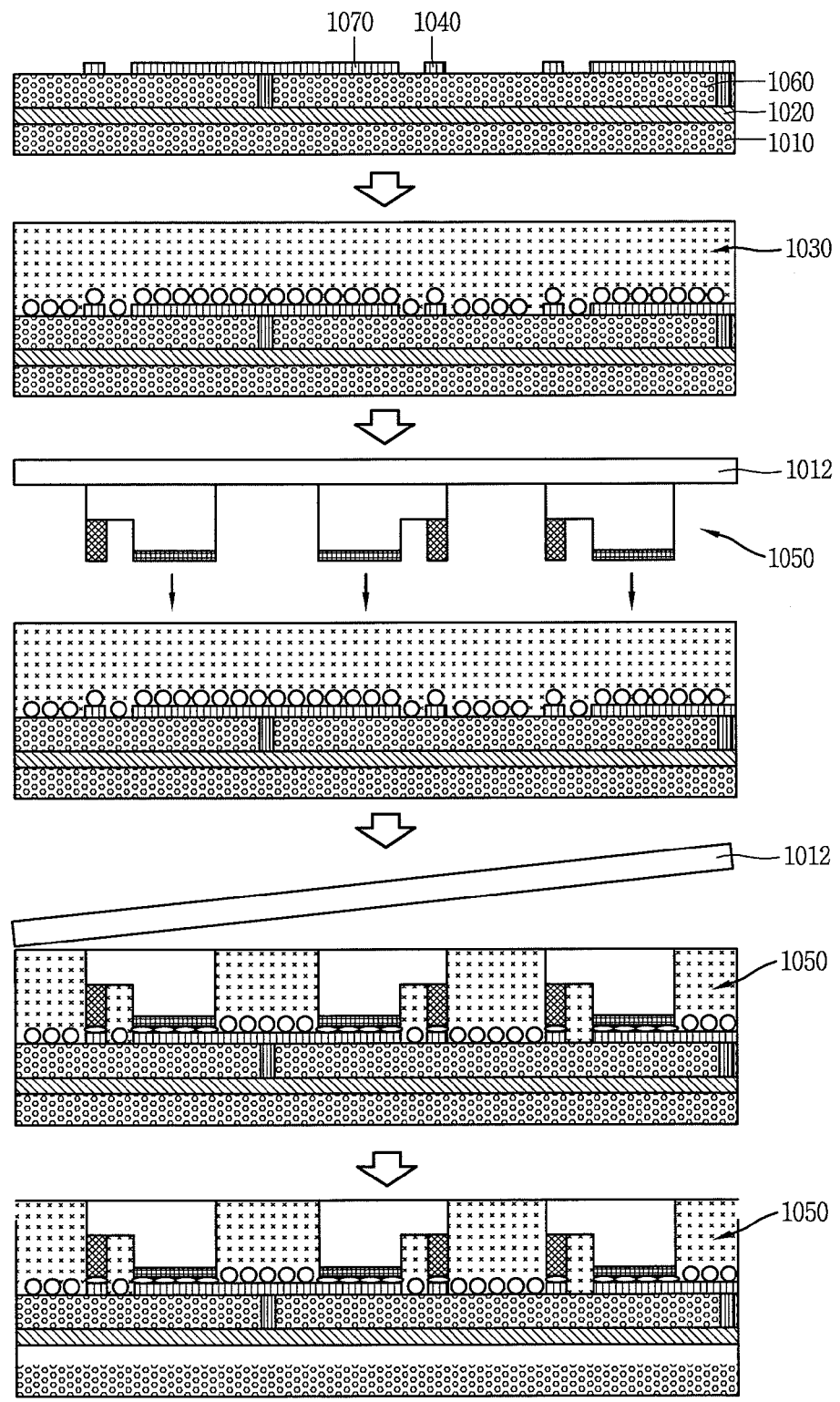
FIGS. 25A through 25D are cross-sectional views illustrating a method of fabricating a display device using a semiconductor light emitting device according to another embodiment of the present disclosure.

First, as illustrated in FIG. 25A, the process of coupling the semiconductor light emitting device 1050 to the conductive adhesive layer 1030 is the same or similar to the fabrication process illustrated above in FIG. 23A, and thus the detailed description thereof will be substituted by the earlier description of FIG. 23A.

Figure 25B:
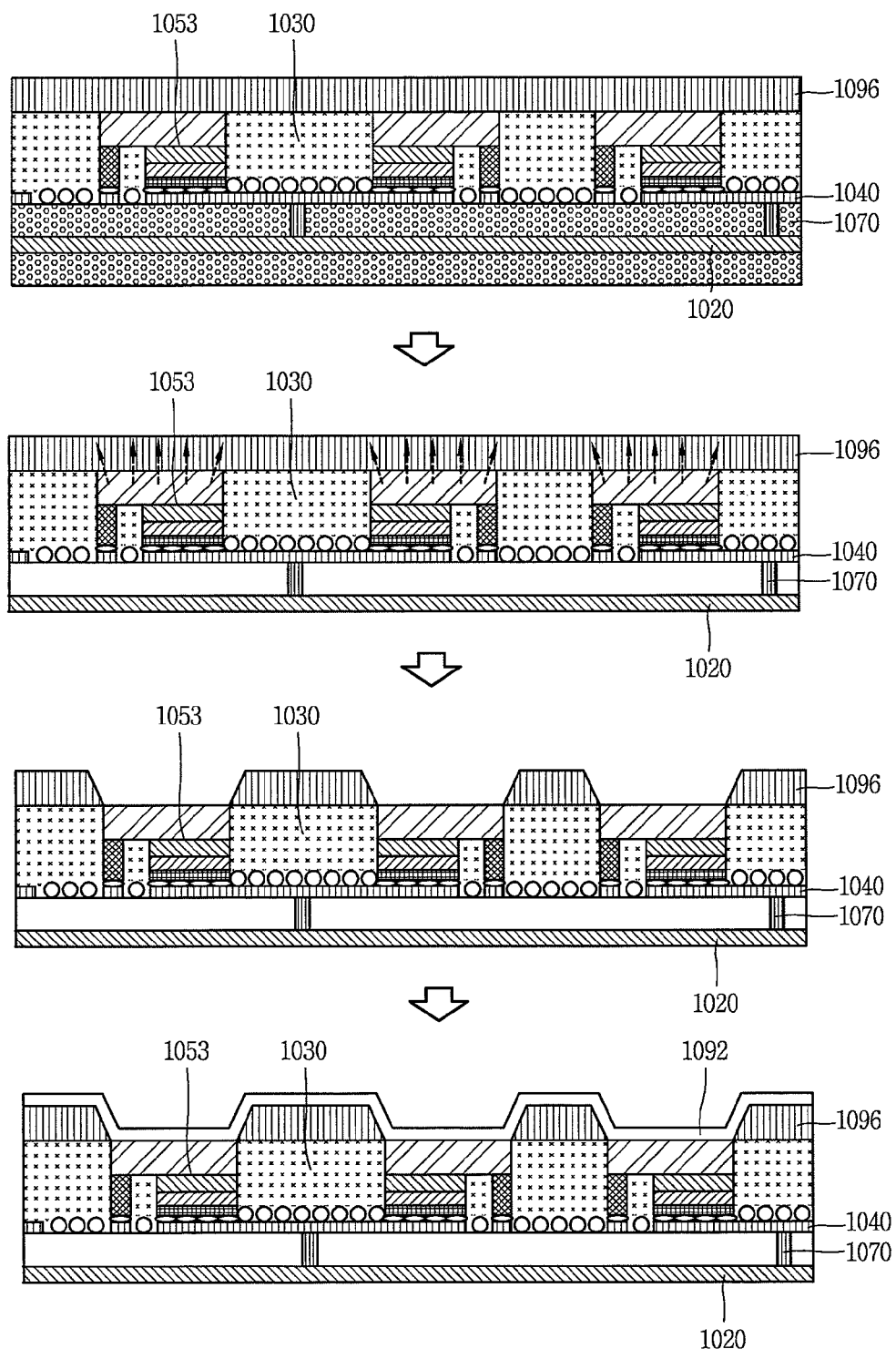

If the process of coupling the semiconductor light emitting device to the conductive adhesive layer 1030 is completed, then the process of coating the black photoresist 1096 to the conductive adhesive layer 1030 coupled to the semiconductor light emitting device 1050 is performed as illustrated in FIG. 25B. Here, a positive photoresist responsive to a specific color light emitting wavelength may be used for the black photoresist 1096. For example, when the light emitting wavelength of the semiconductor light emitting device 1050 is a blue light emitting wavelength, the photoresist may be configured with a positive photoresist responsive to a blue light emitting wavelength. Here, the photoresist as a kind of photosensitive resistance material causes a chemical or physical change due to light. When a positive photoresist, it has a characteristic of being developed during the exposure. In other words, a positive photoresist responsive to a blue light emitting wavelength is formed of a material that performs development most effectively at a blue light emitting wavelength.

Next, the blue semiconductor light emitting devices 1050 corresponding to all red, green and blue regions are illuminated to allow self-exposure only to the light emitting regions. For such an example, all semiconductor light emitting devices controlled to implement colors or images in a display device can be illuminated. Thus, when all the semiconductor light emitting devices 1050 are illuminated, a portion coated on one surface of the semiconductor light emitting devices 1050 is developed on the black photoresist 1096. Since the black photoresist 1096 is partially developed by light emitted from the semiconductor light emitting devices 1050, and grooves may be formed on the black photoresist 1096 due to the partial development. The black photoresist 1096 is converted into a black matrix through thermal treatment subsequent to development. For such a fabrication method, the black matrix may include a material capable of being developed by light emitted from the semiconductor light emitting device.

A black matrix is deposited on one surface of the conductive adhesive layer due to the development and thermal treatment, and a plurality of groove are sequentially arranged on the black matrix in column and row directions. Next, a transparent protective layer is coated on a conductive adhesive layer to cover the black matrix. Contrary to the foregoing illustration, a transparent protective layer exists due to the coating of the transparent protective layer according to the present illustration (refer to the finished product in FIG. 25D).

In this instance, the black matrix and the transparent protective layer 1092 are overlapped with each other in a thickness direction of the display device. Furthermore, the transparent protective layer 1092 may be extended from between the phosphor portion and the at least some of the semiconductor light emitting devices to between the black matrix and phosphor portion. More specifically, the transparent protective layer 1092 is coated on an entire surface of the conductive adhesive layer, and though this, the transparent protective layer 1092 is deposited on the side wall or bottom surface of the plurality of grooves as well as the black matrix.

More specifically, the transparent protective layer 1092 is formed to cover both the black matrix and the plurality of semiconductor light emitting devices having the height difference therebetween. Furthermore, the transparent protective layer 1092 may be extended from between the phosphor portion and the at least some of the semiconductor light emitting devices to between the black matrix and the phosphor portion. The transparent protective layer 1092 may be formed because it is coated and deposited on the black matrix and the plurality of semiconductor light emitting devices as a whole.

In this instance, the black matrix may be disposed on one surface of the conductive adhesive layer, and the semiconductor light emitting device may be inserted into the conductive adhesive layer to be disposed to have a height difference from the black matrix 1096. According to such a configuration, the transparent protective layer 1092 is formed on one surface of the conductive adhesive layer in a rugged shape so the protruded portion covers the black photoresist 1096 and the recessed portion covers one surface of the semiconductor light emitting device.

Figure 25C:
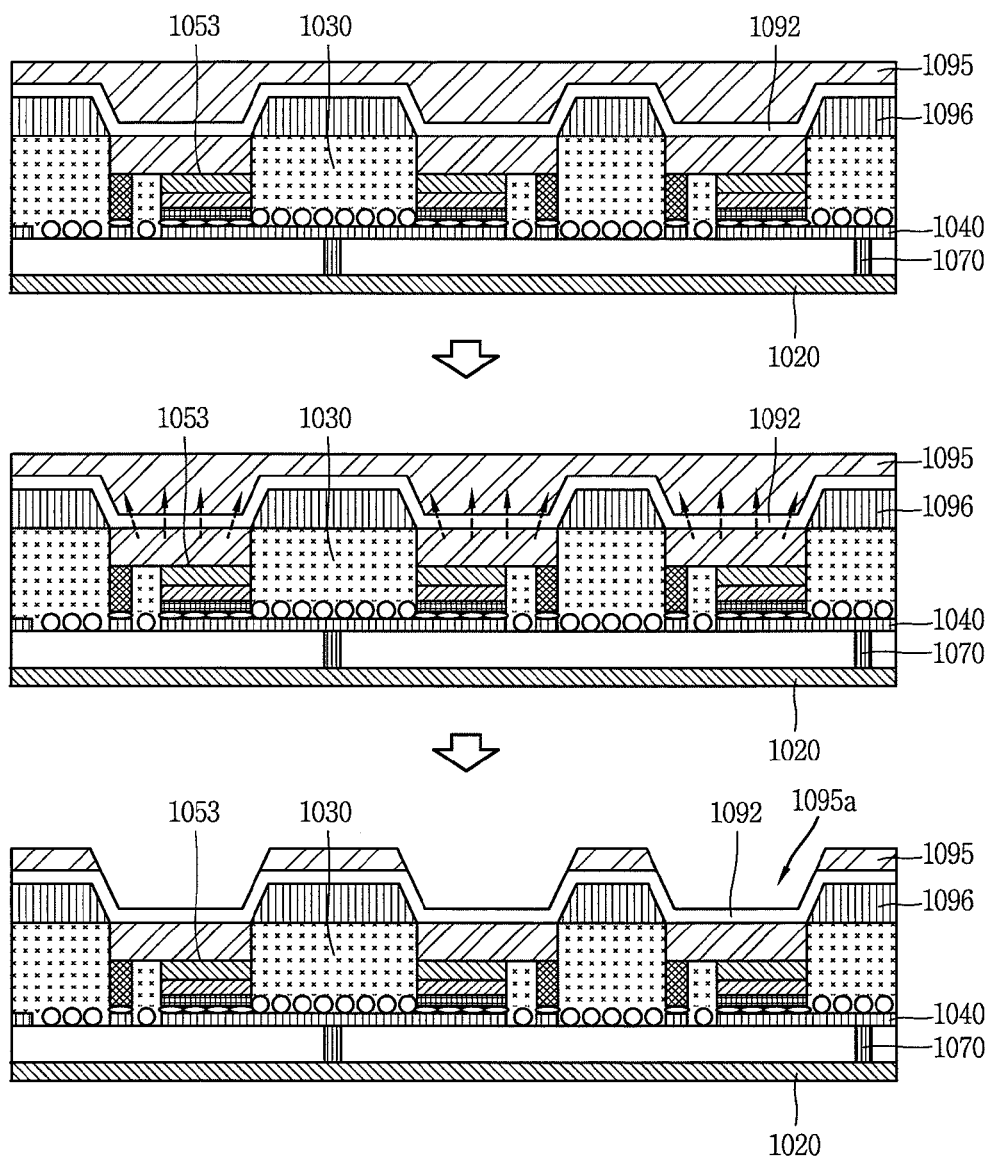

Referring to FIG. 25C, the process of depositing the transparent protective layer 1092 on the black photoresist 1096 and then coating a photoresist on the conductive adhesive layer 1030 again is performed. A positive photoresist responsive to a specific color light emitting wavelength may be used for the black photoresist 1096. For example, when the light emitting wavelength of the semiconductor light emitting device 1050 is a blue light emitting wavelength, the photoresist may be configured with a positive photoresist responsive to a blue light emitting wavelength. Here, the photoresist as a kind of photosensitive resistance material causes a chemical or physical change due to light. When a positive photoresist, it has a characteristic of being developed during the exposure. In other words, a positive photoresist responsive to a blue light emitting wavelength is formed of a material that performs development most effectively at a blue light emitting wavelength.

Figure 25D:
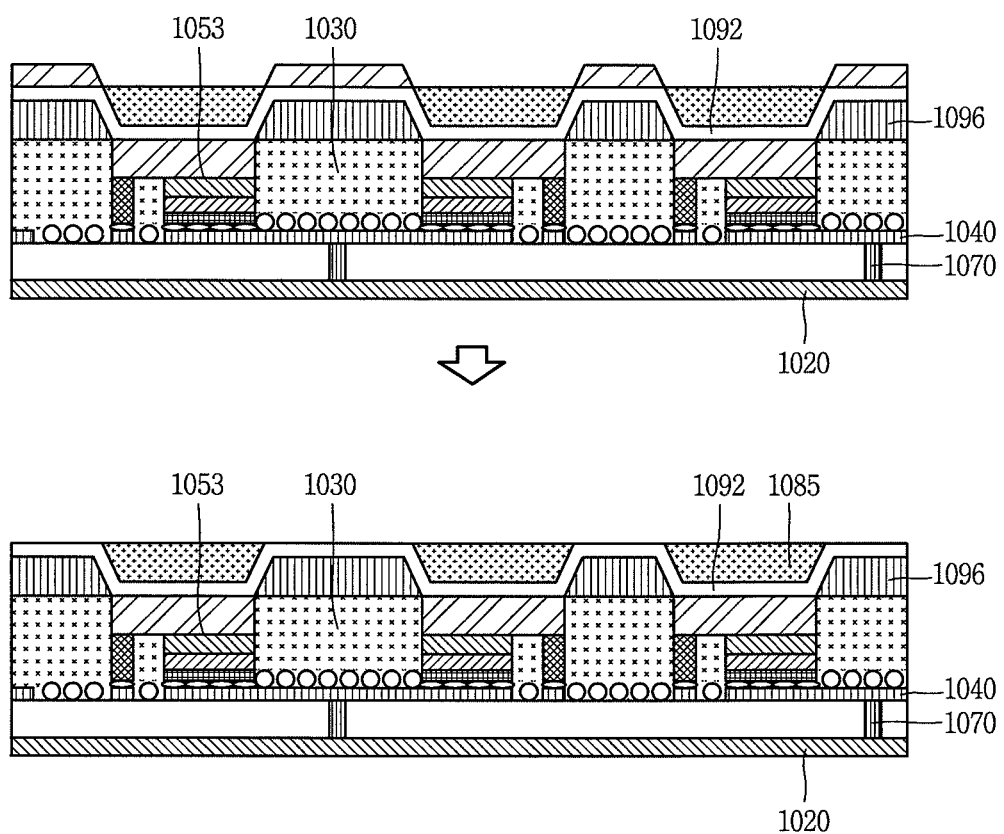

Thus, subsequent to coating a photoresist on the conductive adhesive layer 1030 coupled to the semiconductor light emitting device 1050, the process of forming a phosphor portion to implement red and green sub-pixel colors using the blue semiconductor light emitting device 1050 is performed as illustrated in FIGS. 25C and 25D. Hereinafter, the foregoing method described with reference to FIGS. 23B, 23C, 24B and 24C will be applicable to the process of forming the phosphor portion, and the description thereof will be substituted by the earlier description. Moreover, the process of forming a transparent region on the semiconductor light emitting device constituting a blue sub-pixel may be also applicable to the present illustration, and the description thereof will be substituted by the earlier description.

A method of fabricating a display device having the blue semiconductor light emitting device 1050 has been described in FIGS. 23A through 25D. Thus, in order to implement a sub-pixel in a display device having a blue semiconductor light emitting device, at least part of light emitted from the blue semiconductor light emitting device should be converted into red and green. Thus, as described above, a method of forming a phosphor portion or black matrix using exposure through a blue semiconductor light emitting device has been described. Meanwhile, a display device according to the present disclosure may be implemented using a white semiconductor light emitting device (W) or ultraviolet light emitting device (UV) in addition to the blue semiconductor light emitting device.

Even when a display device is implemented through the white semiconductor light emitting device (W) or ultraviolet light emitting device (UV), the phosphor portion or black matrix may be formed using exposure through the semiconductor light emitting device. In order to form a phosphor portion or black matrix in a display device implemented through the white semiconductor light emitting device (W), a photoresist performing development most effectively in an ultraviolet region is used. Thus, the type of photoresist used for the white semiconductor light emitting device (W) or ultraviolet light emitting device (UV) is different, but the process of fabricating the phosphor portion or black matrix is the same, and thus the white semiconductor light emitting device (W) will be described below as an example.

Figure 26A:
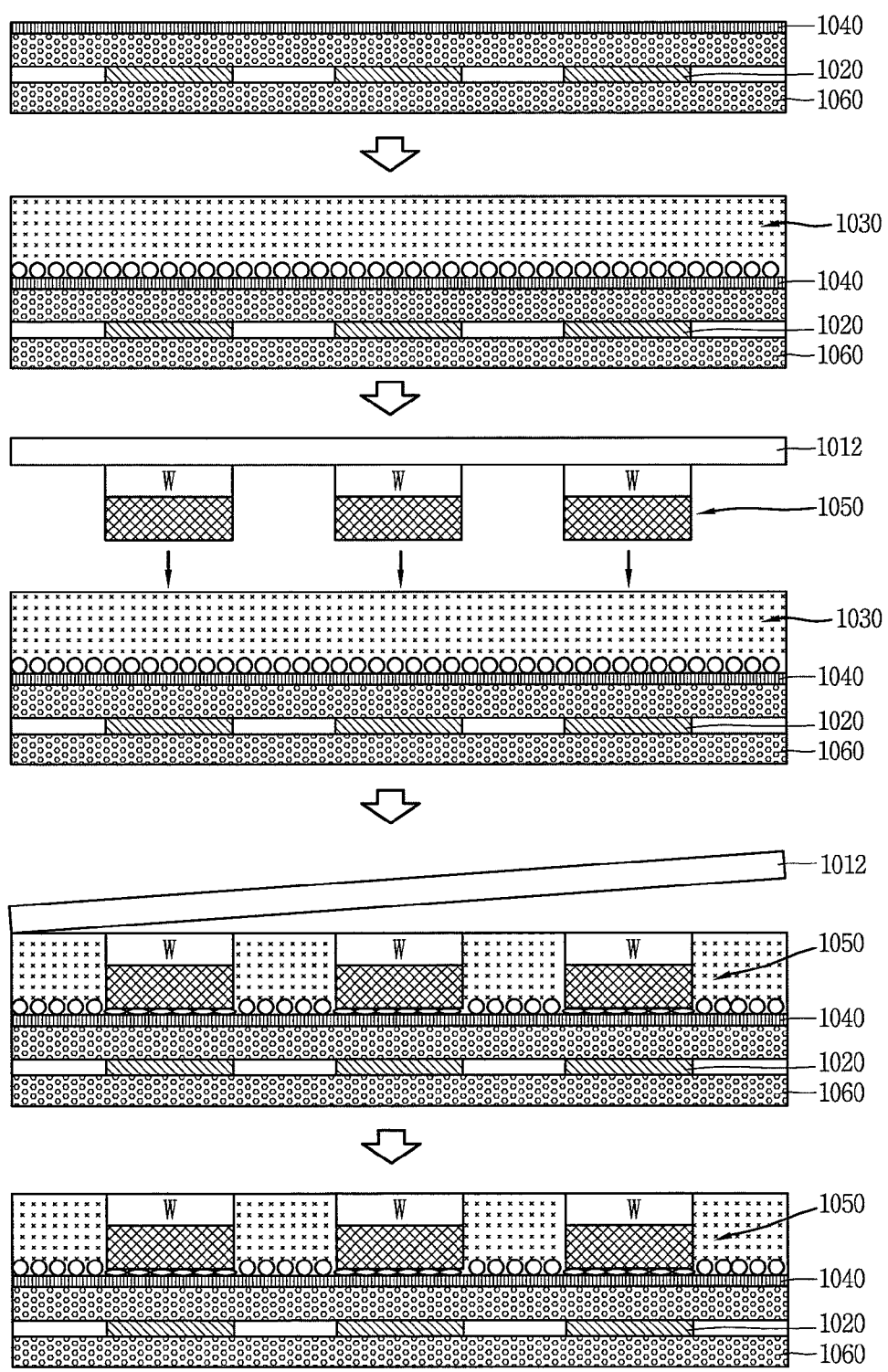
FIGS. 26A, 26B and 26C are cross-sectional views illustrating a method of fabricating a display device using a semiconductor light emitting device according to still another embodiment of the present disclosure.

First, as illustrated in FIG. 26A, the process of coupling the white semiconductor light emitting device (W) to the conductive adhesive layer 1030 is the same or similar to the foregoing fabrication process described above in FIG. 23A, and thus the detailed description thereof will be substituted by the earlier description in FIG. 23A. As illustrated in the drawing, if the process of coupling the white semiconductor light emitting device (W) to the conductive adhesive layer 1030 is completed, then the process of forming a phosphor portion or black matrix is performed.

Figure 26B:
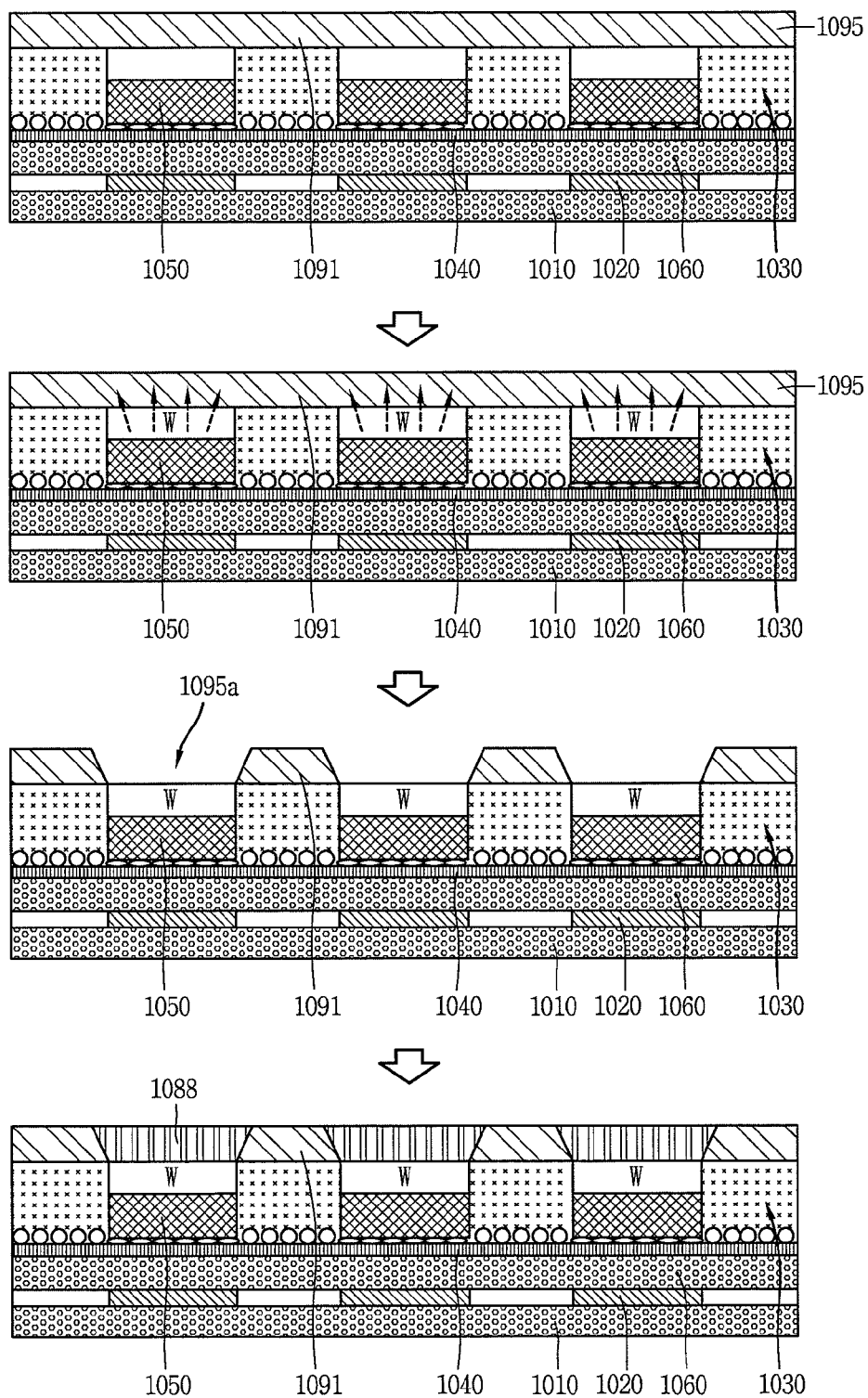
Figure 26C:
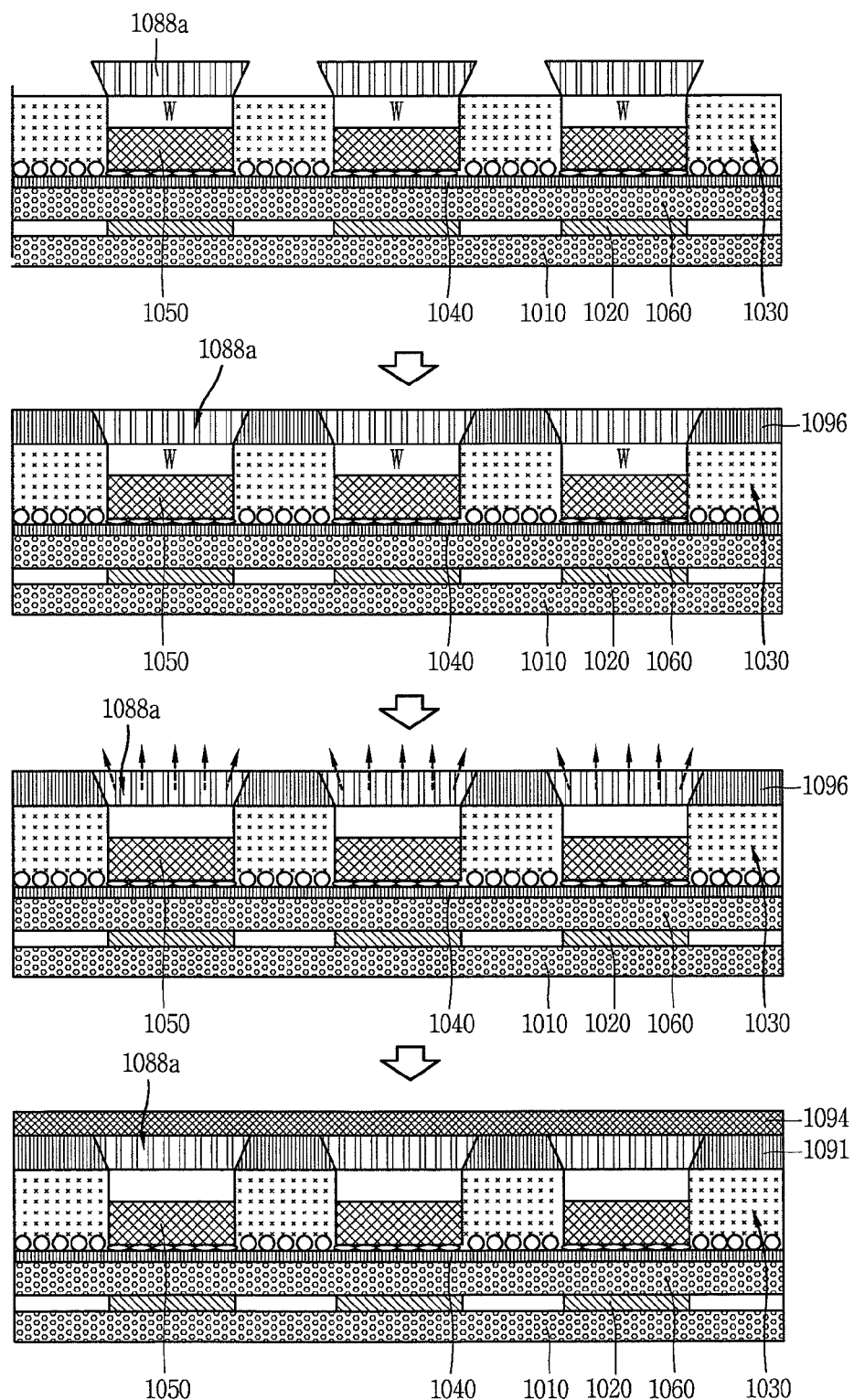

As illustrated in FIG. 26B, the process of coating the photoresist 1095 on the conductive adhesive layer 1030 coupled to the white semiconductor light emitting device (W) is performed. Here, a positive photoresist responsive to a specific color light emitting wavelength may be used for the black photoresist 1096. For example, when the light emitting wavelength of the white semiconductor light emitting device (W) is a white light emitting wavelength, the photoresist may be configured with a positive photoresist responsive to a white light emitting wavelength. Here, the photoresist as a kind of photosensitive resistance material causes a chemical or physical change due to light. When a positive photoresist, it has a characteristic of being developed during the exposure.

As described above, subsequent to coating the photoresist 1095 on the conductive adhesive layer 1030 coupled to the white semiconductor light emitting device (W), the process of forming the phosphor portion 1080 is performed. All the white semiconductor light emitting devices (W) are illuminated during the process of forming the phosphor portion 1080. Thus, when the white semiconductor light emitting devices (W) are illuminated, a portion coated on one surface of the white semiconductor light emitting devices (W), respectively, is developed on the photoresist 1095. Since the photoresist 1095 is partially developed by light emitted from the white semiconductor light emitting device (W), grooves 1095a may be formed on the photoresist 1095 due to the partial development. In this instance, the shape of the grooves may be determined according to a light emission range of the emitted light. Here, light emitted from the white semiconductor light emitting device (W) has a light emission range with a specific area, and the light emission range may be expanded along a thickness direction of the photoresist. It is because light emitted from the white semiconductor light emitting device (W) transmits through the photoresist 1095 while being dispersed. In this instance, the light emission range of the emitted light may correspond to an external appearance of the white semiconductor light emitting device (W).

As described above, subsequent to the photoresist 1095 being developed by the illumination of the white semiconductor light emitting device (W), a white phosphor 1088 is coated. The coating of the phosphor may be performed with an ink-jet printing method or conformal coating method. More specifically, the white phosphor 1088 may fill out the grooves 1095a created on the photoresist 1095 to form the white phosphor portion 1088a. Thus, the white phosphor portion 1088a is created by filling out the grooves, and may include the phosphor region 1080a that covers one surface of the white semiconductor light emitting devices (W). The shape of phosphor region 1080a may correspond to the shape of the groove by filling out the grooves 1095a. Meanwhile, the shape of the grooves 1095a may be determined based on the property of light emitted from the semiconductor light emitting device as well as the light emission range of the foregoing light. Here, the property of light may be at least one of a light emission time, a light emission intensity, a light emission area and a light emission range of the emitted light.

For example, an area of the phosphor region 1080a may be enlarged as increasing the light emission range (or light emission area) of the white semiconductor light emitting device (W). Further, according to the drawing, it is illustrated that the shape of the grooves 1095a and the shape of the phosphor region 1080a are horizontally symmetric, but the present disclosure is not limited to this. According to the present disclosure, the shape of the grooves 1095a and the shape of the phosphor region 1080a may be determined in dependence on the property of light emitted from the white semiconductor light emitting device (W), the shape of the grooves 1095a and the shape of the phosphor region 1080a may be implemented in various shapes according to the light emitting control or shape design of the white semiconductor light emitting device (W).

Thus, the shape of the grooves 1095a and the shape of the phosphor region 1080a may be implemented in various shaped based on light emitted from the white semiconductor light emitting device (W). As an example, an angle made by an inclined surface formed along an edge of the grooves 1095a and phosphor region 1080a and the insulating layer 1060 may be determined based on a distance (the extent of closeness) between the light emitting portion (or light emitting surface 1053) of the white semiconductor light emitting device (W) and the inclined surface. The light emitting portion is a region corresponding to a portion of substantially emitting light from the white semiconductor light emitting device (W), including a region in which the p-type electrode 156 (hereinafter, refer to FIG. 4) or p-type semiconductor layer 155 of the white semiconductor light emitting device (W) is located. Accordingly, a portion of substantially emitting light is smaller than the entire area of the white semiconductor light emitting device (W), and has a center point eccentrically located from the center point of the semiconductor light emitting device.

In this instance, the extent of inclination of one inclined surface 1081a located closer to the light emitting portion 1053 among a plurality of inclined surfaces 1081a, 1081b of the red phosphor portion 1081 (based on an inclination made by the conductive adhesive layer 1030) may be smoother than that of the other inclined surface 1081b. It is because the photoresist can be well developed as drawing closer to light emitting portion 1053. Thus, the shape of the grooves 1095a and the shape of the phosphor region 1080a may be asymmetric due to a degree of photoresist being developed.

Next, when the coating of a white phosphor is completed, the process of removing the photoresist 1095 is performed. Subsequent to removing the photoresist 1095, the process of forming a photoresist may be performed. Thus, the process of coating the black photoresist 1096 on the conductive adhesive layer 1030 coupled to the white semiconductor light emitting device (W) from which the photoresist 1095 is removed is performed.

Then, all the white semiconductor light emitting devices (W) are illuminated when the black photoresist 1096 is coated thereon to develop the black photoresist 1096 covering one surface of the white semiconductor light emitting devices (W). Subsequent to developing the black photoresist 1096, the black photoresist 1096 is thermally treated. Through this, a black matrix 1091 formed of the black photoresist 1096 is formed. As the black photoresist 1096 is formed all regions excluding a region coated with a white phosphor material, the black matrix 1091 may include a first black matrix 1091a and a second black matrix 1091b (refer to FIG. 20).

Further, when the formation of the black matrix 1091 is completed, the process of depositing a color filter in which red, green and blue are repeated on the white light emitting device (W) to implement a sub-pixel is performed. Furthermore, according to a display device using a white light emitting device (W), it is possible to form a black matrix through exposure using the semiconductor light emitting device, and then forming a phosphor portion as illustrated in FIGS. 25A, 25B, 25C and 25D. The detailed description thereof is similar to the description of FIGS. 25A, 25B, 25C and 25D, and thus the description of forming a black matrix and then forming a phosphor portion will be omitted.

Figure 27:
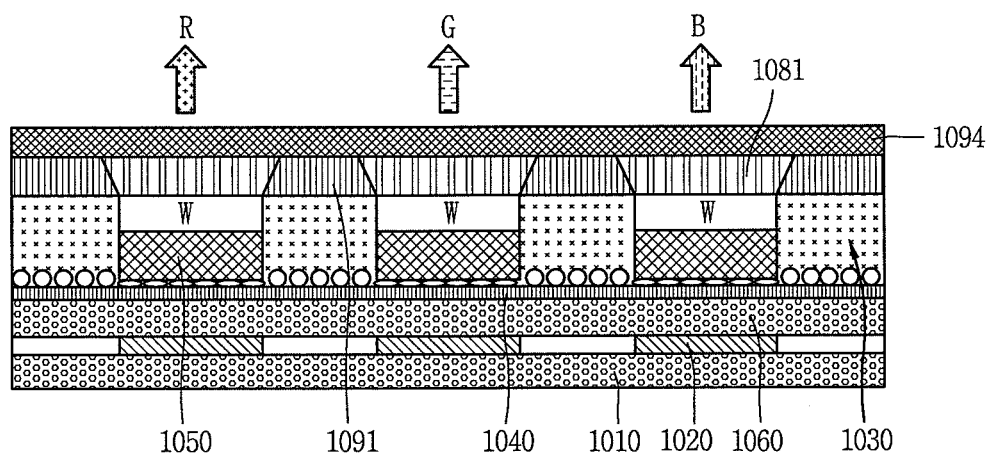
FIGS. 27 and 28 are conceptual views illustrating various forms of implementing colors in association with a flip chip type semiconductor light emitting device to which the present disclosure is applied.
Figure 28:
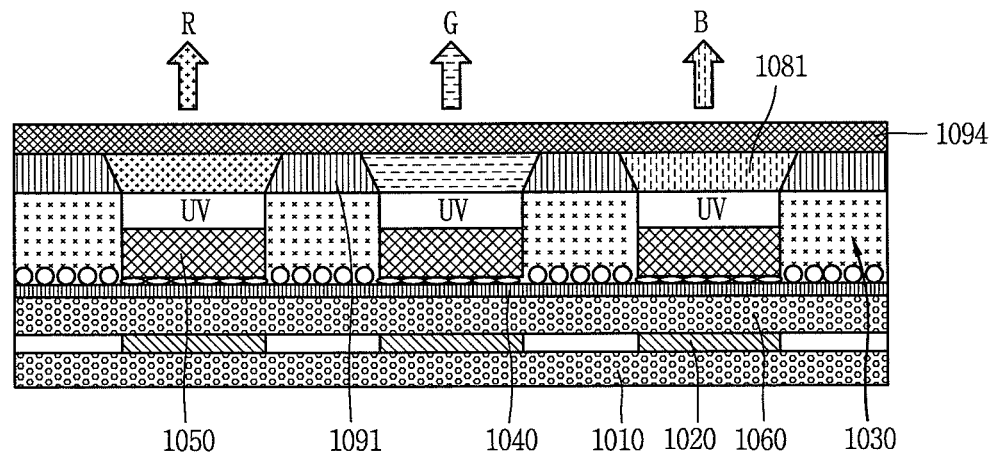

Further, according to the foregoing fabrication process, a display device including a white or ultraviolet semiconductor light emitting device may have a structure as illustrated in FIGS. 27 and 28. According to a display device including a white or ultraviolet semiconductor light emitting device, a color filter 1088 may be further deposited contrary to the earlier examples. Furthermore, the structure of the phosphor portion 1080 having a shape illustrated in the drawing is similar to that of the phosphor portion 1080 illustrated with reference to FIGS. 20, 21, 22A and 22B, and thus the detailed description thereof will be omitted.

Figure 29:
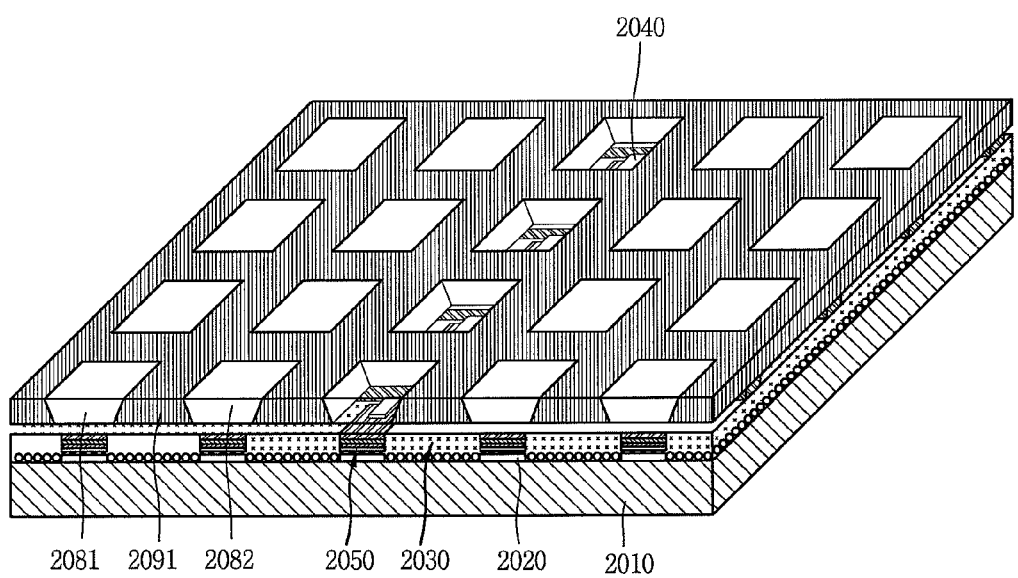
FIG. 29 is an enlarged view of portion "A" in FIG. 1 illustrating still yet another embodiment of the present disclosure.
Figure 30:
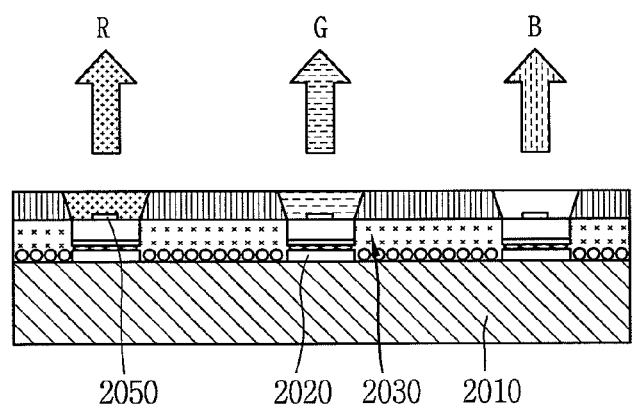
FIG. 30 is a cross-sectional view taken along line F-F in FIG. 29.

FIG. 29 is an enlarged view of portion "A" in FIG. 1 illustrating still yet another embodiment of the present disclosure, and FIG. 30 is a cross-sectional view taken along line F-F in FIG. 29. Furthermore, the structure of a display device as described above may be also applicable to a vertical type semiconductor light emitting device. Hereinafter, the vertical type will be described with reference to FIGS. 29 and 30.

Referring to the drawings, the display device may be a display device using a passive matrix (PM) mode vertical type semiconductor light emitting device. The display device 2000 may include a substrate 2010, a conductive adhesive layer 1630, and a plurality of semiconductor light emitting devices 2050. Hereinafter, the description of the present illustration for the same or similar configuration to that of the illustration disclosed in FIGS. 7 through 9 will be substituted by the earlier description. Moreover, a display device including a vertical type semiconductor light emitting device according to FIGS. 29 and 30 may be provided with a phosphor portion described with reference to a horizontal type semiconductor light emitting device. Accordingly, in the description of a display device including a vertical type semiconductor light emitting device according to FIGS. 29 and 30, the detailed description of the structure of a phosphor portion will be omitted.

According to a method of fabricating a display device according to the present disclosure as described above, a phosphor and black matrix pattern may be formed through self-exposure using the light emitting wavelength of the semiconductor light emitting devices. Accordingly, the fabrication and alignment of an external pattern mask in pattern formation for color implementation are not required, thereby allowing accurate pattern implementation. Accordingly, it is possible to increase the phosphor pattern formation yield as well as reducing the process cost and process time.

According to the present disclosure, a phosphor material may be cured by self-exposure using light emitted from a semiconductor light emitting device, thereby forming a phosphor layer having a high-definition pattern. Moreover, according to the present disclosure, the semiconductor light emitting device may be used as an exposure light source, and thus an external mask operation or alignment process required for exposure is not performed and an expensive device is not required, and therefore it is economical.

Furthermore, according to the present disclosure, it is possible to suppress mis-alignment that can occur when using an external mask and external light source for the formation of a phosphor pattern. Furthermore, according to the present disclosure, the semiconductor light emitting device may be partially emitted, and thus exposure can be individually performed at a portion where the exposure is further required.

Furthermore, according to the present disclosure, a phosphor and BM may be formed using self-exposure using a semiconductor light emitting device to allow accurate pattern implementation with a process in which the fabrication and alignment of an external pattern mask in pattern formation for color implementation are not required, thereby increasing the phosphor pattern formation yield as well as reducing the process cost and process time. Furthermore, according to the present disclosure, the semiconductor light emitting device may be partially emitted, and thus exposure can be individually performed at a portion where the exposure is further required.

What is claimed is:

1. A display device, comprising:
   a wiring substrate disposed with an electrode having a plurality of electrode lines;
   a conductive adhesive layer connected to the wiring substrate;
   a plurality of semiconductor light emitting devices coupled to the conductive adhesive layer, and electrically connected to the electrode; and
   a phosphor portion configured to convert light emitted from at least some of the plurality of semiconductor light emitting devices into a sub-pixel color so as to form a plurality of columns along the plurality of electrode lines,
   wherein the phosphor portion comprises:
   first phosphor portions covering one surface of said at least some of the semiconductor light emitting devices, respectively, sequentially disposed along the plurality of columns among the plurality of semiconductor light emitting devices; and
   second phosphor portions disposed between the first phosphor portions, and having a different shape from a shape of the first phosphor portions,
   wherein the phosphor portion includes a first color phosphor portion and a second color phosphor portion disposed in parallel to each other, and
   wherein the phosphor portion covers at least part of a black matrix disposed between the first and the second phosphor portion.

2. The display device of claim 1, wherein the second phosphor portions have at least one side inclined with respect to one side of the first phosphor portions.

3. The display device of claim 2, wherein the at least one side of the second phosphor portions includes a concave portion concaving toward a center by the inclination.

4. The display device of claim 3, wherein the phosphor portion includes cured portions cured by light emitted from said at least some of the plurality of semiconductor light emitting devices, and
   wherein an extent of the inclination of the at least one side is based on a property of the emitted light during the curing.

5. The display device of claim 4, wherein the property of light comprises at least one of a light emission time, a light emission intensity, a light emission area and a light emission range of the emitted light.

6. The display device of claim 1, wherein each of the second phosphor portions comprises:
   a central region; and
   edge regions formed at both sides of the central region,
   wherein an area of a phosphor material covering the conductive adhesive layer is larger than that of the central region.

7. The display device of claim 6, wherein the phosphor material include discontinuous portions in at least part of the central region of the second phosphor portions.

8. The display device of claim 7, wherein the second phosphor portions include a separation space in a central region of the second phosphor portions by the discontinuity.

9. The display device of claim 1, wherein one surface of the first phosphor portions covers said at least some of the semiconductor light emitting devices, and
   wherein at least part of the other surface of the first phosphor portion includes a curved surface.

10. The display device of claim 9, wherein a curvature radius of the curved surface is determined based on a distance to a light emission portion of said at least some of the semiconductor light emitting devices.

11. The display device of claim 10, wherein the first and the second phosphor portions comprise a cured phosphor material cured by light emitted from said at least some of the semiconductor light emitting devices, respectively.

12. The display device of claim 11, wherein the cured phosphor material cured is thicker in the first phosphor portions.

13. The display device of claim 1, wherein at least some of the first phosphor portions have a dome shape being higher than that of the corresponding second phosphor portions.

* * * * *